(12) United States Patent
Kanda et al.

(10) Patent No.: US 10,902,916 B2
(45) Date of Patent: Jan. 26, 2021

(54) SEMICONDUCTOR CIRCUIT, DRIVING METHOD, AND ELECTRONIC APPARATUS

(71) Applicant: SONY CORPORATION, Tokyo (JP)

(72) Inventors: Yasuo Kanda, Kanagawa (JP); Yuji Torige, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 5 days.

(21) Appl. No.: 16/099,251

(22) PCT Filed: Apr. 20, 2017

(86) PCT No.: PCT/JP2017/015850
§ 371 (c)(1),
(2) Date: Nov. 6, 2018

(87) PCT Pub. No.: WO2017/199677
PCT Pub. Date: Nov. 23, 2017

(65) Prior Publication Data
US 2019/0156891 A1    May 23, 2019

(30) Foreign Application Priority Data
May 16, 2016 (JP) ................... 2016-097645

(51) Int. Cl.
*G11C 14/00* (2006.01)
*G11C 11/419* (2006.01)
(Continued)

(52) U.S. Cl.
CPC ............ *G11C 14/0081* (2013.01); *G11C 7/20* (2013.01); *G11C 11/161* (2013.01);
(Continued)

(58) Field of Classification Search
CPC ................................. G11C 14/0081
See application file for complete search history.

(56) References Cited

U.S. PATENT DOCUMENTS 6,285,575 B1 * 9/2001 Miwa ................. G11C 11/22
365/145
7,710,776 B2 * 5/2010 Johal ................. G11C 16/26
365/185.08

(Continued)

FOREIGN PATENT DOCUMENTS

CN           1489063 A      4/2004
JP       2004-133969 A      4/2004
(Continued)

OTHER PUBLICATIONS

International Search Report and Written Opinion of PCT Application No. PCT/JP2017/015850, dated Aug. 23, 2017, 11 pages of ISRWO.

*Primary Examiner* — Douglas King
(74) *Attorney, Agent, or Firm* — Chip Law Group

(57) ABSTRACT

A semiconductor circuit includes first (IV1, IV3) and second (IV2, IV4) circuits, first (31) and second (32) transistors, a first storage element (35), and a driver (22, 23, 52, 53). The first (IV1, IV3) and second (IV2, IV4) circuits, respectively, apply inverted voltages of voltages at first (N1) and second (N2) nodes to the second (N2) and first (N1) nodes. The first transistor (31) is turned on to couple the first (N1) and third nodes. The second transistor (32) includes a gate coupled to the first node (N1), a drain and a source. One of the drain and the source is coupled to the third node, and another is supplied with a first control voltage (SCL1). The first storage element (35) includes a first end coupled to the third node and a second end supplied with a second control voltage (SCTRL). The first storage element (35) is able to take a first or second resistance state. The driver (22, 23, 52, 53) controls operation of the first transistor (31) and generates the first (SCL1) and second (SCTRL) control voltages.

26 Claims, 32 Drawing Sheets

(51) Int. Cl.
  *G11C 7/20*   (2006.01)
  *G11C 11/412*   (2006.01)
  *G11C 11/16*   (2006.01)
  *G11C 13/00*   (2006.01)
  *H01L 27/22*   (2006.01)

(52) U.S. Cl.
  CPC ...... *G11C 11/1659* (2013.01); *G11C 11/1673* (2013.01); *G11C 11/1675* (2013.01); *G11C 11/1693* (2013.01); *G11C 11/1697* (2013.01); *G11C 11/412* (2013.01); *G11C 11/419* (2013.01); *G11C 11/4125* (2013.01); *G11C 14/0054* (2013.01); *G11C 13/0007* (2013.01); *G11C 13/0069* (2013.01); *H01L 27/228* (2013.01)

(56) References Cited

U.S. PATENT DOCUMENTS

| | | | |
|---|---|---|---|
| 7,948,791 | B1 | 5/2011 | De Jong |
| 8,149,612 | B1 | 4/2012 | De Jong |
| 2004/0066669 | A1 | 4/2004 | Ooishi |
| 2005/0195664 | A1 | 9/2005 | Ooishi |
| 2016/0005450 | A1 | 1/2016 | Takeno et al. |
| 2016/0329098 | A1* | 11/2016 | Javerliac ............... G11C 11/005 |

FOREIGN PATENT DOCUMENTS

| | | | |
|---|---|---|---|
| JP | 2016-018573 | A | 2/2016 |
| TW | 594757 | B | 6/2004 |

* cited by examiner

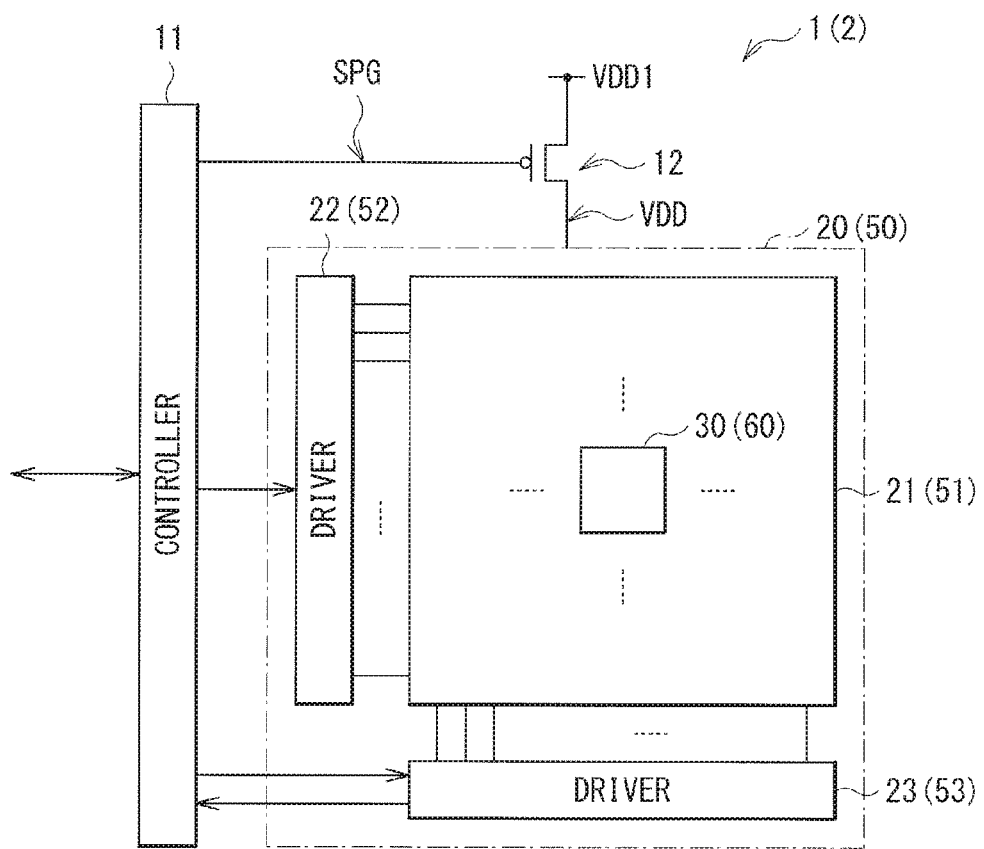
[ FIG. 1 ]

[FIG. 2]
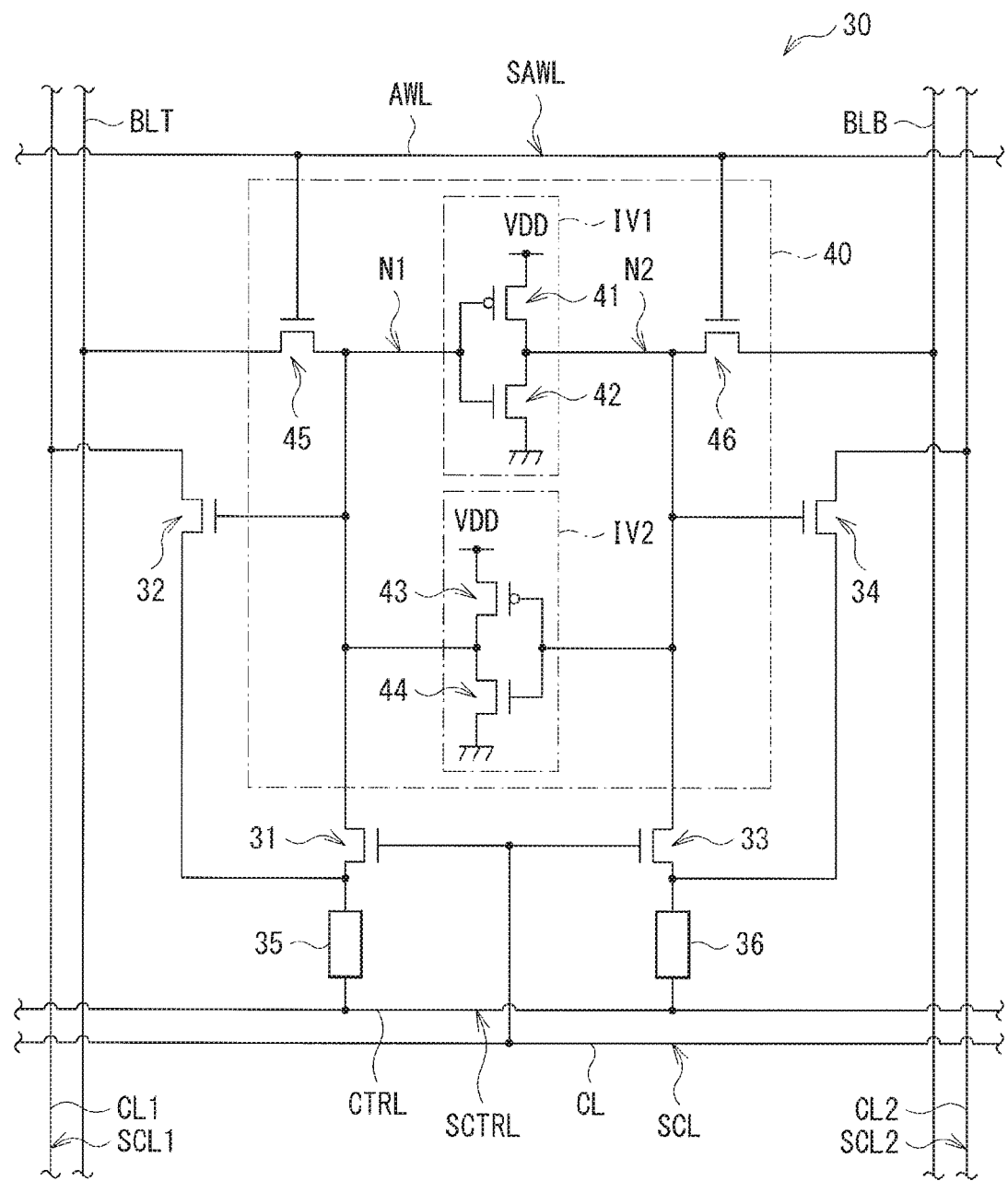

[ FIG. 3 ]
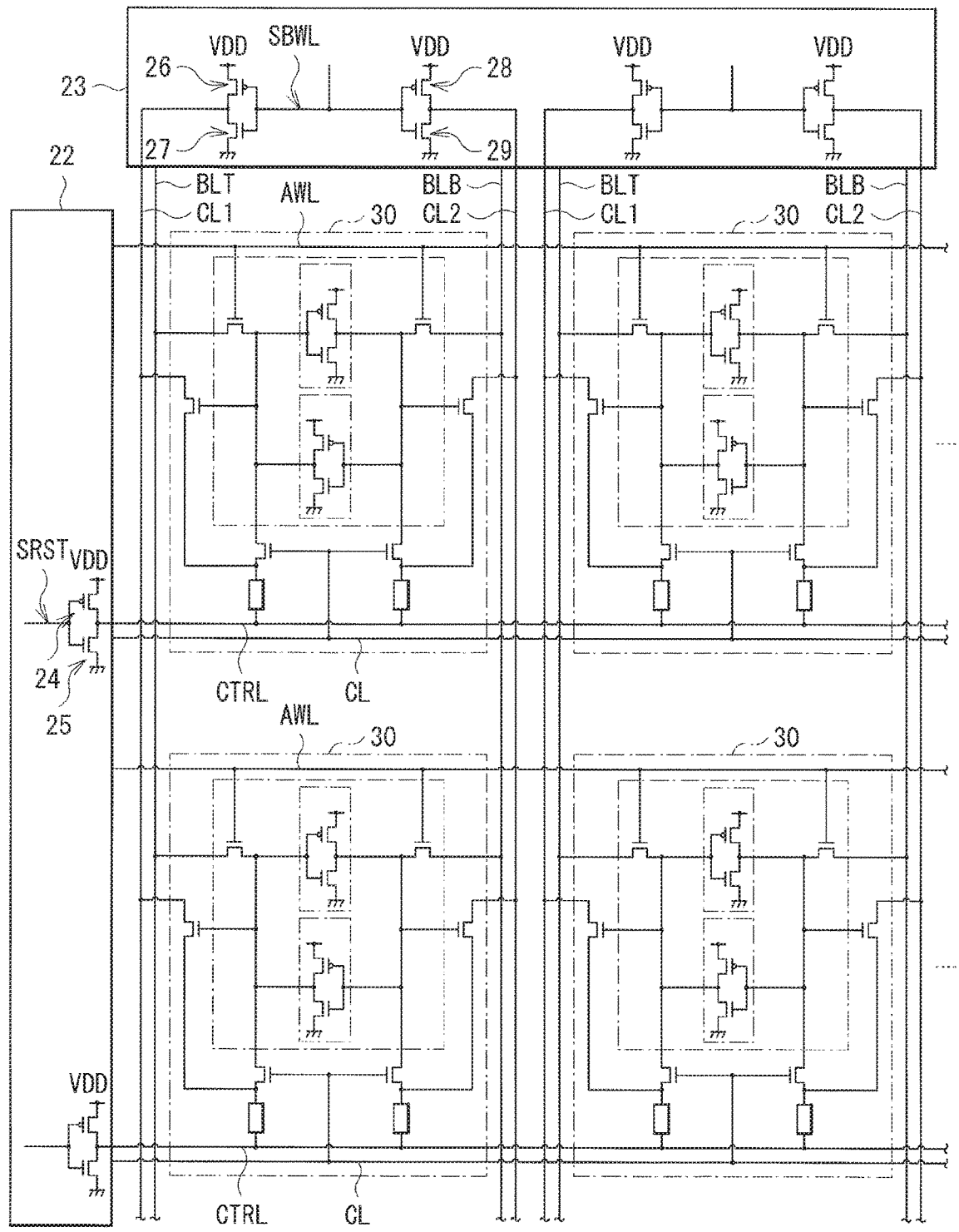

[ FIG. 4 ]
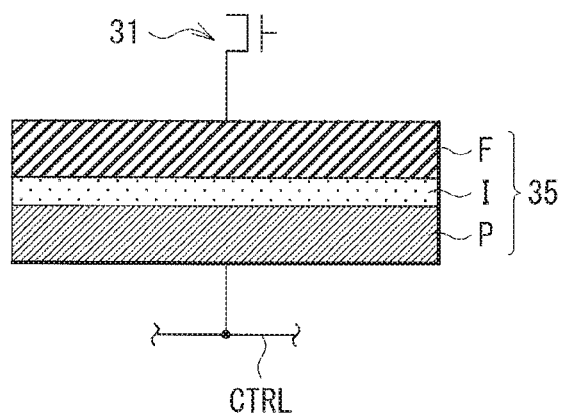
[ FIG. 5 ]
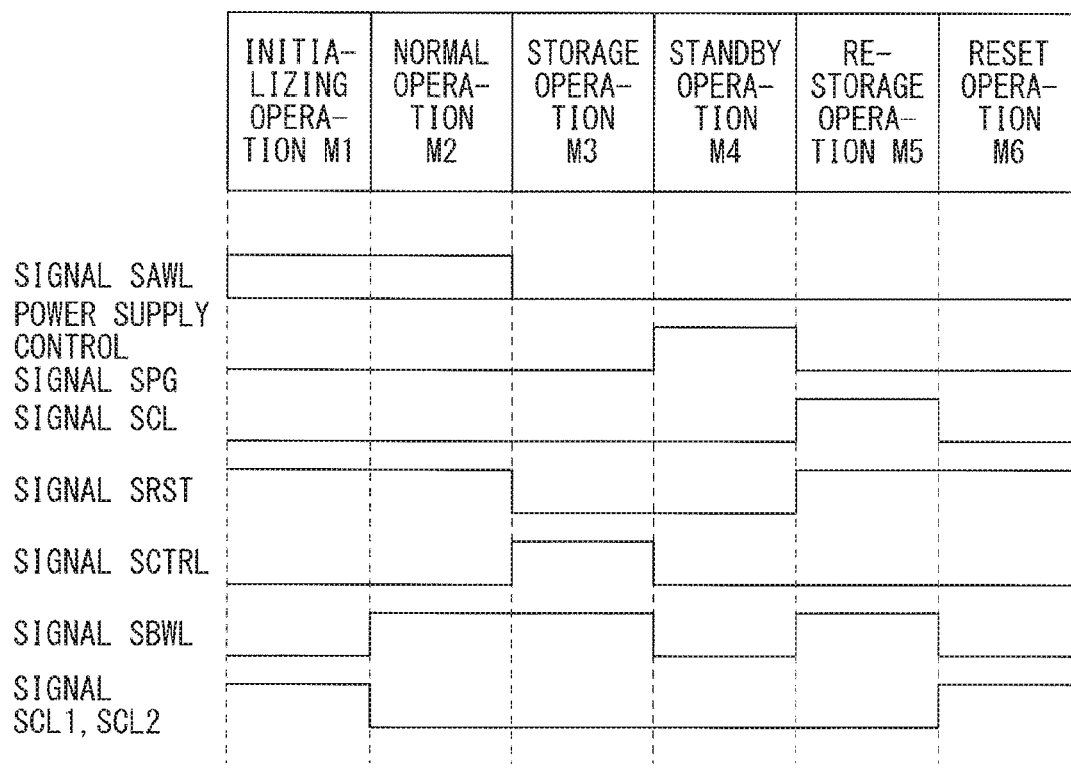

[FIG. 6A]
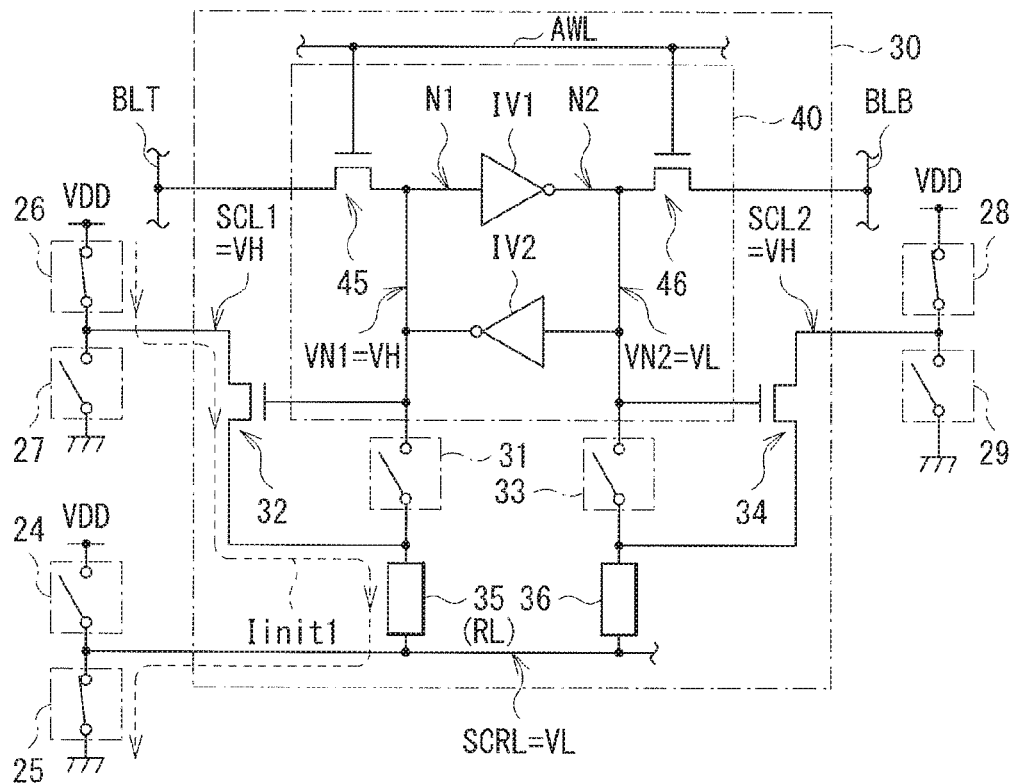
[FIG. 6B]
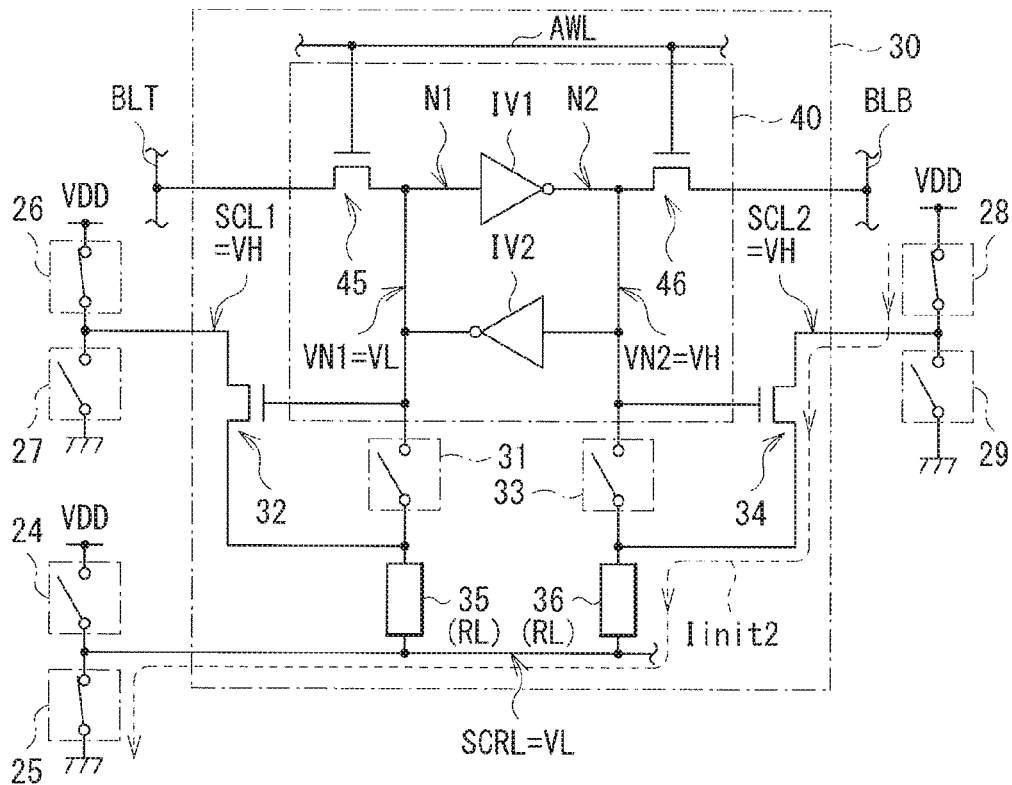

[ FIG. 6C ]
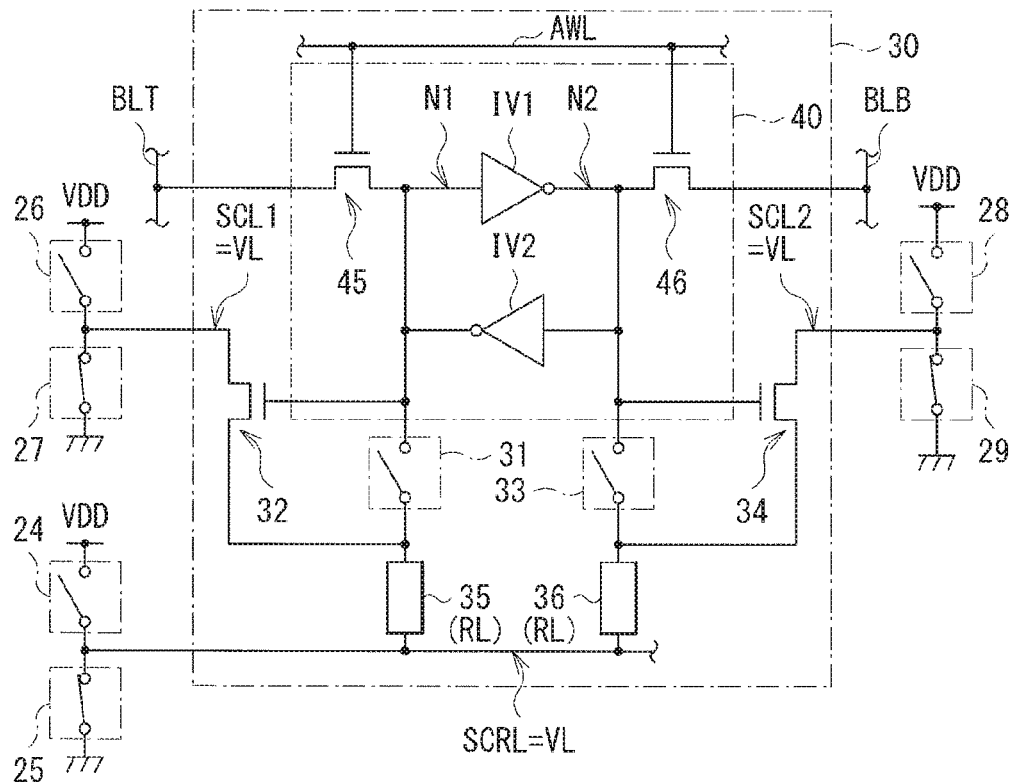
[ FIG. 6D ]
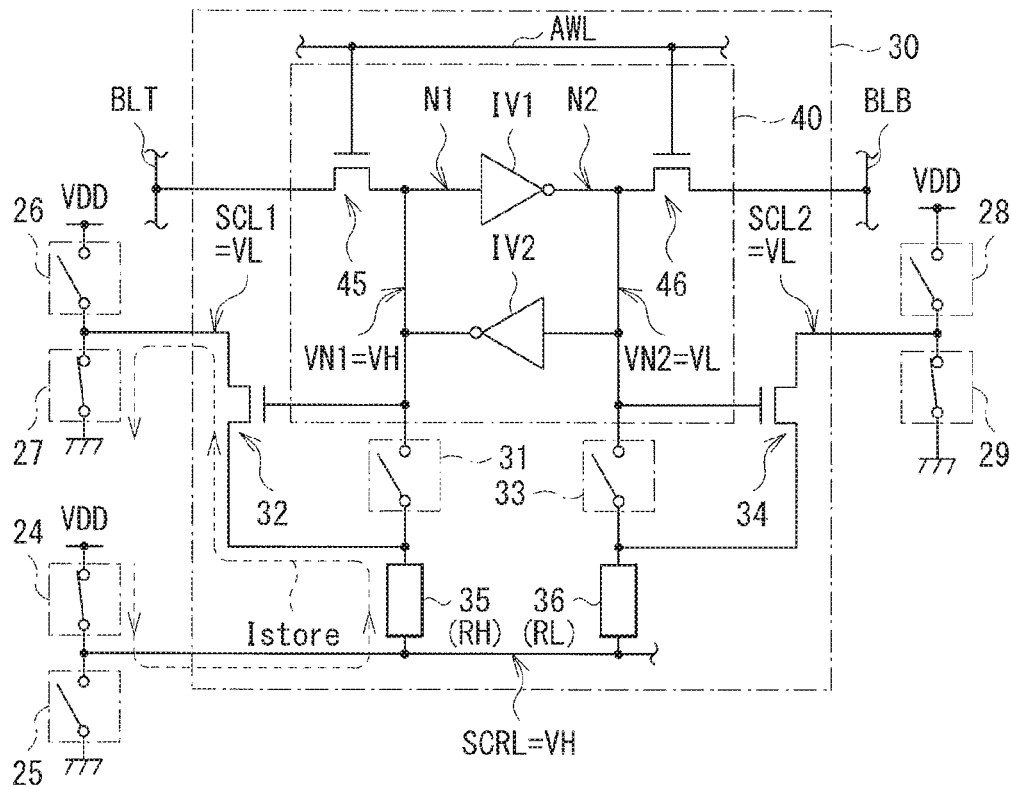

[ FIG. 6E ]
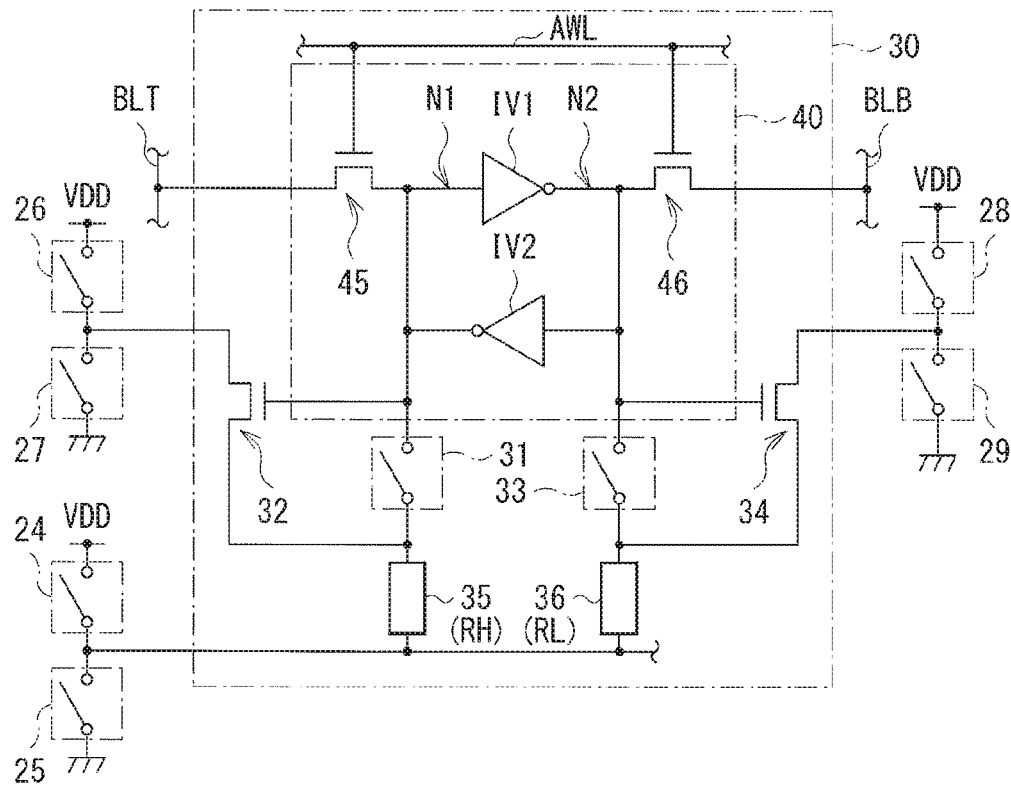
[ FIG. 6F ]
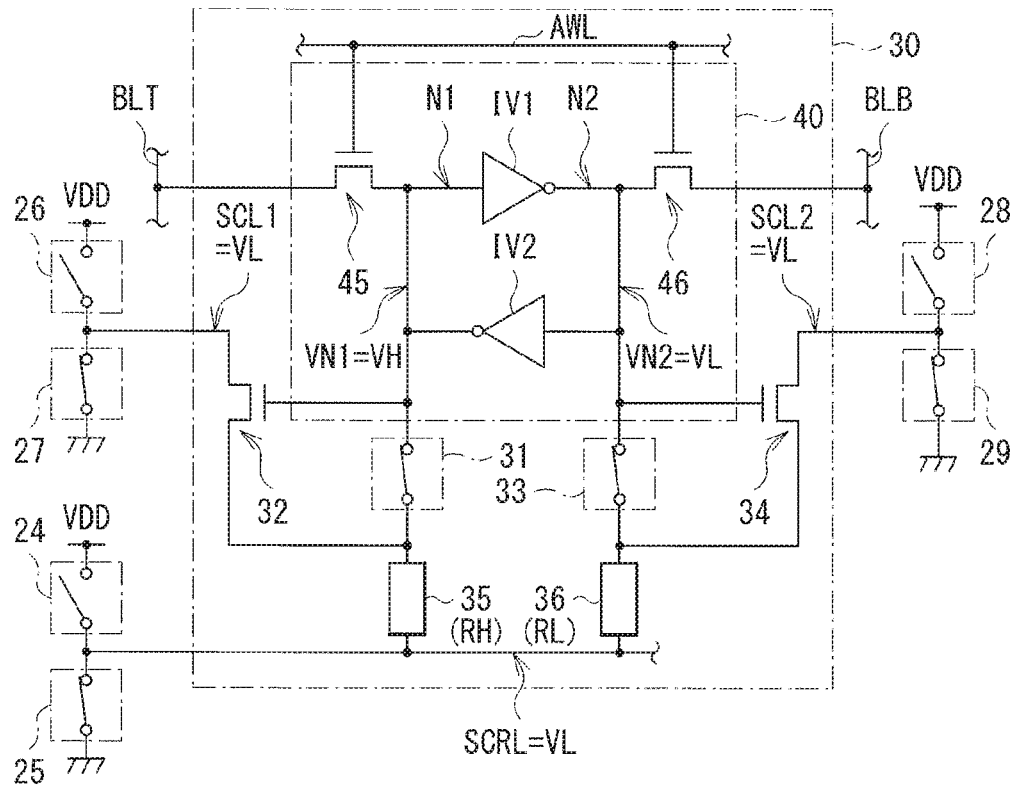

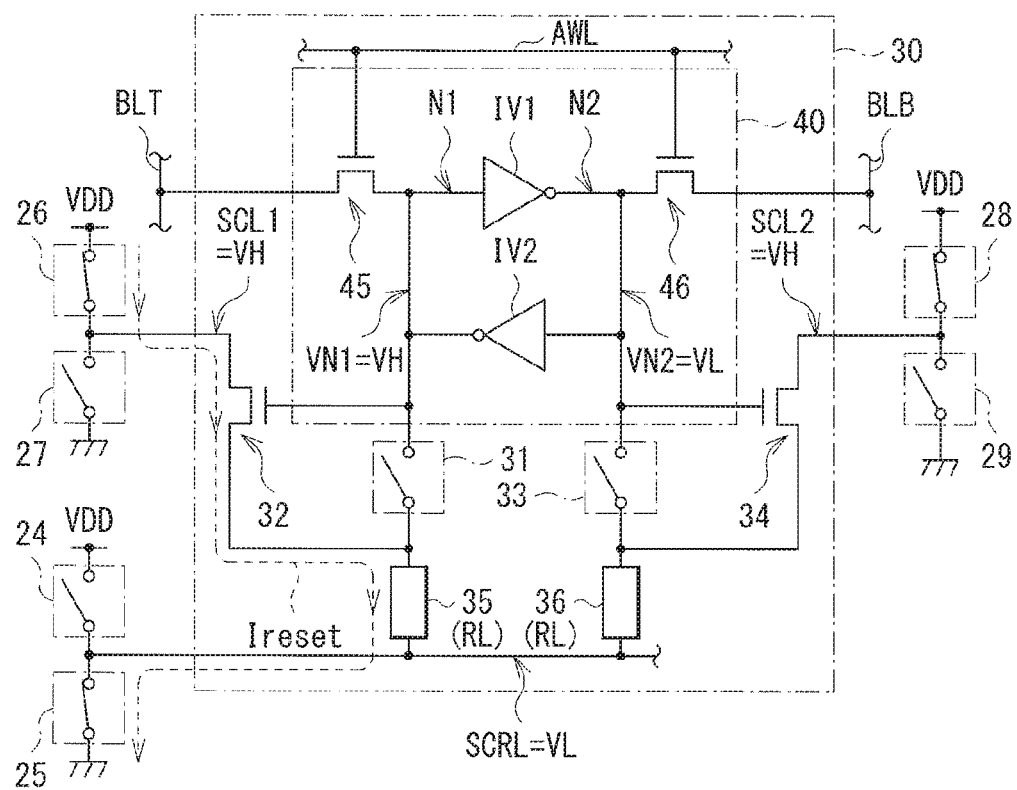
[FIG. 6G]

[ FIG. 7 ]
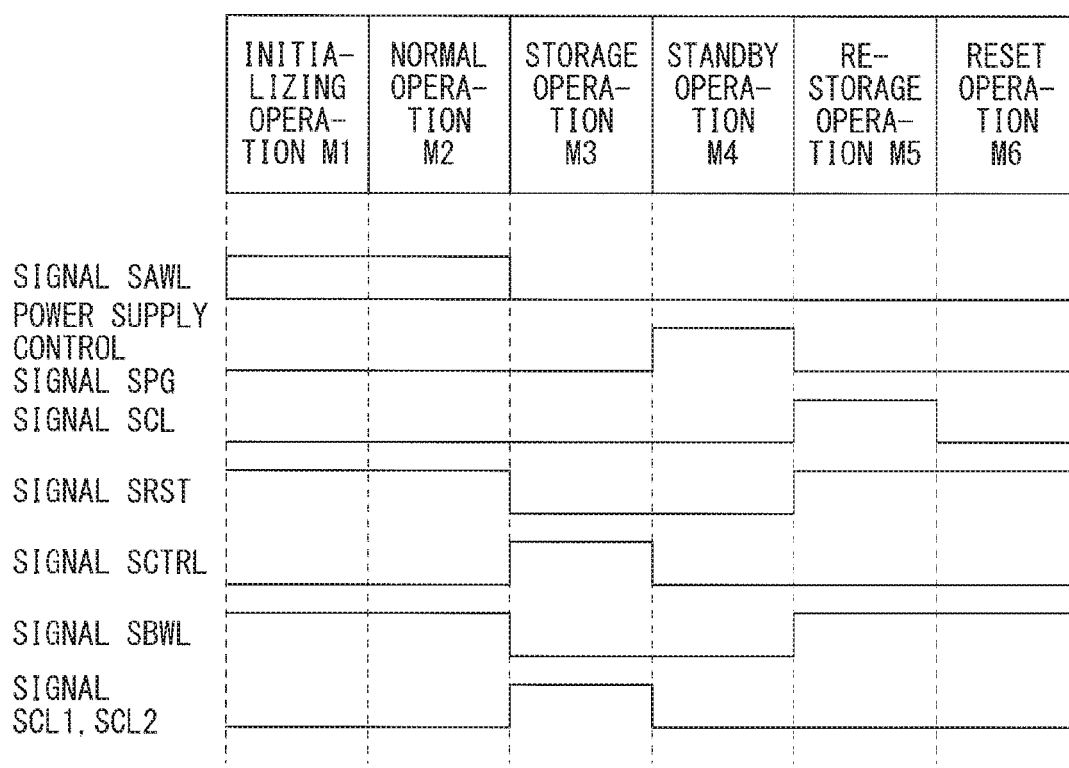

[FIG. 8]
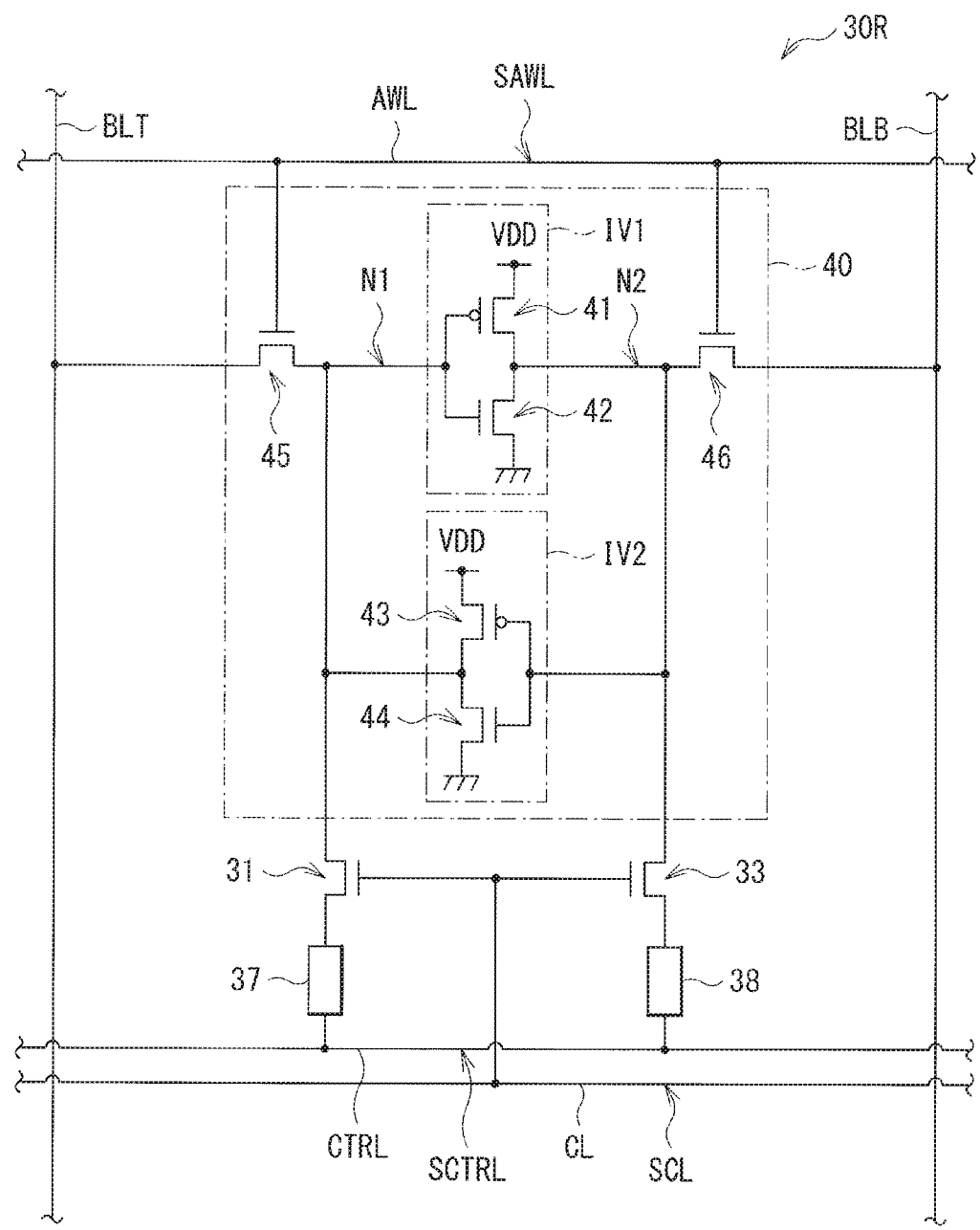

[ FIG. 9 ]
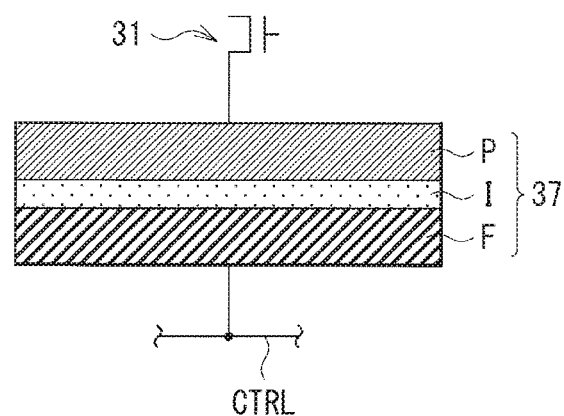
[ FIG. 10 ]
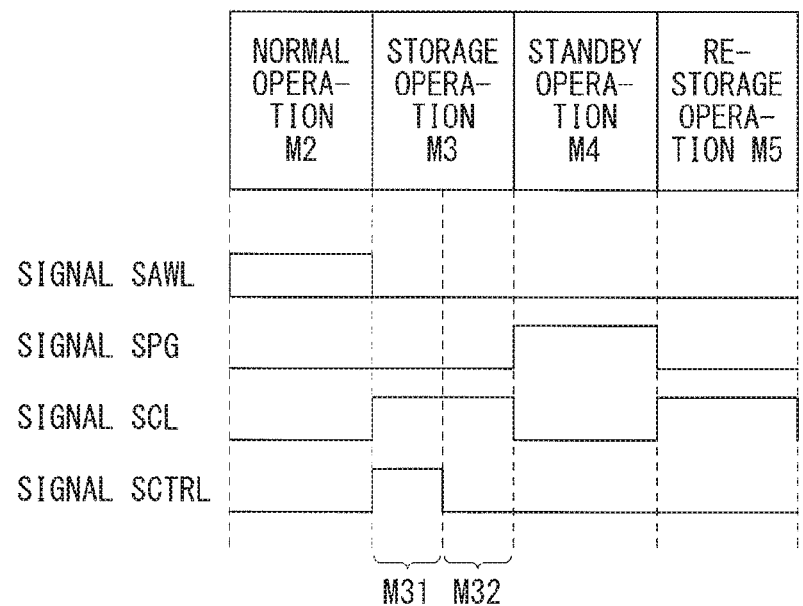

[FIG. 11A]
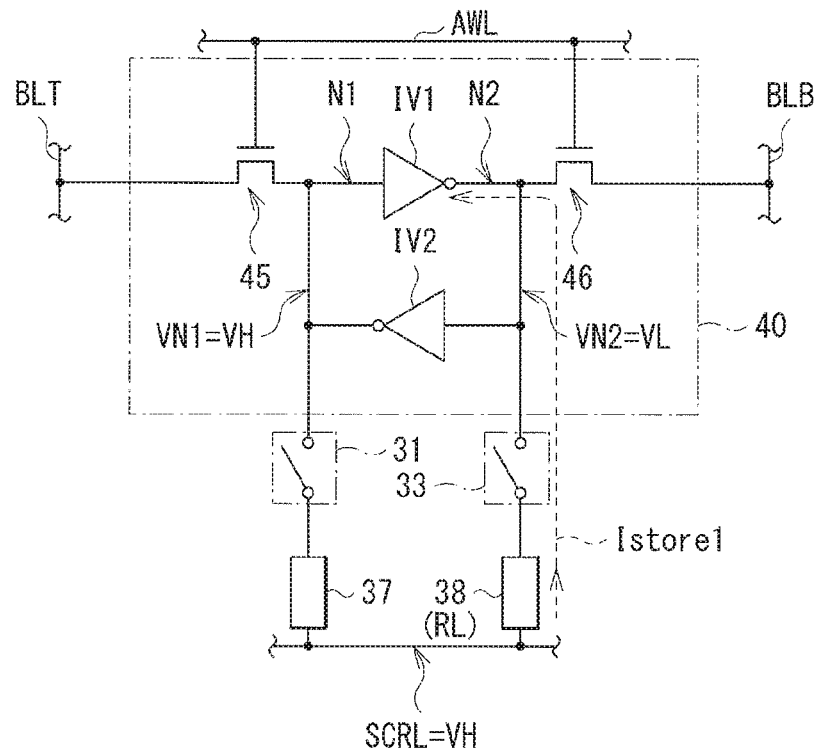
[FIG. 11B]
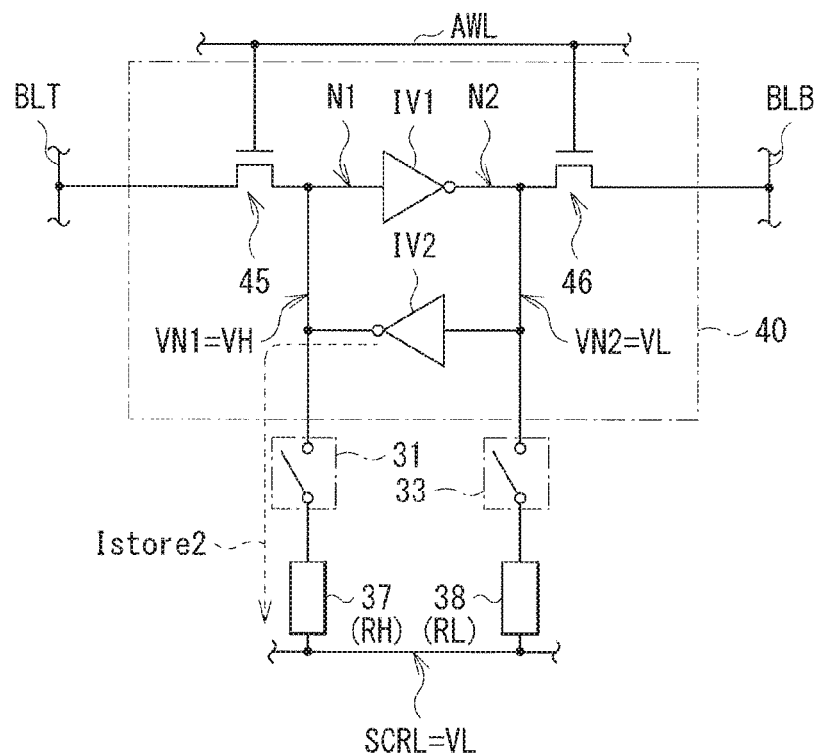

[ FIG. 12 ]
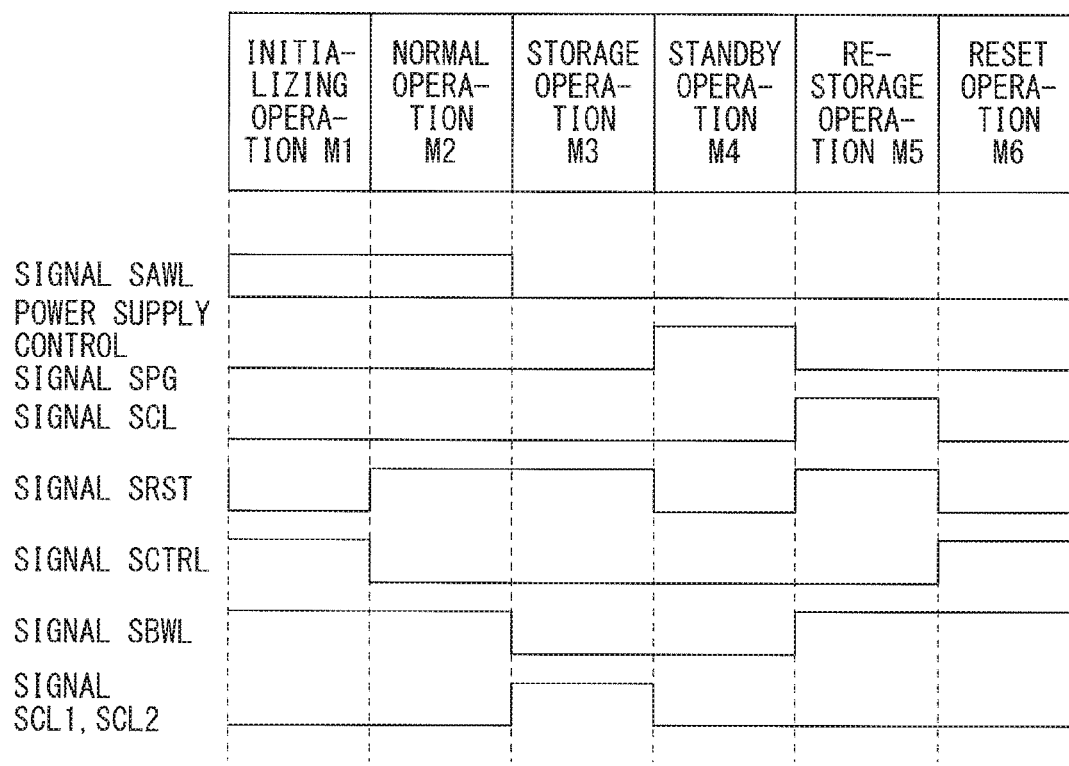

[ FIG. 13A ]
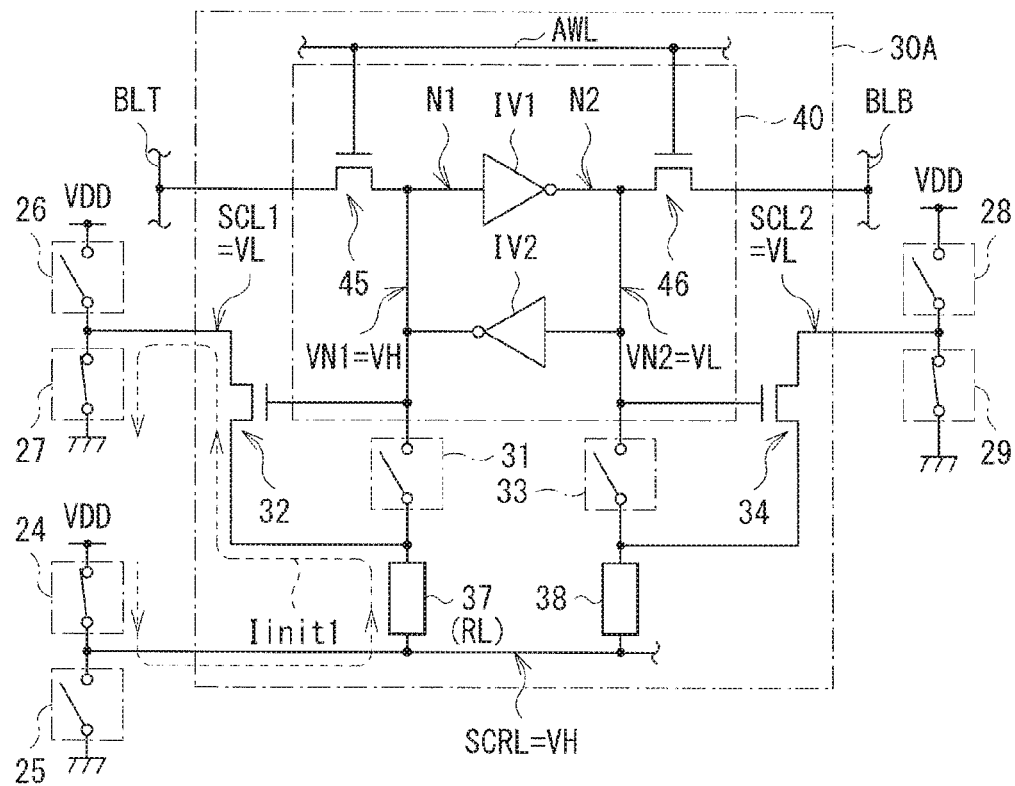
[ FIG. 13B ]
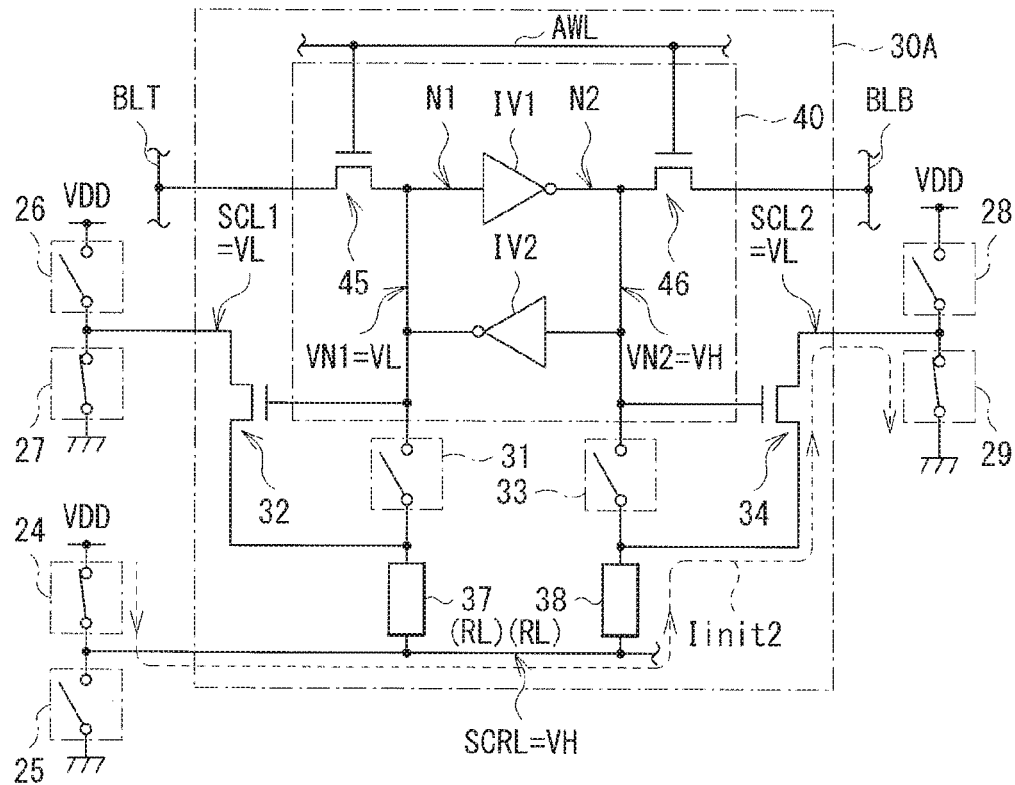

[FIG. 13C]
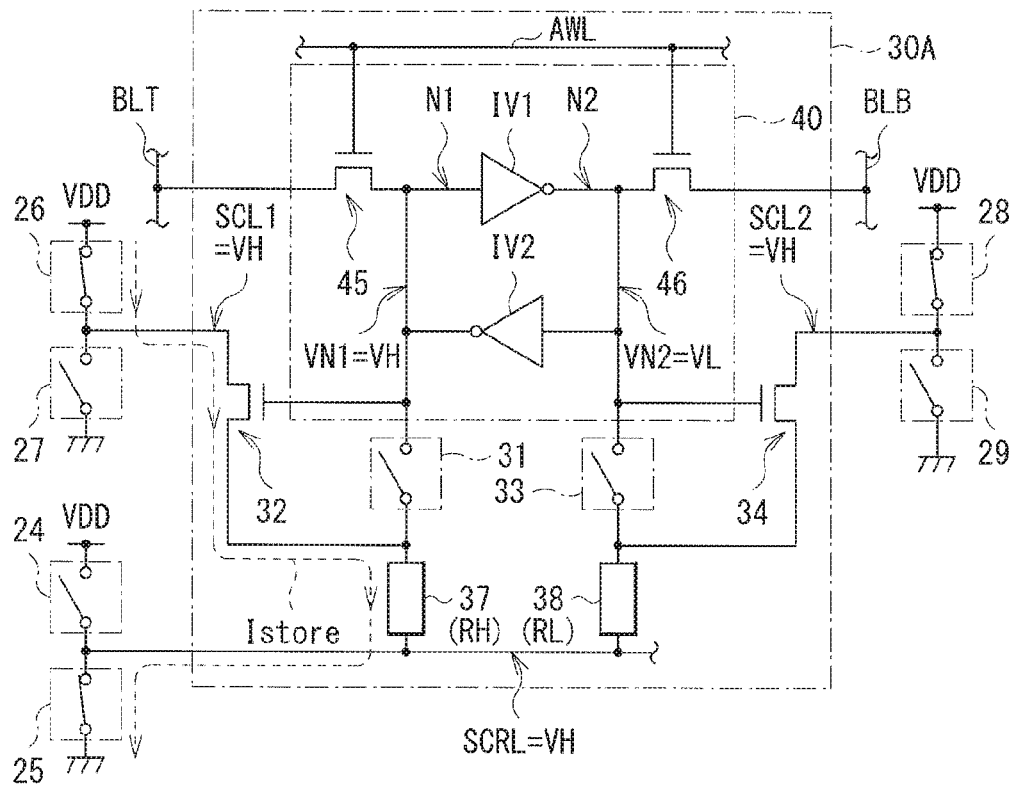
[FIG. 13D]
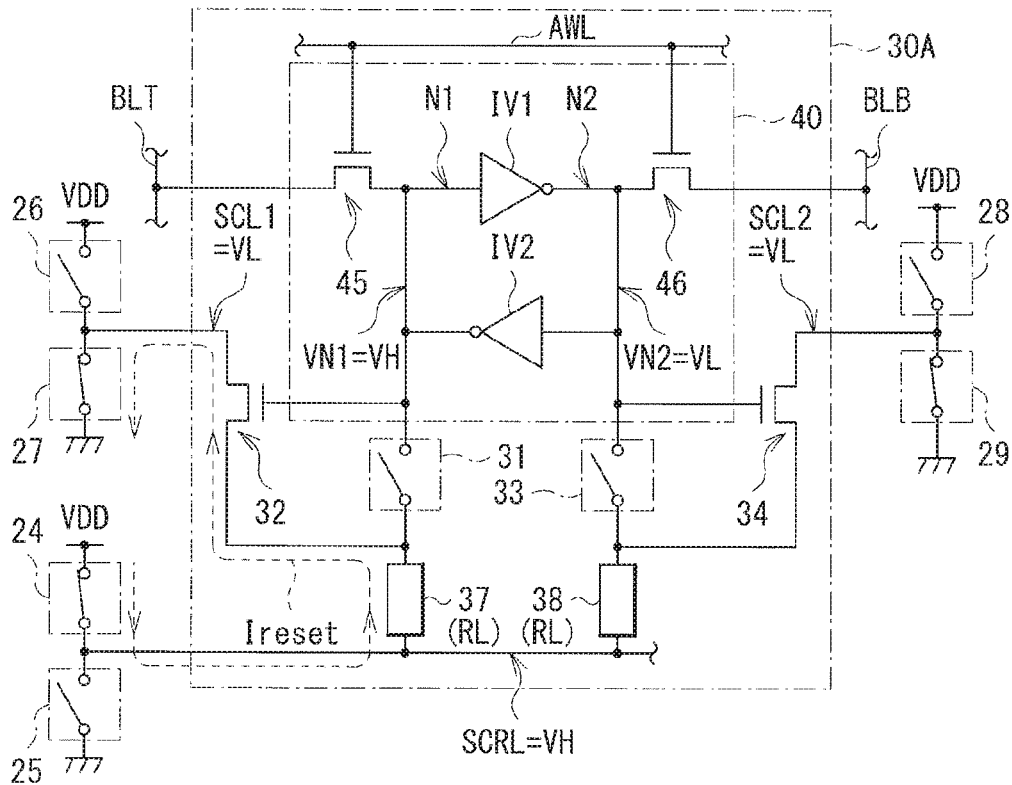

[ FIG. 14 ]
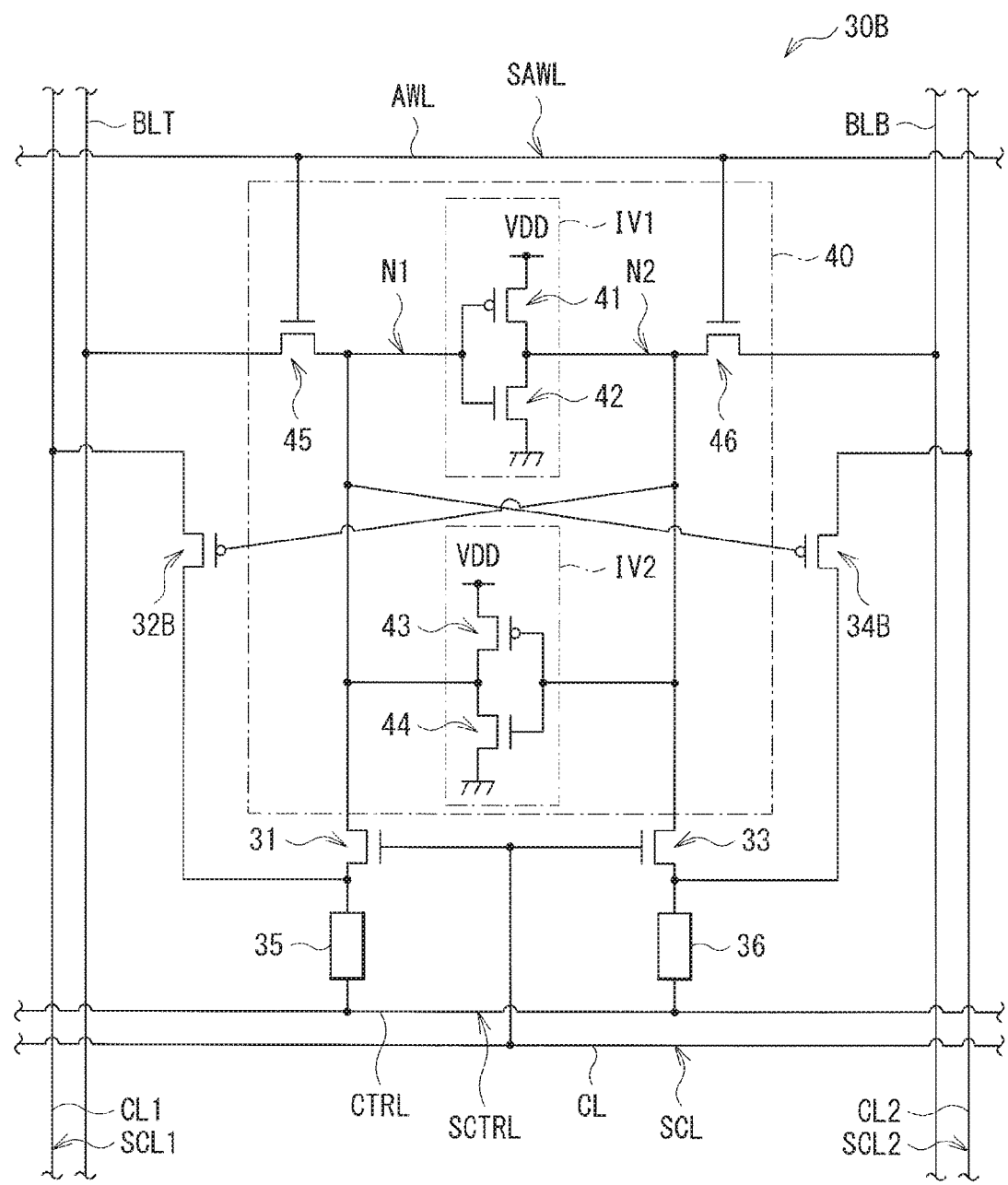

[ FIG. 15 ]
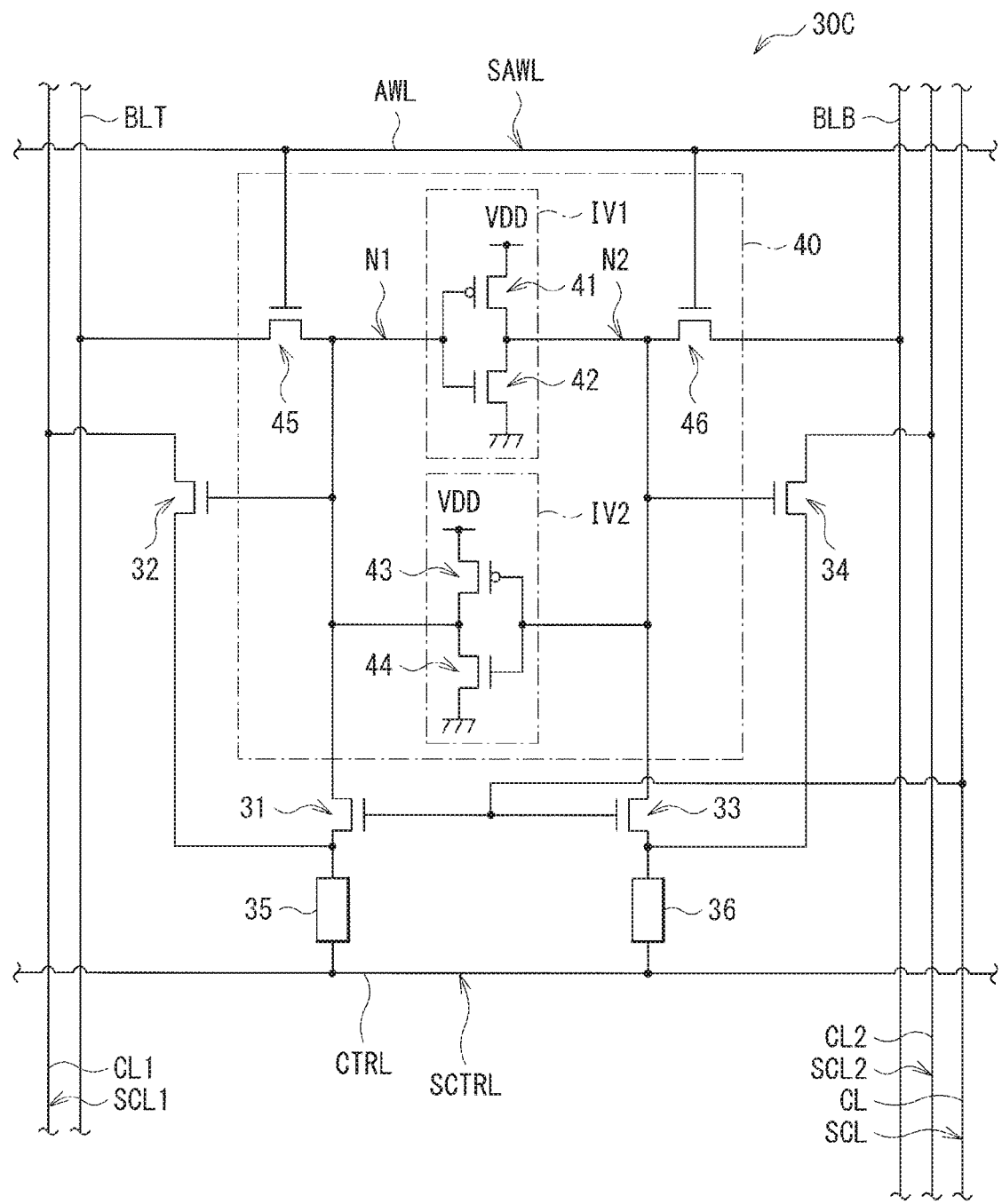

[ FIG. 16 ]
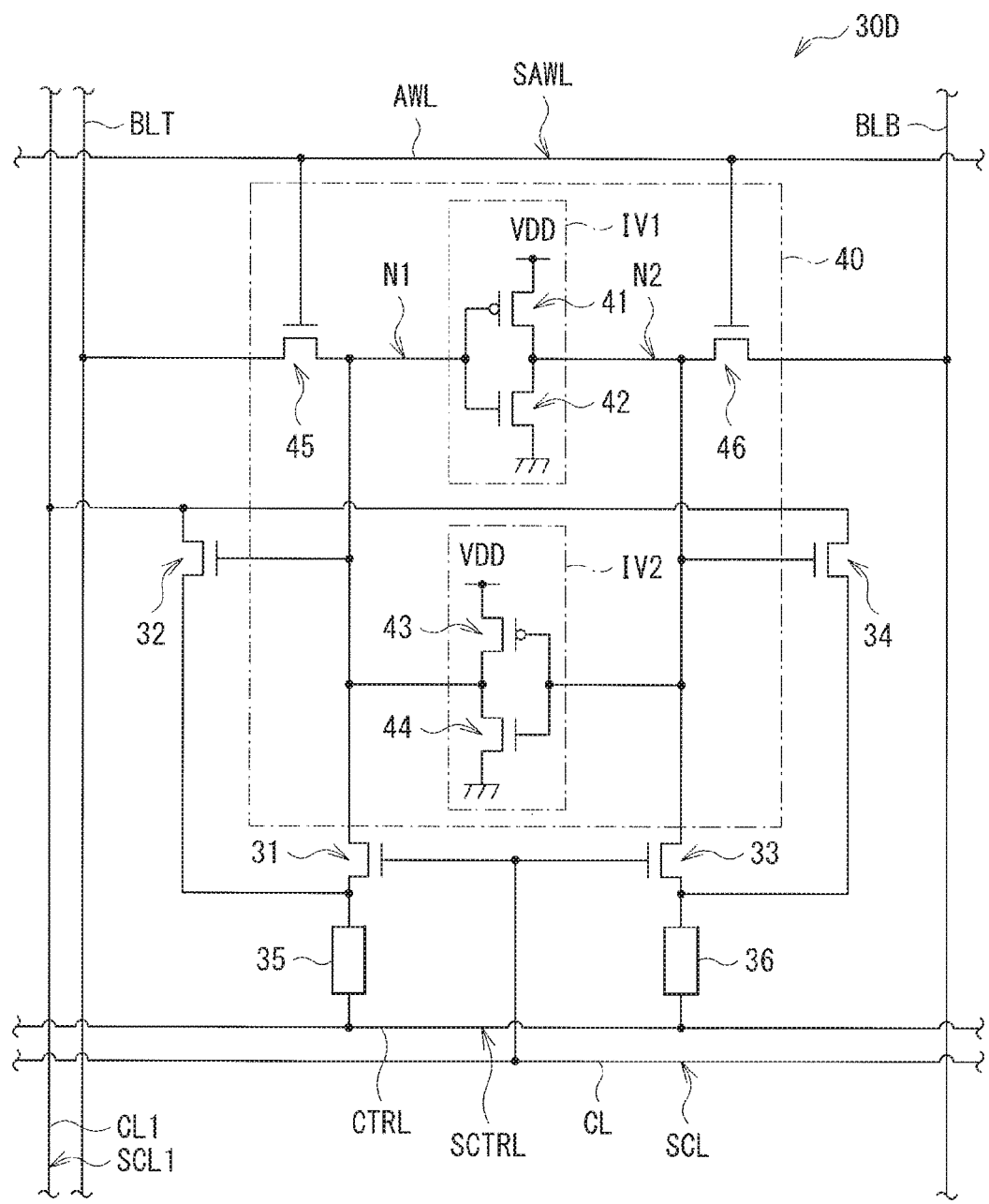

[FIG. 17]
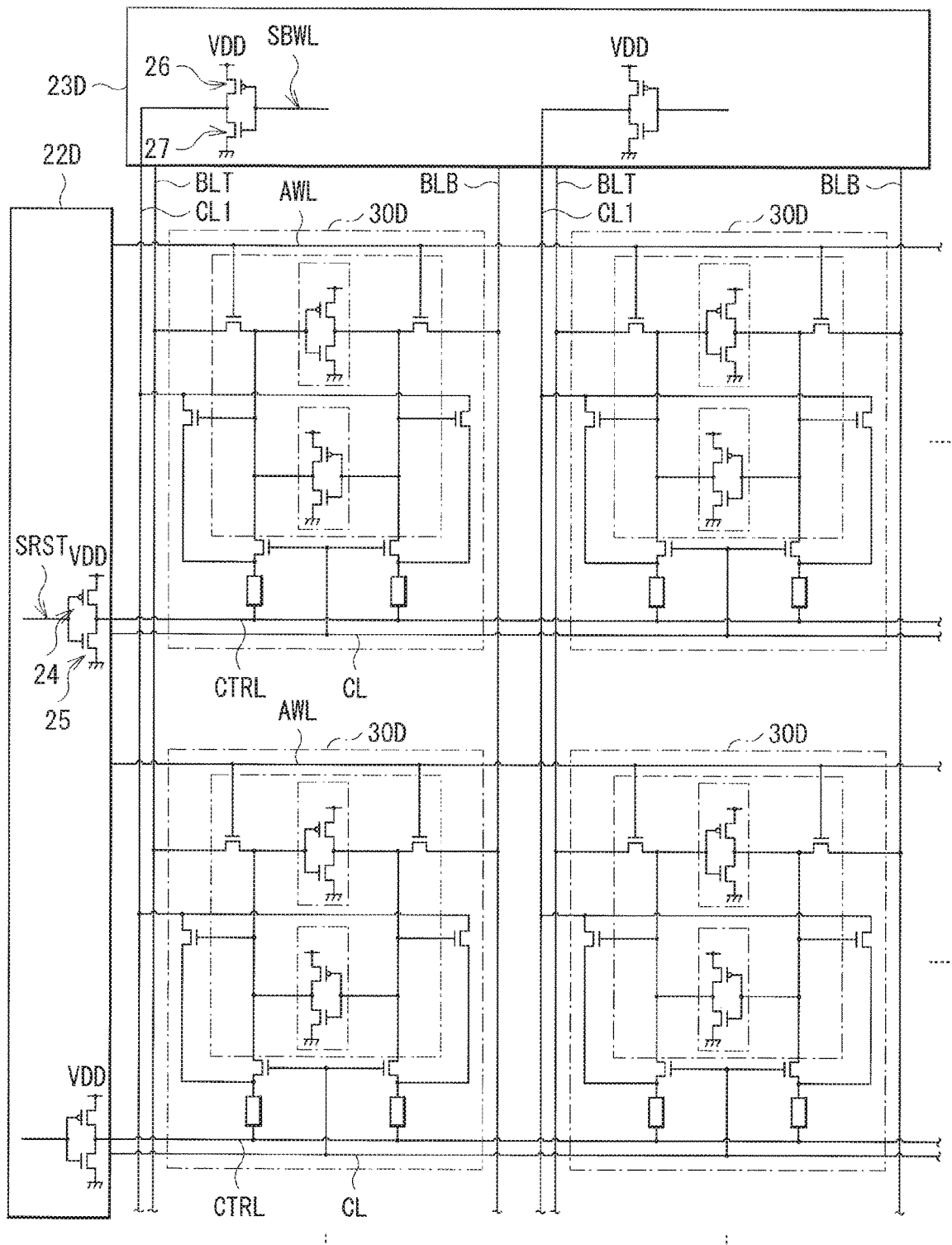

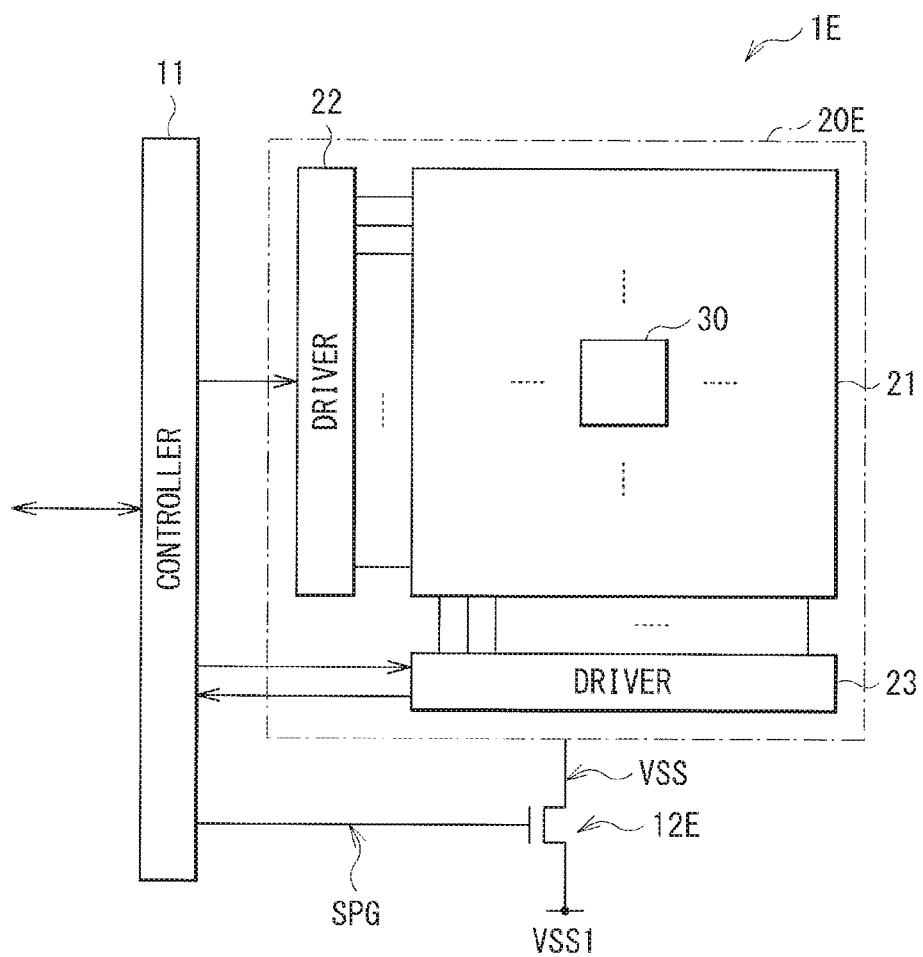
[FIG. 18]

[FIG. 19]
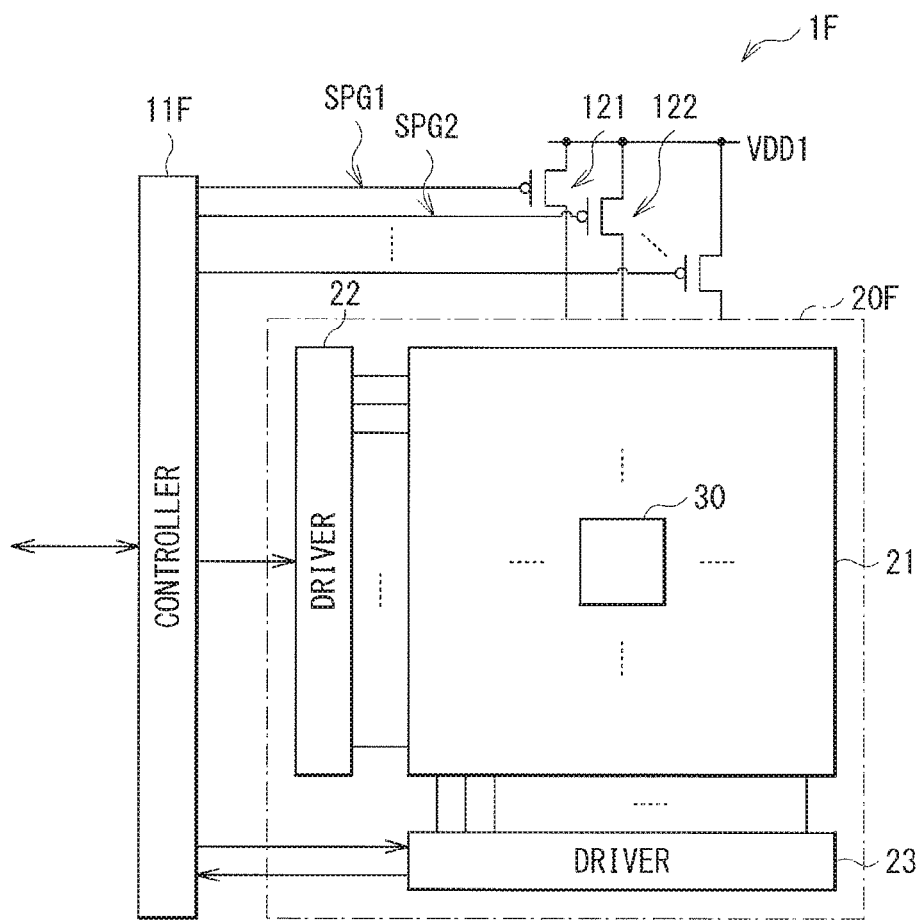

[FIG. 20]
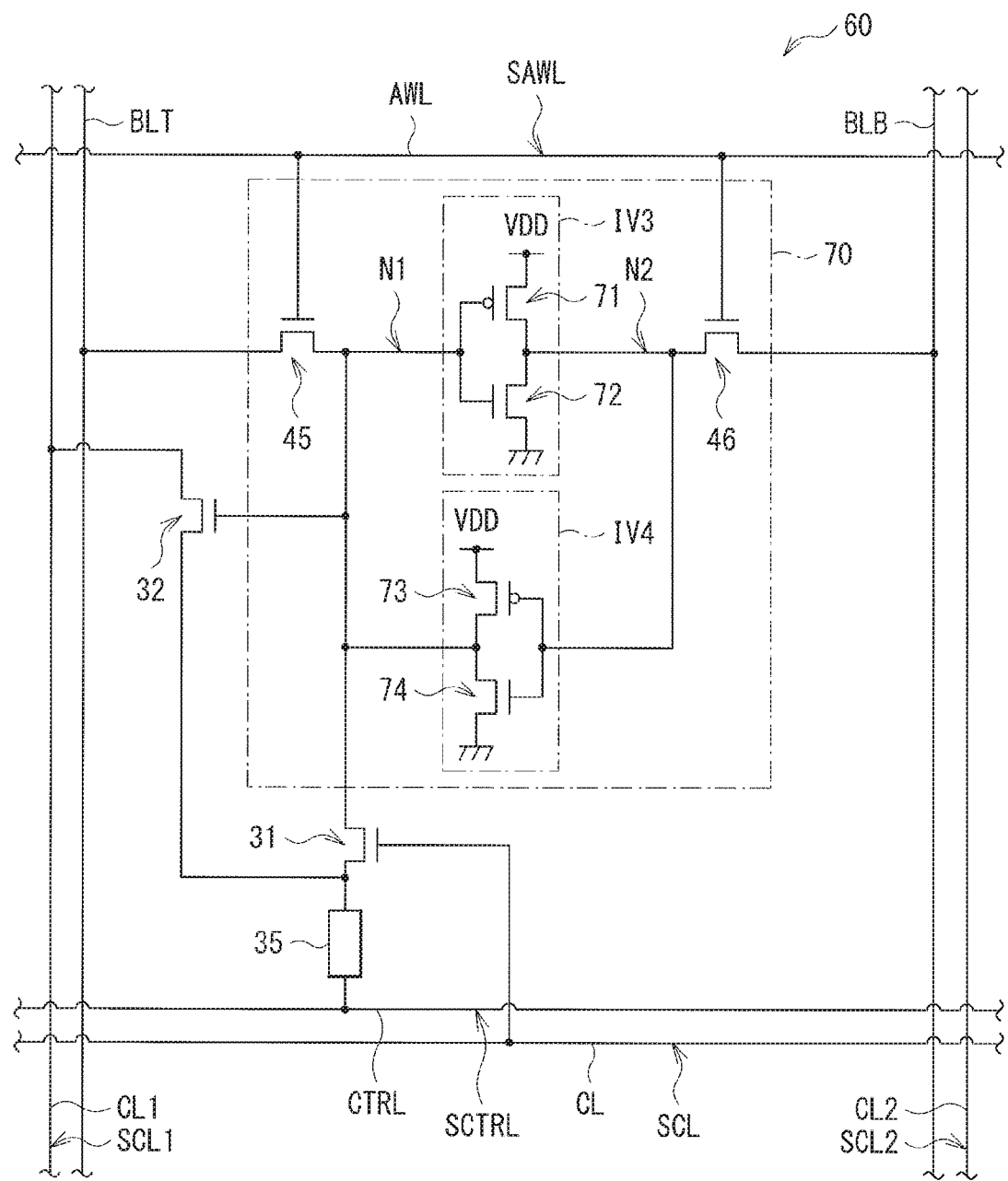

[ FIG. 21 ]
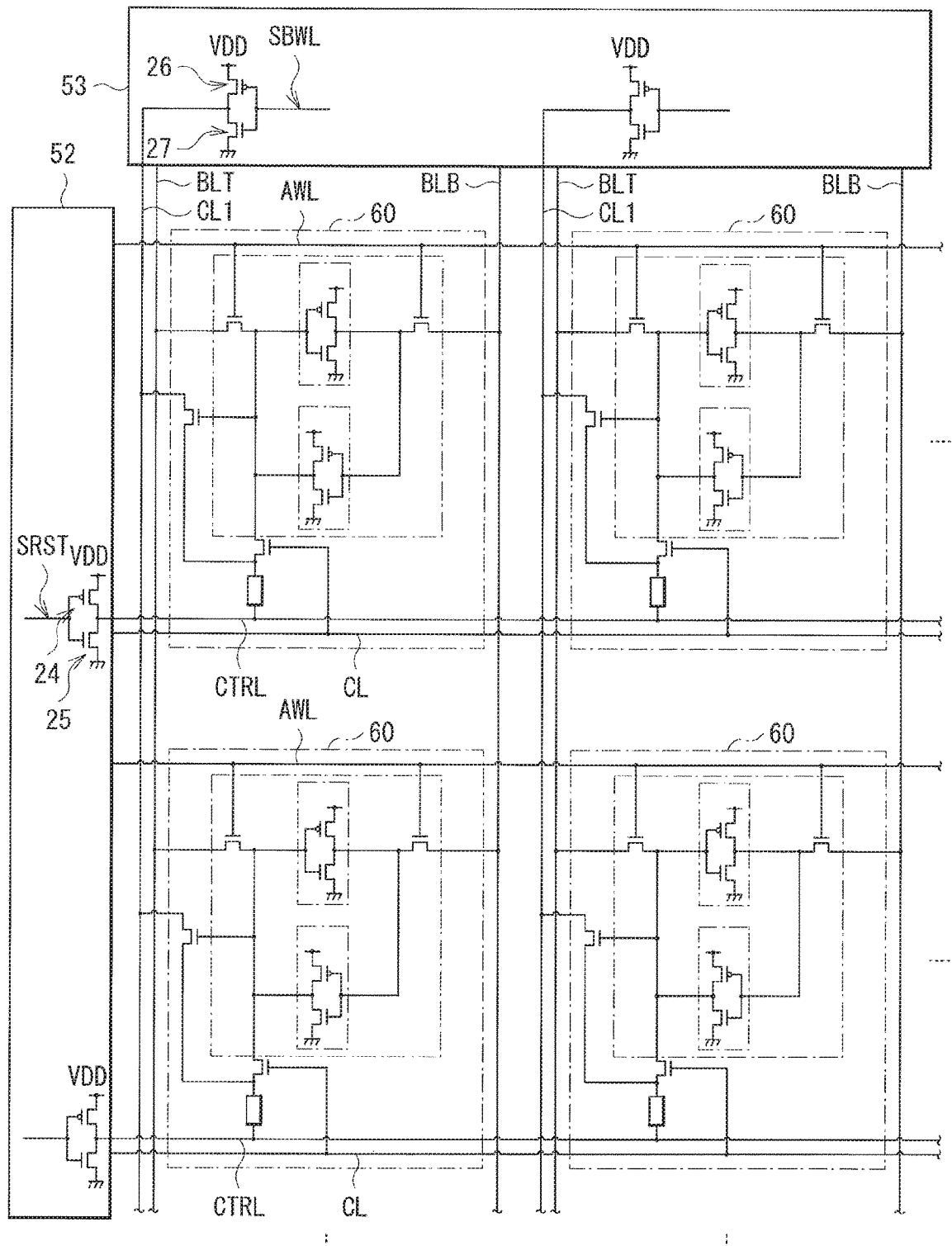

[ FIG. 22 ]
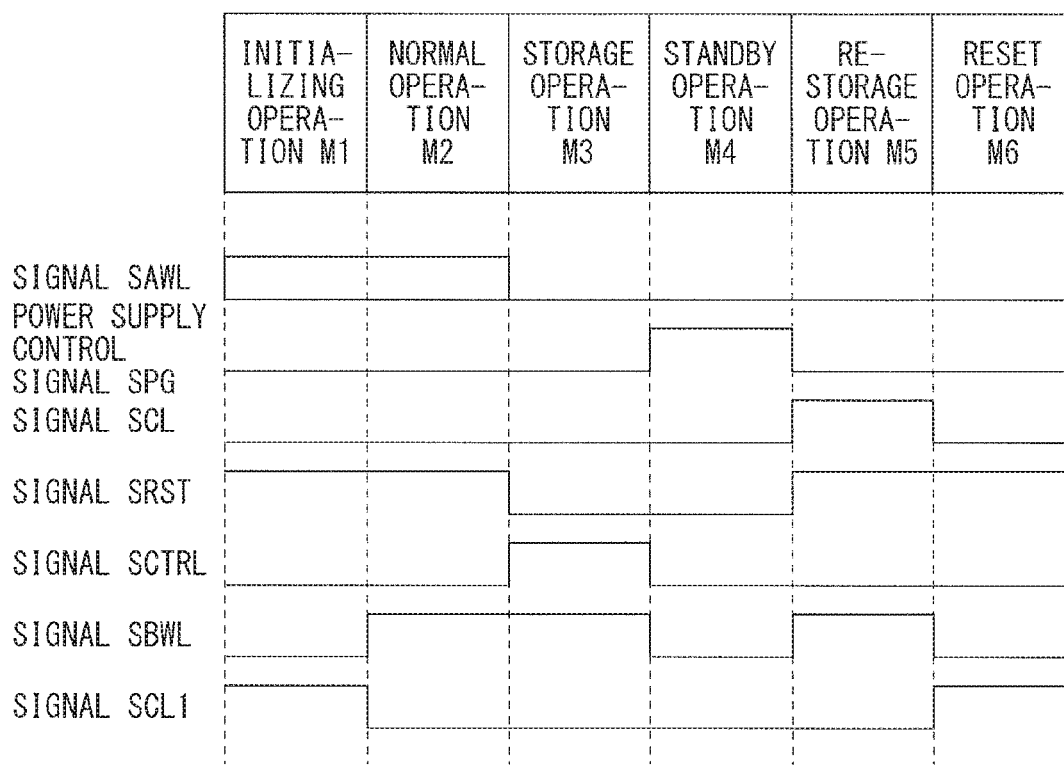

[ FIG. 23A ]
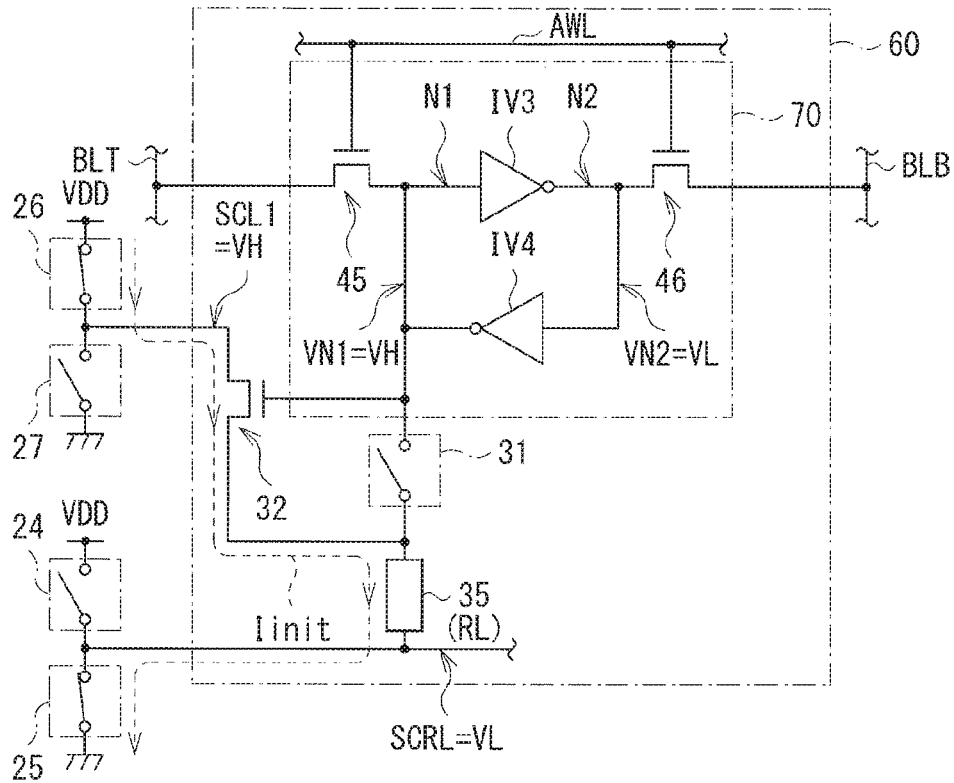
[ FIG. 23B ]
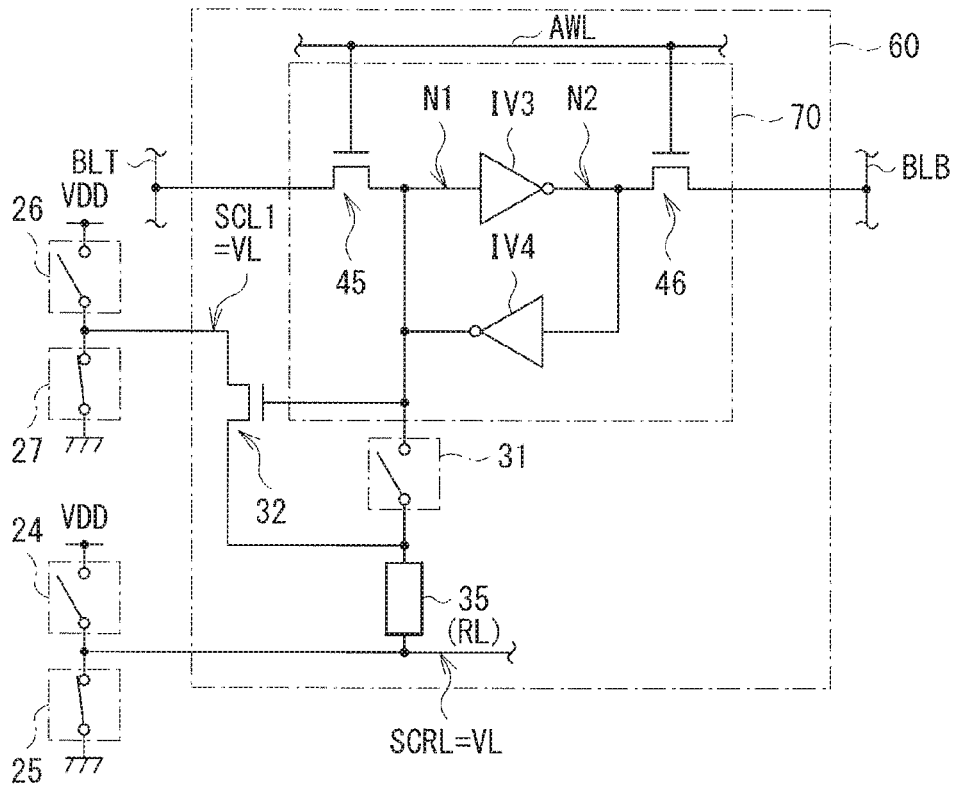

[FIG. 24A]
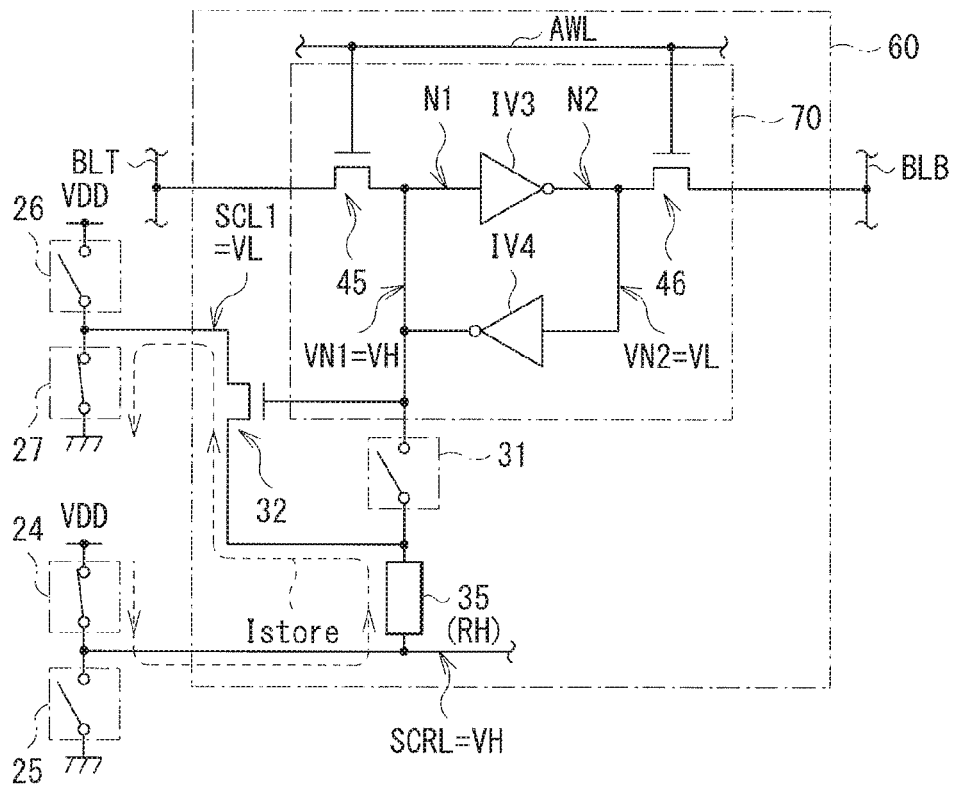
[FIG. 24B]
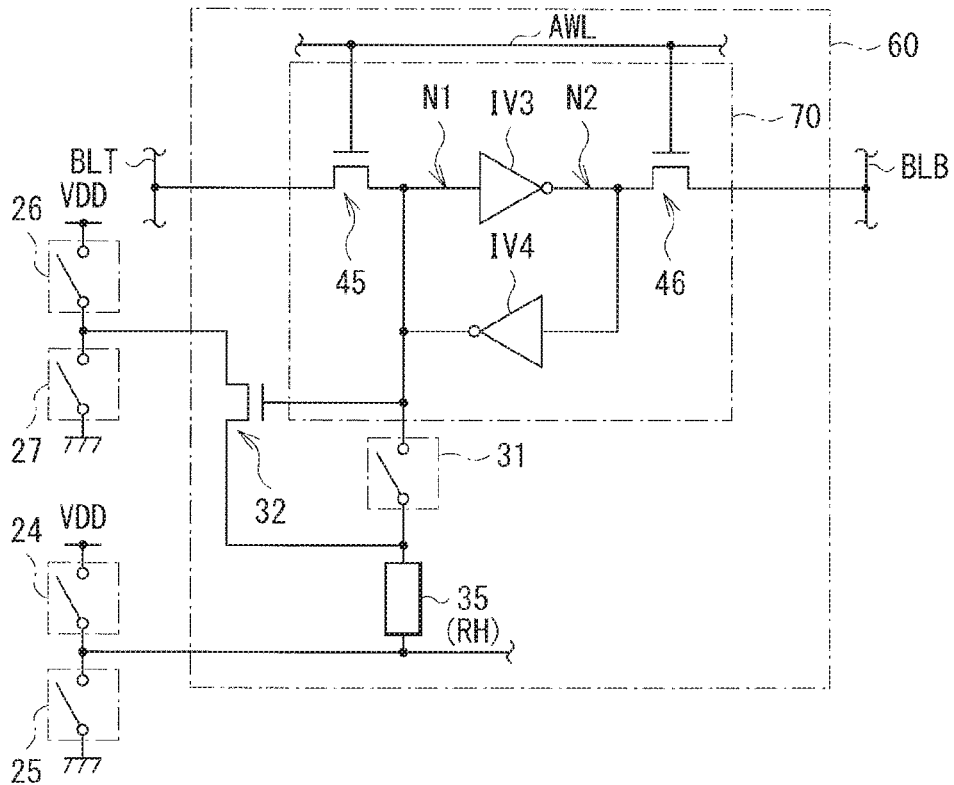

[ FIG. 24C ]
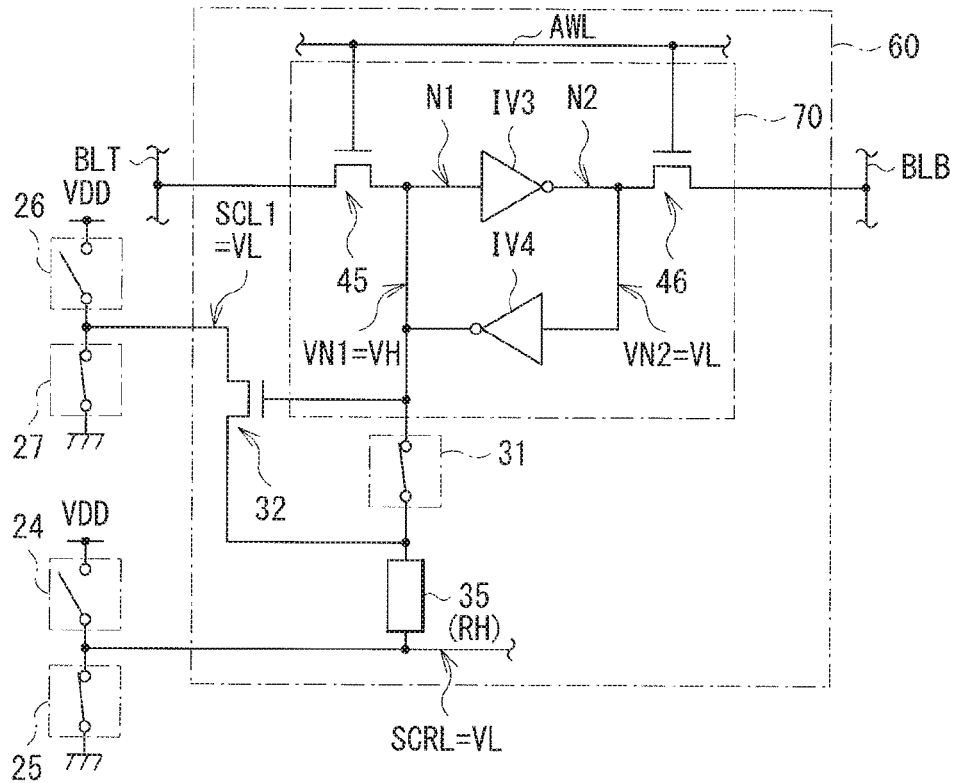
[ FIG. 24D ]
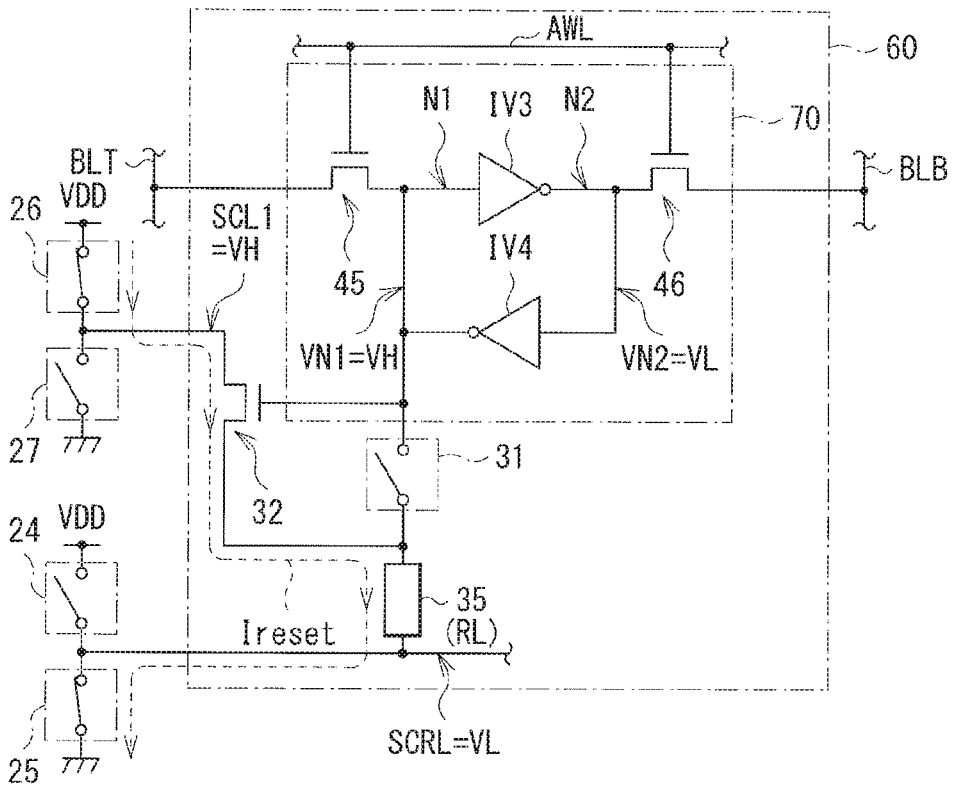

[ FIG. 25A ]
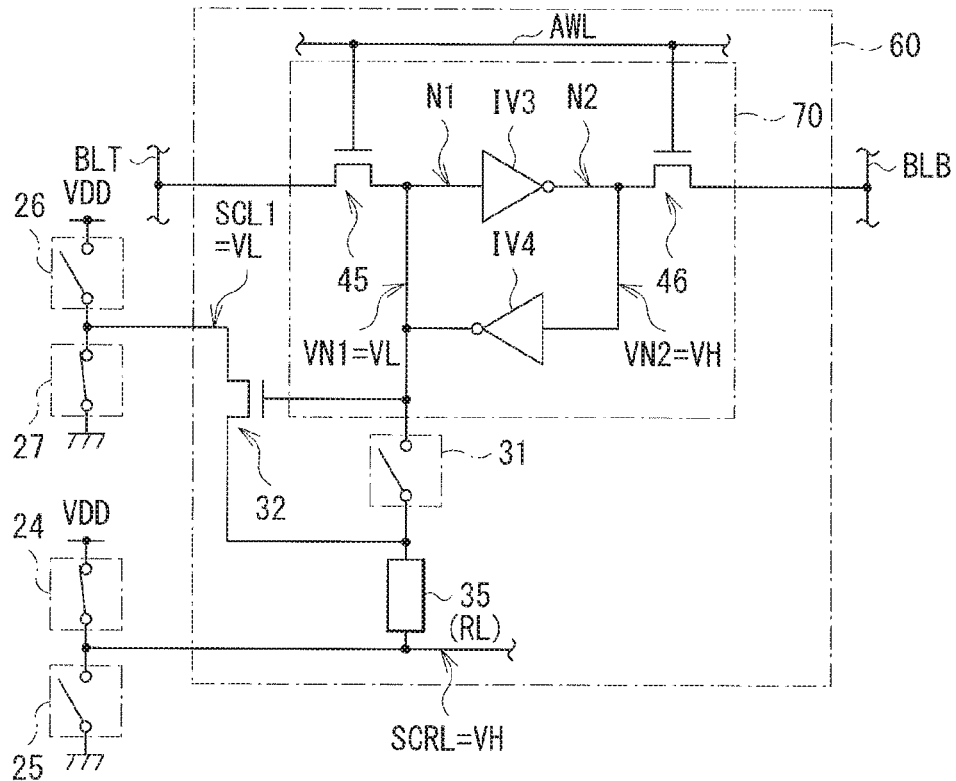
[ FIG. 25B ]
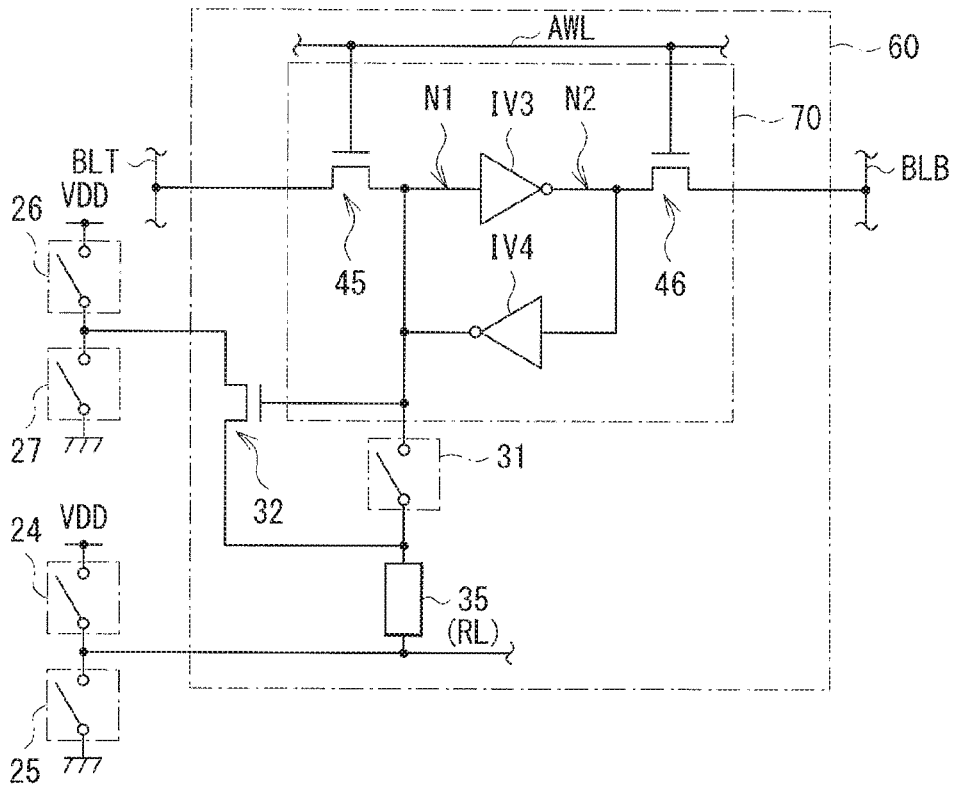

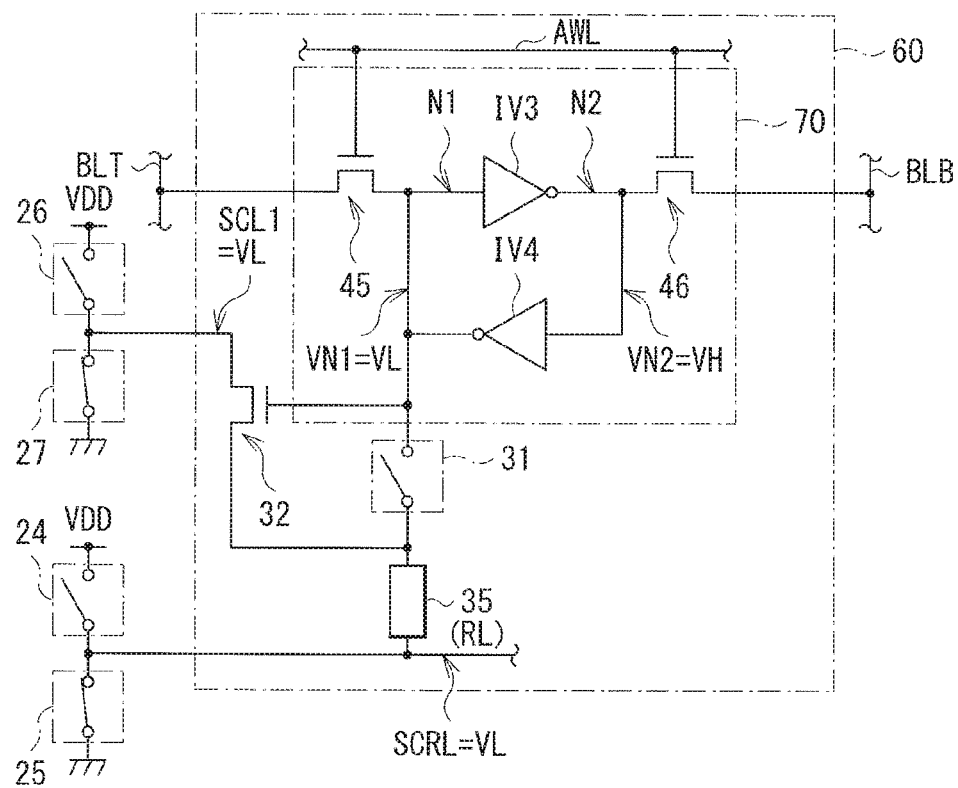
[ FIG. 25C ]

[ FIG. 26A ]
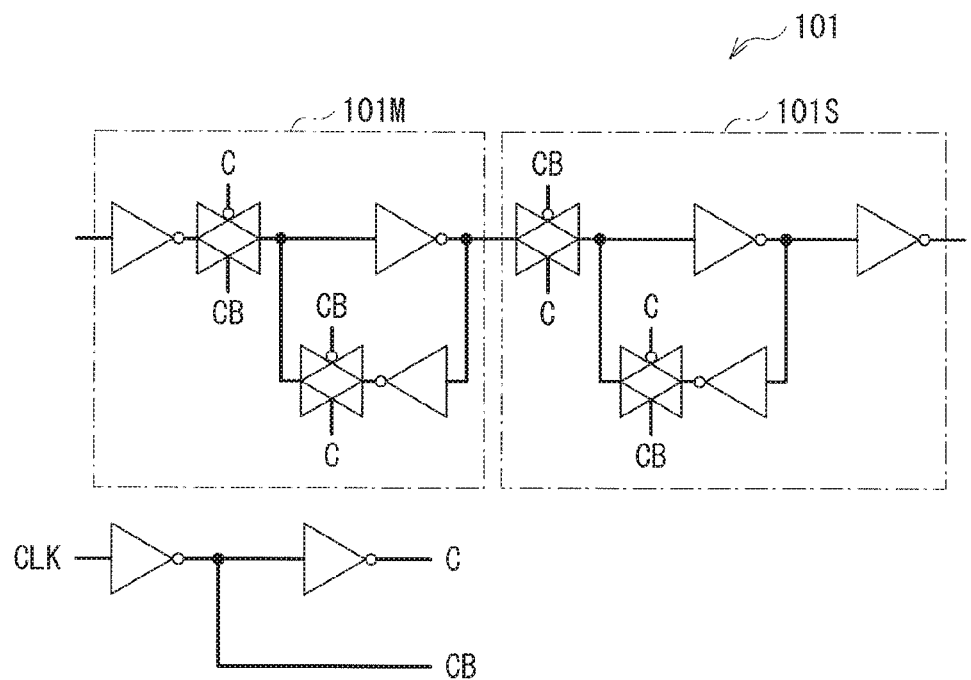
[ FIG. 26B ]
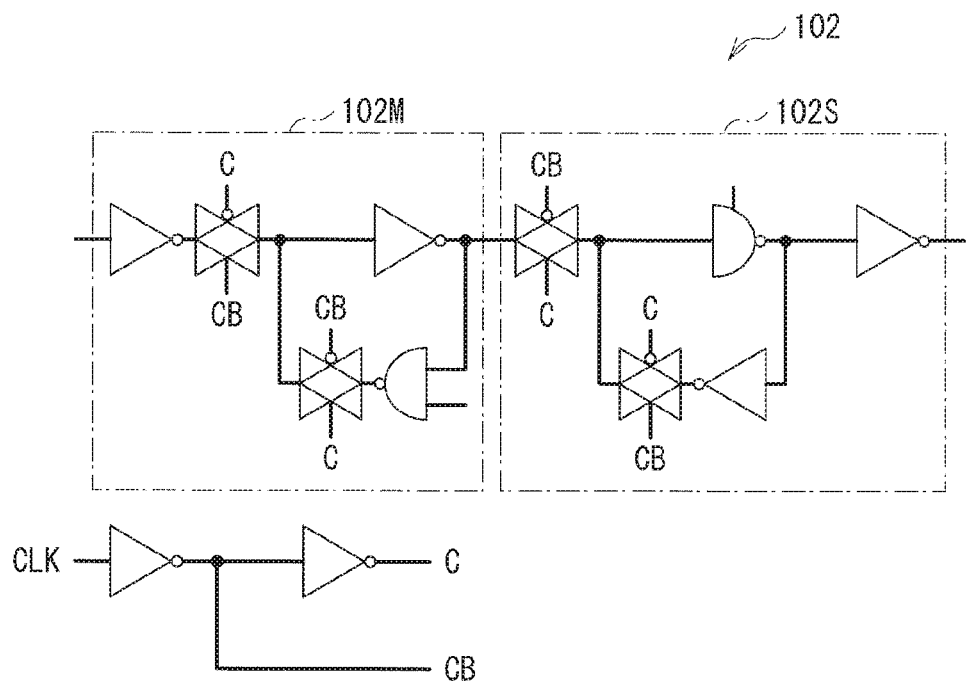

[ FIG. 26C ]
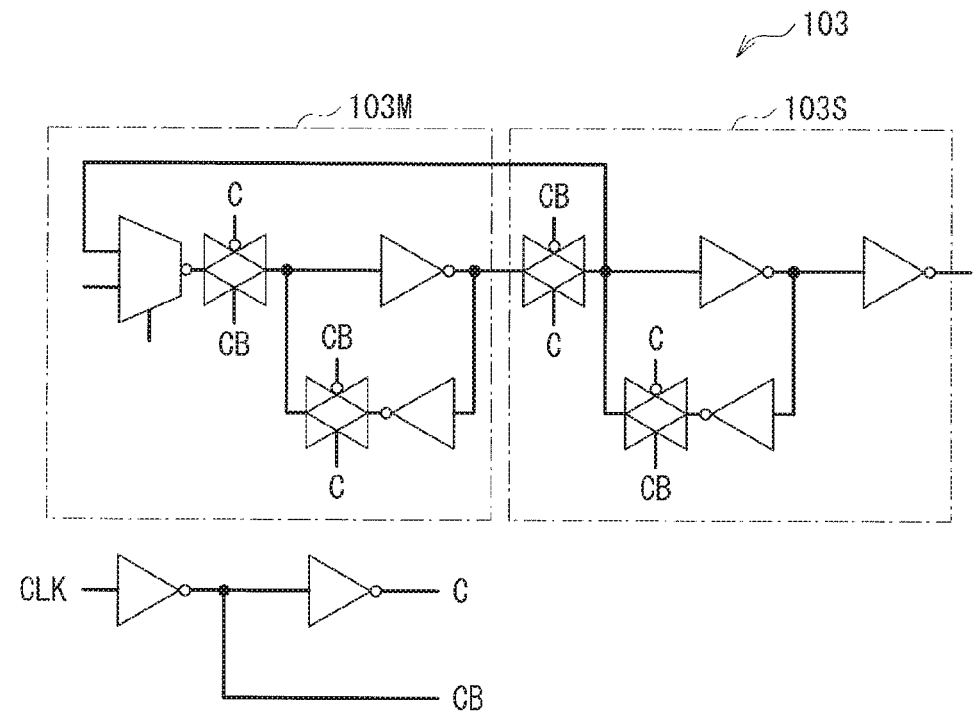
[ FIG. 26D ]
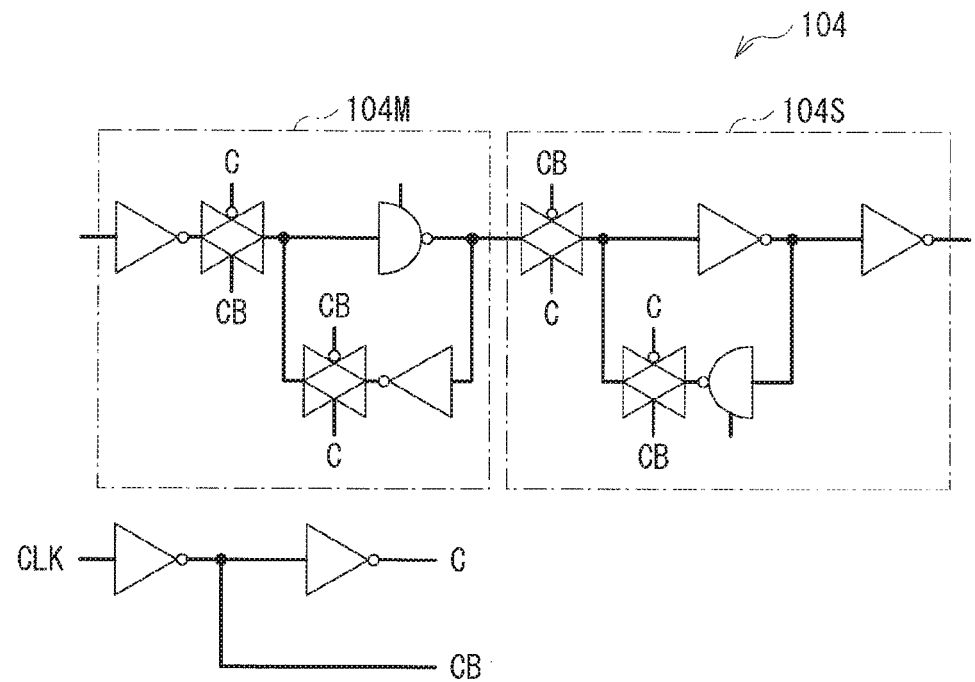

[ FIG. 27 ]
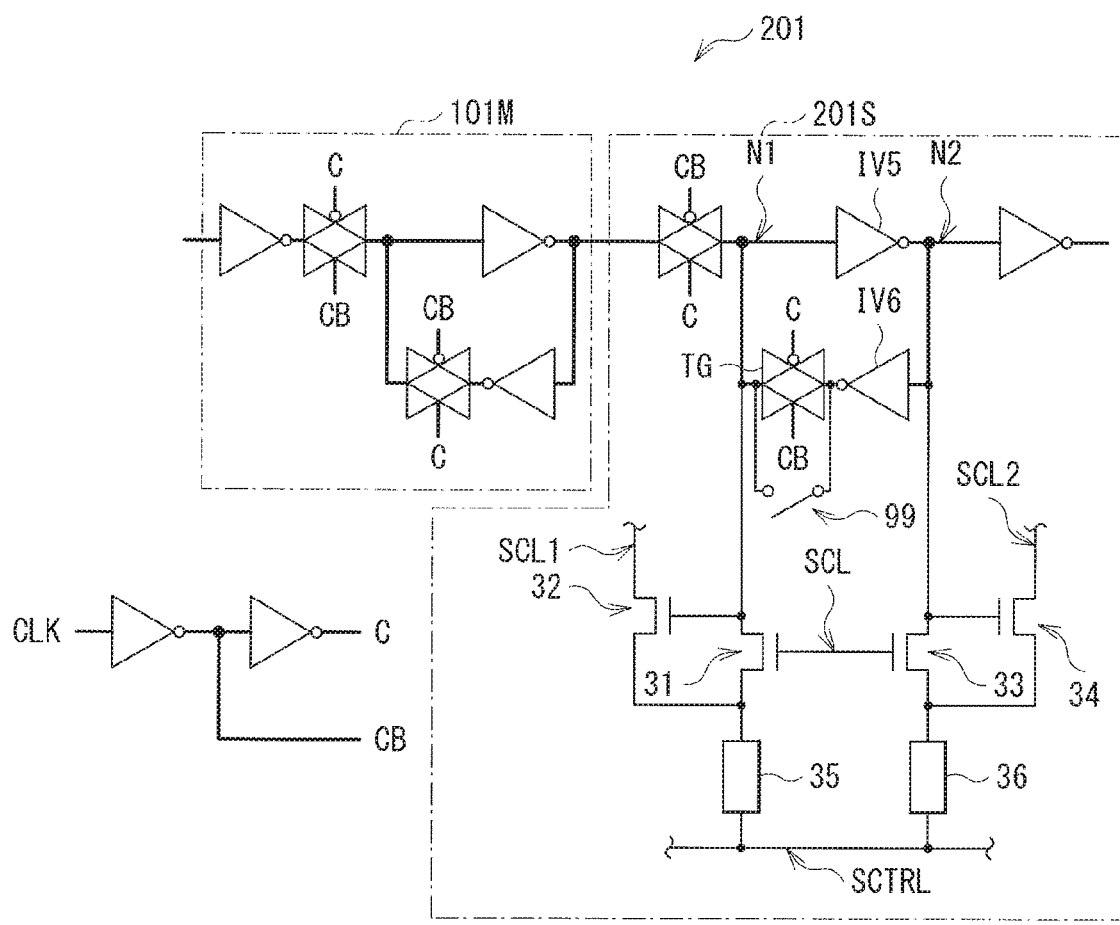
[ FIG. 28 ]
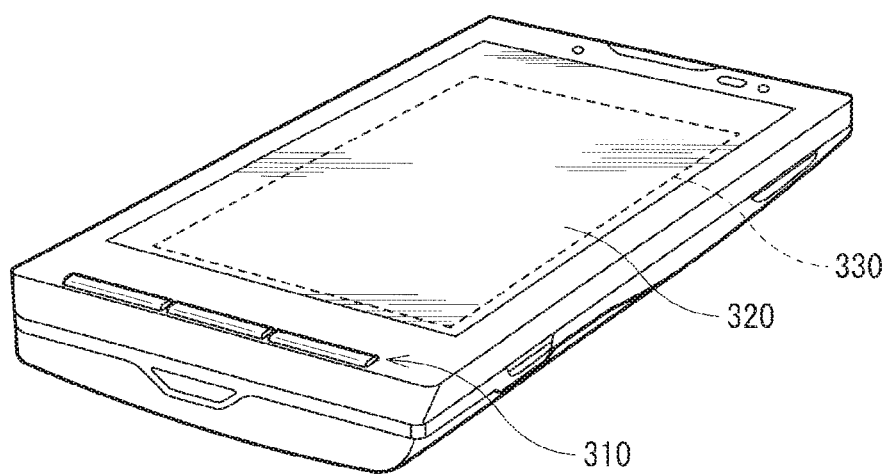

SEMICONDUCTOR CIRCUIT, DRIVING METHOD, AND ELECTRONIC APPARATUS

CROSS REFERENCE TO RELATED APPLICATIONS

This application is a U.S. National Phase of International Patent Application No. PCT/JP2017/015850 filed on Apr. 20, 2017, which claims priority benefit of Japanese Patent Application No. JP 2016-097645 filed in the Japan Patent Office on May 16, 2016. Each of the above-referenced applications is hereby incorporated herein by reference in its entirety.

TECHNICAL FIELD

The disclosure relates to a semiconductor circuit, a driving method of the semiconductor circuit, and an electronic apparatus including the semiconductor circuit.

BACKGROUND ART

Low power consumption of an electronic apparatus has been pursued from a viewpoint of economy. In a semiconductor circuit, for example, a technique of so-called power gating is often used. The power gating may involve selectively suspending power supplied to some circuits in order to reduce power consumption. After a re-start of the power supply, it is desirable for the circuits to which the power supply was suspended to return immediately to an operation state before the suspension of the power supply. One method to achieve such a recovery operation in a short period of time is to incorporate a non-volatile memory in a circuit. For example, PTL 1 discloses a circuit with a combination of a static random access memory (SRAM) and a storage element of spin transfer torque. The SRAM is a volatile memory.

CITATION LIST

Patent Literature

PTL 1: International Publication No. WO 2009/028298 A1

SUMMARY

Technical Problem

In a storage circuit, reducing the likelihood of a disturbance occurring is desired, with expectation of further improvement.

It is desirable to provide a semiconductor circuit, a driving method, and an electronic apparatus that makes it possible to reduce a likelihood of the occurrence of a disturbance.

Solution to Problem

A semiconductor circuit according to an embodiment of the disclosure includes a first circuit, a second circuit, a first transistor, a second transistor, and a first storage element. The first circuit is configured to generate, on a basis of a voltage at a first node, a first inverted voltage of the voltage at the first node, and apply the first inverted voltage to a second node. The second circuit is circuit configured to generate, on a basis of a voltage at the second node, a second inverted voltage of the voltage at the second node, and apply the second inverted voltage to the first node. The first transistor couples either the first node or the second node to a third node. The second transistor is coupled to either the first node or the second node, the third node, and supplied with a first control voltage. The first storage element includes a first end coupled to the third node and a second end supplied with a second control voltage.

A driving method according to an embodiment of the disclosure includes performing a first drive on a semiconductor circuit including a first circuit, a second circuit, a first transistor, a second transistor, and a first storage element. The first circuit is configured to generate, on a basis of a voltage at a first node, a first inverted voltage of the voltage at the first node, and apply the first inverted voltage to a second node. The second circuit is configured to generate, on a basis of a voltage at the second node, a second inverted voltage of the voltage at the second node, and apply the second inverted voltage to the first node. The first transistor couples either the first node or second node to a third node. The second transistor is coupled to either the first node or second node, the third node, and supplied with a first control voltage. The first storage element includes a first end coupled to the third node and a second end supplied with a second control voltage. The first drive includes turning off the first transistor, causing the first control voltage and the second control voltage to be different from one another, and setting a polarity of a difference of a voltage between the first control voltage and the second control voltage as a first polarity to configure a resistance state of the first storage element in accordance with the voltage at the first node.

An electronic apparatus according to an embodiment of the disclosure includes: a semiconductor circuit and battery that supplies a power supply voltage to the semiconductor circuit. The semiconductor circuit includes a first circuit, a second circuit, a first transistor, a second transistor, and a first storage element. The first circuit is configured to generate, on a basis of a voltage at a first node, a first inverted voltage of the voltage at the first node, and apply the inverted voltage to a second node. The second circuit is configured to generate, on a basis of a voltage at the second node, a second inverted voltage of the voltage at the second node, and apply the second inverted voltage to the first node. The first transistor couples either the first node or second node to a third node. The second transistor is coupled to either the first node or the second node, the third node, and supplied with a first control voltage. The first storage element includes a first end coupled to the third node and a second end supplied with a second control voltage. The first storage element includes a first end coupled to the third node and a second end supplied with a second control voltage.

In the semiconductor circuit, the driving method, and the electronic apparatus in the embodiments of the disclosure, with the first circuit and the second circuit, the voltages inverted to each other appear at the first node and the second node. The first node is coupled to the third node, by the turning-on of the first transistor. The third node is coupled to the first end of the first storage element. The gate of the second transistor is coupled to the first node or the second node. One of the drain and the source of the second transistor is coupled to the third node. The other of the drain and the source of the second transistor is supplied with the first control voltage. The second end of the first storage element is supplied with the second control voltage. Moreover, on the basis of the first control voltage and the second control voltage, a current selectively flows from the first end to the second end of the first storage element, or from the second end to the first end of the first storage element.

Advantageous Effects of Invention

According to the semiconductor circuit, the driving method, the electronic apparatus in the embodiments of the disclosure, and the second transistor is provided. Hence, it is possible to reduce a likelihood of an occurrence of a disturbance.

It is to be noted that some effects described here are not necessarily limitative, and any of other effects described herein may be achieved.

BRIEF DESCRIPTION OF DRAWINGS

FIG. 1 is a block diagram of one example of a configuration of a semiconductor circuit according to a first embodiment of the disclosure.

FIG. 2 is a circuit diagram of one example of a configuration of a memory cell according to the first embodiment.

FIG. 3 is a circuit diagram of one example of a configuration of a memory cell array including the memory cell illustrated in FIG. 2.

FIG. 4 describes one example of a configuration of a storage element illustrated in FIG. 2.

FIG. 5 describes one example of operation of the memory cell illustrated in FIG. 2.

FIG. 6A is a circuit diagram of one example of the operation of the memory cell illustrated in FIG. 2.

FIG. 6B is another circuit diagram of one example of the operation of the memory cell illustrated in FIG. 2.

FIG. 6C is another circuit diagram of one example of the operation of the memory cell illustrated in FIG. 2.

FIG. 6D is another circuit diagram of one example of the operation of the memory cell illustrated in FIG. 2.

FIG. 6E is another circuit diagram of one example of the operation of the memory cell illustrated in FIG. 2.

FIG. 6F is another circuit diagram of one example of the operation of the memory cell illustrated in FIG. 2.

FIG. 6G is another circuit diagram of one example of the operation of the memory cell illustrated in FIG. 2.

FIG. 7 describes one example of the operation of the memory cell illustrated in FIG. 2.

FIG. 8 is a circuit diagram of one example of a configuration of a memory cell according to a comparative example.

FIG. 9 describes one example of a configuration of the memory cell illustrated in FIG. 8.

FIG. 10 describes one example of the operation of the memory cell illustrated in FIG. 8.

FIG. 11A is a circuit diagram of one example of the operation of the memory cell illustrated in FIG. 8.

FIG. 11B is another circuit diagram of one example of the operation of the memory cell illustrated in FIG. 8.

FIG. 12 describes one example of operation of a memory cell according to a modification example of the first embodiment.

FIG. 13A is a circuit diagram of one example of the operation of the memory cell according to the modification example of the first embodiment.

FIG. 13B is another circuit diagram of one example of the operation of the memory cell according to the modification example of the first embodiment.

FIG. 13C is another circuit diagram of one example of the operation of the memory cell according to the modification example of the first embodiment.

FIG. 13D is another circuit diagram of one example of the operation of the memory cell according to the modification example of the first embodiment.

FIG. 14 is a circuit diagram of one example of a configuration of a memory cell according to another modification example of the first embodiment.

FIG. 15 is a circuit diagram of one example of a configuration of a memory cell according to another modification example of the first embodiment.

FIG. 16 is a circuit diagram of one example of a configuration of a memory cell according to another modification example of the first embodiment.

FIG. 17 is a circuit diagram of one example of a configuration of a memory cell array including the memory cell illustrated in FIG. 16.

FIG. 18 is a block diagram of one example of a configuration of a semiconductor circuit according to another modification example of the first embodiment.

FIG. 19 is a block diagram of one example of a configuration of a semiconductor circuit according to another modification example of the first embodiment.

FIG. 20 is a circuit diagram of one example of a configuration of a memory cell according to a second embodiment.

FIG. 21 is a circuit diagram of one example of a configuration of a memory cell array including the memory cell illustrated in FIG. 20.

FIG. 22 describes one example of operation of the memory cell illustrated in FIG. 20.

FIG. 23A is a circuit diagram of one example of the operation of the memory cell illustrated in FIG. 20.

FIG. 23B is another circuit diagram of one example of the operation of the memory cell illustrated in FIG. 20.

FIG. 24A is another circuit diagram of one example of the operation of the memory cell illustrated in FIG. 20.

FIG. 24B is another circuit diagram of one example of the operation of the memory cell illustrated in FIG. 20.

FIG. 24C is another circuit diagram of one example of the operation of the memory cell illustrated in FIG. 20.

FIG. 24D is another circuit diagram of one example of the operation of the memory cell illustrated in FIG. 20.

FIG. 25A is another circuit diagram of one example of the operation of the memory cell illustrated in FIG. 20.

FIG. 25B is another circuit diagram of one example of the operation of the memory cell illustrated in FIG. 20.

FIG. 25C is another circuit diagram of one example of the operation of the memory cell illustrated in FIG. 20.

FIG. 26A is a circuit diagram of one example of a configuration of a flip flop circuit.

FIG. 26B is a circuit diagram of another example of the configuration of the flip flop circuit.

FIG. 26C is a circuit diagram of another example of the configuration of the flip flop circuit.

FIG. 26D is a circuit diagram of another example of the configuration of the flip flop circuit.

FIG. 27 is a circuit diagram of one example of a configuration of a flip flop circuit to which example embodiments are applied.

FIG. 28 is a perspective view of an external appearance and a configuration of a smartphone to which example embodiments are applied.

DESCRIPTION OF EMBODIMENTS

In the following, some embodiments of the disclosure are described in detail with reference to the drawings. It is to be noted that descriptions are made in the following order.
1. First Embodiment
2. Second Embodiment
3. Applied Examples and Application Examples
1. First Embodiment

Example of Configuration

FIG. 1 illustrates one example of a configuration of a semiconductor circuit according to a first embodiment, e.g., a semiconductor circuit 1. The semiconductor circuit 1 may be a circuit that stores information. It is to be noted that since a driving method according to an embodiment of the disclosure is embodied by this embodiment, description thereof is made together. The semiconductor circuit 1 may include a controller 11, a power supply transistor 12, and a memory circuit 20.

The controller 11 may control operation of the memory circuit 20. In one specific but non-limiting example, the controller 11 may write information in the memory circuit 20 on the basis of a write command and write data supplied from outside of the controller 11. The controller 11 may read information from the memory circuit 20 on the basis of a read command supplied from outside of the controller 11. Moreover, the controller 11 may have a function of controlling power supplied to the memory circuit 20, by supplying the power supply transistor 12 with a power supply control signal SPG to turn on or off the power supply transistor 12.

In this example, the power supply transistor 12 may be, without limitation, a P-type metal oxide semiconductor (MOS) transistor. The power supply transistor 12 may include a gate supplied with the power supply control signal SPG, a source supplied with a power supply voltage VDD1, and a drain coupled to the memory circuit 20.

With this configuration, in the semiconductor circuit 1, in use of the memory circuit 20, the power supply transistor 12 may be turned on, to supply the memory circuit 20 with the power supply voltage VDD1, as a power supply voltage VDD. Moreover, in the semiconductor circuit 1, in non-use of the memory circuit 20, the power supply transistor 12 may be turned off. Thus, in the semiconductor circuit 1, so-called power gating may be performed, making it possible to reduce power consumption.

The memory circuit 20 may store data. The memory circuit 20 may include a memory cell array 21 and drivers 22 and 23.

The memory cell array 21 may include memory cells 30 disposed in a matrix array.

FIG. 2 illustrates one example of a configuration of the memory cell 30. FIG. 3 illustrates one example of a configuration of the memory cell array 21. The memory cell array 21 may include a plurality of word lines AWL, a plurality of control lines CTRL, a plurality of bit lines BLT, a plurality of bit lines BLB, a plurality of control lines CL, a plurality of control lines CL1, and a plurality of control lines CL2. The word lines AWL may extend in a lateral direction in FIGS. 2 and 3. The word lines AWL may each include one end coupled to the driver 22, allowing the driver 22 to apply a signal SAWL to the word lines AWL. The control lines CTRL may extend in the lateral direction in FIGS. 2 and 3. The control lines CTRL may each include one end coupled to the driver 22, allowing the driver 22 to apply a signal SCTRL to the control lines CTRL. The bit lines BLT may extend in a vertical direction in FIGS. 2 and 3. The bit lines BLT may each include one end coupled to the driver 23. The bit lines BLB may extend in the vertical direction in FIGS. 2 and 3. The bit lines BLB may each include one end coupled to the driver 23. The control lines CL may extend in the lateral direction in FIGS. 2 and 3. The control lines CL may each include one end coupled to the driver 22, allowing the driver 22 to apply a signal SCL to the control lines CL. The control lines CL1 may extend in the vertical direction in FIGS. 2 and 3. The control lines CL1 may each include one end coupled to the driver 23, allowing the driver 23 to apply a signal SCL1 to the control lines CL1. The control lines CL2 may extend in the vertical direction in FIGS. 2 and 3. The control lines CL2 may each include one end coupled to the driver 23, allowing the driver 23 to apply a signal SCL2 to the control lines CL2.

The memory cell 30 may include a static random access memory (SRAM) circuit 40, transistors 31 to 34, and storage elements 35 and 36.

The SRAM circuit 40 may store information of one bit by positive feedback. The SRAM circuit 40 may include transistors 41 to 46. The transistors 41 and 43 may be, without limitation, the P-type MOS transistors. The transistors 42, 44, 45, and 46 may be, without limitation, N-type MOS transistors.

The transistor 41 may include a gate coupled to a node N1, a source supplied with the power supply voltage VDD, and a drain coupled to a node N2. The transistor 42 may include a gate coupled to the node N1, a source that is grounded, and a drain coupled to the node N2. The transistors 41 and 42 may constitute an inverter IV1. The inverter IV1 may invert a voltage VN1 at the node N1, and output an inversion result to the node N2. The transistor 43 may include a gate coupled to the node N2, a source supplied with the power supply voltage VDD, and a drain coupled to the node N2. The transistor 44 may include a gate coupled to the node N2, a source that is grounded, and a drain coupled to the node N1. The transistors 43 and 44 may constitute an inverter IV2. The inverter IV2 may invert a voltage VN2 at the node N2, and output an inversion result to the node N1. The transistor 45 may include a gate coupled to the word line AWL, a source coupled to the bit line BLT, and a drain coupled to the node N1. The transistor 46 may include a gate coupled to the word line AWL, a source coupled to the bit line BLB, and a drain coupled to the node N2.

With this configuration, an input terminal of the inverter IV1 and an output terminal of the inverter IV2 may be coupled to one another. An input terminal of the inverter IV2 and an output terminal of the inverter IV1 may be coupled to one another. This allows the SRAM circuit 40 to store the information of one bit by the positive feedback. Moreover, in the SRAM circuit 40, the transistors 45 and 46 may be turned on, causing information to be written, or causing information to be read, through the bit lines BLT and BLB.

The transistors 31 to 34 may be, without limitation, the N-type MOS transistors. The transistor 31 may include a gate coupled to the control line CL, a drain coupled to the node N1, and a source coupled to a source of the transistor 32 and a first end of the storage element 35. The transistor 32 may include a gate coupled to the node N1, a drain coupled to the control line CL1, and the source coupled to the source of the transistor 31 and the first end of the storage element 35. The transistor 33 may include a gate coupled to the control line CL, a drain coupled to the node N2, and a source coupled to a source of the transistor 34 and a first end of the storage element 36. The transistor 34 may include a gate coupled to the node N2, a drain coupled to the control line CL2, and the source coupled to the source of the transistor 33 and the first end of the storage element 36.

The storage elements 35 and 36 may be non-volatile storage elements. In this example, the storage elements 35 and 36 may be, without limitation, magnetic tunnel junction (MTJ) elements of spin transfer torque (STT) that perform information storage by changing a direction of magnetization of a free layer F with spin injection. The free layer F is described later. The storage element 35 may include the first end coupled to the sources of the transistors 31 and 32, and a second end coupled to the control line CTRL. The storage element 36 may include the first end coupled to the sources of the transistors 33 and 34, and a second end coupled to the control line CTRL.

FIG. 4 illustrates one example of a configuration of the storage element 35. It is to be noted that the same may apply to the storage element 36. The storage element 35 may include a pinned layer P, a tunnel barrier layer I, and the free layer F. In this example, the free layer F may be coupled to the transistors 31 and 32 that are disposed on a lower-layer side in a chip of the semiconductor circuit 1. It is to be noted that FIG. 4 depicts only the transistor 31. Moreover, the pinned layer P may be coupled to the control line CTRL that is disposed on an upper-layer side in the chip of the semiconductor circuit 1. In other words, the storage element 35 may have a so-called top pin structure in which the pinned layer P, the tunnel barrier layer I, and the free layer F are stacked in this order from the upper-layer side.

The pinned layer P may be made of a ferromagnetic substance in which a direction of magnetization PJ is fixed in, for example, but not limited to, a direction perpendicular to a film surface. The free layer F may be made of a ferromagnetic substance in which the direction of the magnetization FJ changes with a spin polarization current flowing therein, in the direction perpendicular to the film surface, for example. The tunnel barrier layer I may disconnect magnetic coupling of the pinned layer P to the free layer F, and allow a tunnel current to flow therethrough.

With this configuration, in the storage element 35, for example, allowing a current to flow from the free layer F to the pinned layer P causes injection, from the pinned layer P to the free layer F, of polarized electrons having moment, or spin, in a same direction as the direction of the magnetization PJ of the pinned layer P. This causes the direction of the magnetization FJ of the free layer F to be a same direction as the direction of the magnetization PJ of the pinned layer P, i.e., a parallel state. In the parallel state, the storage element 35 may have a low resistance value between both ends. In the following, this state is referred to as a low resistance state RL.

Moreover, for example, allowing the current to flow from the pinned layer P to the free layer F causes the injection of the electrons from the free layer F to the pinned layer P. At this occasion, out of the electrons injected, the polarized electrons having the moment in the same direction as the direction of the magnetization PJ of the pinned layer P pass through the pinned layer P. Out of the electrons injected, the polarized electrons having the moment in an opposite direction to the direction of the magnetization PJ of the pinned layer P are reflected at the pinned layer P, and injected in the free layer F. This causes the direction of the magnetization FJ of the free layer F to be the opposite direction to the direction of the magnetization PJ of the pinned layer P, i.e., an antiparallel state. In the antiparallel state, the storage element 35 may have a high resistance value between both ends. In the following, this state is referred to as a high resistance state RH.

As described, in the storage element 35, the direction of the magnetization FJ of the free layer F changes with the direction of the current flow, causing a change in a resistance state between the high resistance state RH and the low resistance state LH. In the storage element 35, such setting of the resistance state allows for the information storage.

As described, the memory cell 30 may include the transistors 31 to 34 and the storage elements 35 and 36, in addition to the SRAM circuit 40. Accordingly, for example, in performing standby operation by turning off the power supply transistor 12, storage operation may be performed immediately before the standby operation. This makes it possible to allow the storage elements 35 and 36, i.e., the non-volatile memories to store information stored in the SRAM circuit 40, i.e., the volatile memory. Moreover, the semiconductor circuit 1 may perform re-storage operation immediately after the standby operation. This makes it possible to allow the SRAM circuit 40 to store the information stored in the storage elements 35 and 36. Hence, in the semiconductor circuit 1, it is possible to allow the memory cells 30 to return to a state before suspension of power supply, in a short period of time, after re-start of the power supply.

The driver 22 may apply the signal SAWL to the word lines AWL, apply the signal SCTRL to the control lines CTRL, and apply the signal SCL to the control lines CL on the basis of a control signal supplied from the controller 11.

As illustrated in FIG. 3, the driver 22 may include transistors 24 and 25. The transistor 24 may be, without limitation, the P-type MOS transistor, and include a gate supplied with the signal SRST, a source supplied with the power supply voltage VDD, and a drain coupled to the control line CTRL. The transistor 25 may be, without limitation, the N-type MOS transistor, and include a gate supplied with the signal SRST, a drain coupled to the control line CTRL, and a source that is grounded. The transistors 24 and 25 may constitute an inverter. With utilization of the inverter, the driver 22 may drive the control lines CTRL.

The driver 23 may apply the signal SCL1 to the control lines CL1 and apply the signal SCL2 to the control lines CL2 on the basis of a control signal supplied from the controller 11. Moreover, the driver 23 may write information in the memory cell array 21, through the bit lines BLT and BLB, on the basis of a control signal and data supplied from the controller 11. Further, the driver 23 may read information from the memory cell array 21, through the bit lines BLT and BLB, on the basis of a control signal supplied from the controller 11. The driver 23 may supply the controller 11 with the information thus read.

As illustrated in FIG. 3, the driver 23 may include transistors 26 to 29. The transistors 26 and 28 may be, without limitation, the P-type MOS transistors. The transistors 27 and 29 may be, without limitation, the N-type MOS transistors. The transistor 26 may include a gate supplied with a signal SBWL, a source supplied with the power supply voltage VDD, and a drain coupled to the control line CL1. The transistor 27 may include a gate supplied with the signal SBWL, a drain coupled to the control line CL1, and a source that is grounded. The transistors 26 and 27 may constitute an inverter. With utilization of the inverter, the driver 23 may drive the control lines CL1. The transistor 28 may include a gate supplied with the signal SBWL, a source supplied with the power supply voltage VDD, and a drain coupled to the control line CL2. The transistor 29 may include a gate supplied with the signal SBWL, a drain coupled to the control line CL2, and a source that is grounded. The transistors 28 and 29 may constitute an inverter. With utilization of the inverter, the driver 23 may drive the control lines CL2.

Here, the inverter IV1 corresponds to a specific example of a "first circuit" in the disclosure. The inverter IV2 corresponds to a specific example of a "second circuit" in the disclosure. The transistor 31 corresponds to a specific example of a "first transistor" in the disclosure. The transistor 32 corresponds to a specific example of a "second transistor" in the disclosure. The transistor 33 corresponds to a specific example of a "ninth transistor" in the disclosure. The transistor 34 corresponds to a specific example of a "tenth transistor" in the disclosure. The storage element 35 corresponds to a specific example of a "first storage element" in the disclosure. The storage element 36 corresponds to a specific example of a "third storage element" in the disclosure. The power supply transistor 12 corresponds to a specific example of an "eleventh transistor" in the disclosure.

Operation and Workings

Description is given next of the operation and workings of the semiconductor circuit 1 according to this embodiment.

Outline of Overall Operation

First, an outline of overall operation of the semiconductor circuit 1 is described with reference to FIGS. 1 to 3. The controller 11 may control the operation of the memory circuit 20. In one specific but non-limiting example, the controller 11 may write information in the memory circuit 20, on the basis of the write command and the write data supplied from the outside. The controller 11 may also read information from the memory circuit 20, on the basis of the read command supplied from the outside. Moreover, the controller 11 may control the power supply to the memory circuit 20, by supplying the power supply transistor 12 with the power supply control signal SPG to turn on or off the power supply transistor 12. The power supply transistor 12 may perform on and off operations, on the basis of the control signal supplied from the controller 11. The power supply transistor 12 may be turned on, to allow the memory circuit 20 to be supplied with the power supply voltage VDD1, as the power supply voltage VDD. The driver 22 of the memory circuit 20 may apply the signal SAWL to the word lines AWL, apply the signal SCTRL to the control lines CTRL, and apply the signal SCL to the control lines CL, on the basis of the control signal supplied from the controller 11. The driver 23 may apply the signal SCL1 to the control lines CL1 and apply the signal SCL2 to the control lines CL2, on the basis of the control signal supplied from the controller 11. Moreover, the driver 23 may write information in the memory cell array 21, through the bit lines BLT and BLB, on the basis of the control signal and the data supplied from the controller 11. The driver 23 may also read information from the memory cell array 21, through the bit lines BLT and BLB, on the basis of the control signal supplied from the controller 11. The driver 23 may supply the controller 11 with the information thus read.

Detailed Operation

The semiconductor circuit 1 may perform initializing operation M1 to reset resistance states of the storage elements 35 and 36 to a predetermined resistance state. In this example, the predetermined resistance state may be the low resistance state RL. In normal operation M2, the SRAM circuit 40, i.e., the volatile memory may be allowed to store information. For example, in performing standby operation M4 by turning off the power supply transistor 12, the semiconductor circuit 1 may perform storage operation M3 immediately before the standby operation M4. This allows the storage elements 35 and 36, i.e., the non-volatile memories to store the information stored in the SRAM circuit 40, i.e., the volatile memory. The semiconductor circuit 1 may perform re-storage operation M5 immediately after the standby operation M4, to allow the SRAM circuit 40 to store the information stored in the storage elements 35 and 36. Immediately thereafter, the semiconductor circuit 1 may perform reset operation M6, to reset the resistance states of the storage elements 35 and 36 to a predetermined resistance state. In this example, the predetermined resistance state may be the low resistance state RL. In the following, a detailed description is given on this operation.

FIG. 5 illustrates one example of operation of the memory cell 30 of interest, in the semiconductor circuit 1. FIGS. 6A, 6B, 6C, 6D, 6E, 6F, and 6G illustrate states of the memory cell 30. FIGS. 6A and 6B illustrate the states in the initializing operation M1. FIG. 6C illustrates the state in the normal operation M2. FIG. 6D illustrates the state in the storage operation M3. FIG. 6E illustrates the state in the standby operation M4. FIG. 6F illustrates the state in the re-storage operation M5. FIG. 6G illustrates the state in the reset operation M6. FIGS. 6A, 6B, 6C, 6D, 6E, 6F, and 6G also depict the transistors 24 and 25 in the driver 22, and the transistors 26 to 29 in the driver 23. FIGS. 6A, 6B, 6C, 6D, 6E, 6F, and 6G also illustrate the inverters IV1 and IV2 with use of symbols, and illustrate the transistors 24 to 29, and 31 to 33 with use of switches corresponding to operation states of the respective transistors.

Initializing Operation M1

The semiconductor circuit 1 may, first, perform the initializing operation M1 to reset the resistance states of the storage elements 35 and 36 in advance to the predetermined resistance state. In this example, the predetermined resistance state may be the low resistance state RL. In one specific but non-limiting example, the semiconductor circuit 1 may perform the initializing operation M1 at power on of a system that incorporates the semiconductor circuit 1.

In the initializing operation M1, as illustrated in FIG. 5, the controller 11 may first allow a voltage of the power supply control signal SPG to be a low level. This causes the power supply transistor 12 (FIG. 1) to be turned on, causing the memory cell 30 to be supplied with the power supply voltage VDD. Moreover, the driver 22 may allow a voltage of the signal SCL to be the low level. This causes the transistors 31 and 33 to be turned off, as illustrated in FIGS. 6A and 6B. In other words, the SRAM circuit 40 may be electrically disconnected from the storage elements 35 and 36. The driver 22 may also allow a voltage of the signal SRST to be a high level, as illustrated in FIG. 5. This causes the transistor 24 to be turned off, and causes the transistor 25 to be turned on, allowing a voltage of the SCTRL to be a low-level voltage VL, i.e., a ground level, as illustrated in FIGS. 6A and 6B. Further, the driver 23 may allow a voltage of the signal SBWL to be the low level, as illustrated in FIG. 5. This causes the transistors 26 and 28 to be turned on, and causes the transistors 27 and 29 to be turned off, allowing voltages of the signals SCL1 and SCL2 to be both a high-level voltage VH, i.e., a power supply voltage level, as illustrated in FIGS. 6A and 6B.

In the initializing operation M1, each of the memory cells 30 may reset the resistance states of the storage elements 35 and 36 to the low resistance state RL, with use of two cycles. In one specific but non-limiting example, first, in a first cycle, the driver 23 may apply a voltage of a high level to the bit lines BLT, and apply a voltage of a low level to the bit lines BLB. The driver 22 may allow a voltage of the signal SAWL to be the high level, to turn on the transistors 45 and 46 of the SRAM circuit 40. This causes the voltage VN1 at the node N1 to be the high-level voltage VH, and causes the voltage VN2 at the node N2 to be the low-level voltage VL, as illustrated in FIG. 6A. As a result, an initialization current Iinit1 may flow in the transistor 26 of the driver 23, the transistor 32 of the memory cell 30, the storage element 35 of the memory cell 30, and the transistor 25 of the driver 22, in the order named. At this occasion, in the storage element 35, the initialization current Iinit1 may flow from the free layer F to the pinned layer P. This causes the direction of the magnetization FJ of the free layer F to be the same direction as the direction of the magnetization PJ of the pinned layer P, i.e., the parallel state. As a result, the resistance state of the storage element 35 may become the low resistance state RL.

Thereafter, in a second cycle, the driver 23 may apply the voltage of the low level to the bit lines BLT, and apply the voltage of the high level to the bit lines BLB. The driver 22 may allow the voltage of the signal SAWL to be the high level, to turn on the transistors 45 and 46 of the SRAM circuit 40. This causes the voltage VN1 at the node N1 to be the low-level voltage VL, and causes the voltage VN2 at the node N2 to be the high-level voltage VH, as illustrated in FIG. 6B. As a result, an initialization current Iinit2 may flow in the transistor 28 of the driver 23, the transistor 34 of the memory cell 30, the storage element 36 of the memory cell 30, and the transistor 25 of the drive 22, in the order named. At this occasion, in the storage element 36, the initialization current Iinit2 may flow from the free layer F to the pinned layer P. This allows the direction of the magnetization FJ of the free layer F to be the same direction as the direction of the magnetization PJ of the pinned layer P, i.e., the parallel state. As a result, the resistance state of the storage element 36 may become the low resistance state RL.

In this way, with the initializing operation M1, the resistance states of the storage elements 35 and 36 may be reset, and become the low resistance state RL.

It is to be noted that the initializing operation M1 may be performed simultaneously by the plurality of memory cells 30 or, alternatively, the initializing operation M1 may be performed in a time-divided manner by each of the memory cells 30. For example, the two memory cells 30, e.g., memory cells 301 and 302 may be coupled to the single control line CTRL. The memory cell 301 may perform the initializing operation M1, while the memory cell 302 may keep from performing the initializing operation M1. In other words, the driver 23 may allow the voltages of the signals SCL1 and SCL2 related to the memory cell 301 to be the high-level voltage VH, as illustrated in FIG. 5. The driver 23 may allow the voltages of the signals SCL1 and SCL2 related to the memory cell 302 to be the low-level voltage VL, as illustrated in FIG. 7. This allows the memory cell 301 to perform the initializing operation M1, and allows the memory cell 302 to keep from performing the initializing operation M1.

Normal Operation M2

The semiconductor circuit 1 may perform the normal operation M2 after the initializing operation M1, to write information in the SRAM circuit 40, i.e., the volatile memory, or to read information from the SRAM circuit 40.

In the normal operation M2, as illustrated in FIG. 5, the driver 22 may allow the voltage of the signal SRST to be the high level. This causes the transistor 24 to be turned off, and causes the transistor 25 to be turned on, allowing the voltage of the signal SCTRL to be the low-level voltage VL, i.e., the ground level, as illustrated in FIG. 6C. Moreover, the driver 23 may allow the voltage of the signal SBWL to be the high level, as illustrated in FIG. 5. This causes the transistors 26 and 28 to be turned off, and causes the transistors 27 and 29 to be turned on, allowing the voltages of the signals SCL1 and SCL2 to be both the low-level voltage VL, i.e., the ground level, as illustrated in FIG. 6C.

The normal operation M2 may involve writing information in the SRAM circuit 40 of the memory cell 30, or reading information from the SRAM circuit 40. In one specific but non-limiting example, in writing information in the SRAM circuit 40, first, the driver 23 may apply signals to the bit lines BLT and BLB. The signals may have voltage levels inverted to each other and correspond to the information to be written. The driver 22 may allow the voltage of the signal SAWL to be the high level, causing the transistors 45 and 46 of the SRAM circuit 40 to be turned on. This causes the information corresponding to the voltages of the bit lines BLT and BLB to be written in the SRAM circuit 40. In reading information from the SRAM circuit 40, the driver 23 may pre-charge the bit lines BLT and BLB to, for example, a voltage of the high level. Thereafter, the driver 22 may allow the voltage of the signal SAWL to be the high level, causing the transistors 45 and 46 to be turned on. This causes the voltage of one of the bit lines BLT and BLB to change in accordance with the information stored in the SRAM circuit 40. The driver 23 may detect a difference in the voltages in the bit lines BLT and BLB, to read the information stored in the SRAM circuit 40.

At this occasion, the voltages of the signals SCTRL and SCL1 may both be the low-level voltage VL. Accordingly, no current flows in the storage element 35, which allows the resistance state of the storage element 35 to be maintained at the low resistance state RL. Similarly, the voltages of the signals SCTRL and SCL2 may both be the low-level voltage VL, allowing the resistance state of the storage element 35 to be maintained at the low resistance state RL.

Storage Operation M3

Description is given next of a case that involves performing the standby operation M4 by turning off the power supply transistor 12. In this case, the semiconductor circuit 1 may perform the storage operation M3 before performing the standby operation M4, to allow the storage elements 35 and 36 to store the information stored in the SRAM circuit 40.

In the storage operation M3, the driver 22 may allow the voltage of the signal SRST to be the low level, as illustrated in FIG. 5. This causes the transistor 24 to be turned on, and causes the transistor 25 to be turned off, allowing the voltage of the signal SCTRL to be the high-level voltage VH, i.e., the power supply voltage level, as illustrated in FIG. 6D. Moreover, the driver 23 may allow the voltage of the signal SBWL to be the high level, as illustrated in FIG. 5. This causes the transistors 26 and 28 to be turned off and causes the transistors 27 and 29 to be turned on, allowing the voltages of the signals SCL1 and SCL2 to be both the low-level voltage VL, i.e., the ground level, as illustrated in FIG. 6D. This allows the resistance states of the storage elements 35 and 36 to be set in accordance with the information stored in the SRAM circuit 40.

In this example, the voltage VN1 at the node N1 may be the high-level voltage VH, whereas the voltage VN2 at the node N2 may be the low-level voltage VL. This causes a storage current Istore to flow in the transistor 24 of the driver 22, the storage element 35 of the memory cell 30, the transistor 32 of the memory cell 30, and the transistor 27 of the driver 23, in the order named. At this occasion, in the storage element 35, the storage current Istore may flow from the pinned layer P to the free layer F. This allows the direction of the magnetization FJ of the free layer F to be the opposite direction to the direction of the magnetization PJ of the pinned layer P, i.e., the antiparallel state. As a result, the resistance state of the storage element 35 may become the high resistance state RH. In this way, with the storage operation M3, the resistance state of one of the storage elements 35 and 36 may become the high resistance state RH.

It is to be noted that the storage operation M3 may be performed simultaneously by the plurality of memory cells 30, or alternatively, the storage operation M3 may be performed in the time-divided manner by each of the memory cells 30. For example, two memory cells 30 may be coupled to the single control line CTRL. A first memory cell may perform the storage operation M3, while a second memory cell may keep from performing the storage operation M3. In other words, the driver 23 may allow the voltages of the signals SCL1 and SCL2 related to the first memory cell to be the low-level voltage VL, as illustrated in FIG. 5. The driver 23 may allow the voltages of the signals SCL1 and SCL2 related to the second memory cell to be the high-level voltage VH, as illustrated in FIG. 7. This allows the first memory cell to perform the storage operation M3, and allows the second memory cell to keep from performing the storage operation M3.

Standby Operation M4

The semiconductor circuit 1 may perform, after the storage operation M3, the standby operation M4 by turning off the power supply transistor 12.

In the standby operation M4, as illustrated in FIG. 5, the controller 11 may allow the voltage of the power supply control signal SPG to be the high level. This causes the power supply transistor 12 (FIG. 1) to be turned off, causing suspension of the power supply to the memory cell 30. At this occasion, as illustrated in FIG. 6E, the resistance states of the storage elements 35 and 36 may be maintained.

Re-Storage Operation M5

Description is given next of a case that involves performing the normal operation M2 by turning on the power supply transistor 12, after the standby operation M4. In this case, the semiconductor circuit 1 may, first, turn on the power supply transistor 12, and thereafter, perform the re-storage operation M5, to allow the SRAM circuit 40 to store the information stored in the storage elements 35 and 36.

In the re-storage operation M5, as illustrated in FIG. 5, the controller 11 may allow the voltage of the power supply control signal SPG to be the low level. This causes the power supply transistor 12 (FIG. 1) to be turned on, causing the memory cell 30 to be supplied with the power supply voltage VDD. Moreover, the driver 22 may allow the voltage of the signal SCL to be the high level. This causes the transistors 31 and 33 to be turned on, as illustrated in FIG. 6F. In other words, the SRAM circuit 40 may be electrically coupled to the storage elements 35 and 36. Furthermore, the driver 22 may allow the voltage of the signal SRST to be the high level, as illustrated in FIG. 5. This causes the transistor 24 to be turned off, and causes the transistor 25 to be turned on, allowing the voltage of the signal SCTRL to be the low-level voltage VL, i.e., the ground level, as illustrated in FIG. 6F. Further, the driver 23 may allow the voltage of the signal SBWL to be the high level, as illustrated in FIG. 5. This causes the transistors 26 and 28 to be turned off and causes the transistors 27 and 29 to be turned on, allowing the voltages of the signals SCL1 and SCL2 to be both the low-level voltage VL, i.e., the ground level, as illustrated in FIG. 6F. Accordingly, the node N1 may be grounded through the storage element 35, whereas the node N2 may be grounded through the storage element 36. At this occasion, because the resistance states of the storage elements 35 and 36 may be different from each other, a voltage state in the SRAM circuit 40 may be determined in accordance with the resistance states of the storage elements 35 and 36.

In this example, the resistance state of the storage element 35 may be the high resistance state RH, whereas the resistance state of the storage element 36 may be the low resistance state RL. Accordingly, the node N1 may be pulled down with the high resistance value, whereas the node N2 may be pulled down with the low resistance value. This causes the voltage VN1 at the node N1 to be the high-level voltage VH, and causes the voltage VN2 at the node N2 to be the low-level voltage VL. In this way, in the memory cell 30, the SRAM circuit 40 may store information, in accordance with the information stored in the storage elements 35 and 36.

Reset Operation M6

The semiconductor circuit 1 may perform the reset operation M6 immediately after the re-storage operation M5 to reset the resistance states of the storage elements 35 and 36 to the predetermined resistance state. In this example, the predetermined resistance state may be the low resistance state RL.

In the reset operation M6, as illustrated in FIG. 5, the driver 22 may allow the voltage of the signal SCL to be the low level. This causes the transistors 31 and 33 to be turned off, as illustrated in FIG. 6G. The driver 22 may also allow the voltage of the signal SRST to be the high level, as illustrated in FIG. 5. This causes the transistor 24 to be turned off, and causes the transistor 25 to be turned on, allowing the voltage of the signal SCTRL to be the low-level voltage VL, i.e., the ground level, as illustrated in FIG. 6G. Moreover, the driver 23 may allow the voltage of the signal SBWL to be the low level, as illustrated in FIG. 5. This causes the transistors 26 and 28 to be turned on, and causes the transistors 27 and 29 to be turned off, allowing the voltages of the signals SCL1 and SCL2 to be both the high-level voltage VH, i.e., the power supply voltage level, as illustrated in FIG. 6G. Accordingly, the storage element 35 or 36, whichever has the resistance state of the high resistance state RH, may have the resistance state of the low resistance state RL.

In this example, the voltage VN1 at the node N1 may be the high-level voltage VH, whereas the voltage VN2 at the node N2 may be the low-level voltage VL. This causes a reset current Ireset to flow in the transistor 26 of the driver 23, the transistor 32 of the memory cell 30, the storage element 35 of the memory cell 30, and the transistor 25 of the driver 22, in the order named. At this occasion, in the storage element 35, the reset current Ireset may flow from the free layer F to the pinned layer P. This allows the direction of the magnetization FJ of the free layer F to be the same direction as the direction of the magnetization PJ of the pinned layer P, i.e., the parallel state. As a result, the resistance state of the storage element 35 may become the low resistance state RL.

In other words, in the semiconductor circuit 1, the reset operation M6 may be performed before re-writing of the information of the SRAM circuit 40, immediately after the re-storage operation M5. Therefore, immediately after the re-storage operation M5, as illustrated in FIG. 6F, the voltage VN1 at the node N1 may be the high-level voltage VH, whereas the voltage VN2 at the node N2 may be the low-level voltage VL. The voltage VN1 at the node N1 may correspond to the storage element 35 having the resistance state of the high resistance state RH. The voltage VN2 at the node N2 may correspond to the storage element 36 having the resistance state of the low resistance state RL. Accordingly, performing the reset operation M6 makes it possible to selectively allow the resistance state of the storage element 35 having the resistance state of the high resistance state RH to become the low resistance state RL.

Thus, with the reset operation M6, the resistance states of the storage elements 35 and 36 may both be the low resistance state RL.

It is to be noted that the reset operation M6 may be performed simultaneously by the plurality of memory cells 30, or alternatively, the reset operation M6 may be performed in the time-divided manner by each of the memory cells 30. For example, the two memory cells 30, e.g., the memory cells 301 and 302 may be coupled to the single control line CTRL. The memory cell 301 may perform the reset operation M6, while the memory cell 302 may keep from performing the reset operation M6. In other words, the driver 23 may allow the voltages of the signals SCL1 and SCL2 related to the memory cell 301 to be the high-level voltage VH, as illustrated in FIG. 5. The driver 23 may allow the voltages of the signals SCL1 and SCL2 related to the memory cell 302 to be the low-level voltage VL, as illustrated in FIG. 7. This allows the memory cell 301 to perform the reset operation M6, and allows the memory cell 302 to keep from performing the reset operation M6.

Thereafter, the semiconductor circuit 1 may perform the normal operation M2 (FIG. 6C). Afterwards, the semiconductor circuit 1 may repeat the normal operation M2, the storage operation M3, the standby operation M4, the re-storage operation M5, and the reset operation M6, in the order named.

As described, the semiconductor circuit 1 may perform the storage operation M3 immediately before the standby operation M4, to allow the storage elements 35 and 36, i.e., the non-volatile memories to store the information stored in the SRAM circuit 40, i.e., the volatile memory. The semiconductor circuit 1 may perform the re-storage operation M5 immediately after the standby operation M4, to allow the SRAM circuit 40 to store the information stored in the storage elements 35 and 36. Hence, in the semiconductor circuit 1, it is possible to allow each of the memory cells 30 to return to the state before the suspension of the power supply, in the short period of time, after the re-start of the power supply.

At this occasion, in the semiconductor circuit 1, the reset operation M6 may be performed before the re-writing of the information in the SRAM circuit 40, immediately after the re-storage operation M5. Hence, in the semiconductor circuit 1, it is possible to selectively allow the storage element 35 or 36, whichever has the resistance state of the high resistance state RH, to have the resistance state of the low resistance state RL. This allows for preparation for the next storage operation M3.

Moreover, the semiconductor circuit 1 may include the transistors 32 and 34. In performing the storage operation M3, as illustrated in FIG. 6D, the storage current Istore may be allowed to flow in the storage elements 35 and 36 through the transistors 32 and 34. Hence, in the semiconductor circuit 1, it is possible to reduce possibility of occurrence of a so-called disturb, as compared to a case of a comparative example described below.

Furthermore, the semiconductor circuit 1 may include the transistors 32 and 34, and utilize the transistors 32 and 34 in the initializing operation M1 (FIGS. 6A and 6B), the storage operation M3 (FIG. 6D), and the reset operation M6 (FIG. 6G). Hence, it is possible to reduce area of the semiconductor circuit 1. In other words, for example, providing separately a transistor used for the initializing operation M1, a transistor used for the storage operation M3, and a transistor used for the reset operation M6 causes an increase in the number of the transistors. This may lead to possibility of an increase in area of a semiconductor circuit. In contrast, in the semiconductor circuit 1, the transistors 32 and 34 may be used in the initializing operation M1, the storage operation M3, and the reset operation M6. This allows for reduction in the number of the transistors. As a result, in the semiconductor circuit 1, it is possible to reduce the area of the semiconductor circuit 1.

Comparative Example

Description is given next of workings of this embodiment, with reference to comparison with a semiconductor circuit 1R according to the comparative example. The comparative example may involve eliminating the transistors 32 and 34 from the memory cell 30 of this embodiment. The semiconductor circuit 1R may include a memory circuit, as with the semiconductor circuit 1 (FIG. 1) according to this embodiment. The memory circuit may include a memory cell array, a driver, and a driver.

FIG. 8 illustrates one example of a configuration of a memory cell 30R in the memory cell array 21R. The memory cell 30R may include the SRAM circuit 40, the transistors 31 and 33, and storage elements 37 and 38. In other words, the memory cell 30R may be an equivalent to the memory cell 30 according to this embodiment, except for replacement of the storage elements 35 and 36 with the storage elements 37 and 38, and elimination of the transistors 32 and 34.

FIG. 9 illustrates one example of a configuration of the storage element 37. It is to be noted that the same may apply to the storage element 38. In this example, the pinned layer P may be coupled to the transistor 31 disposed on the lower-layer side in the chip of the semiconductor circuit 1. The free layer F may be coupled to the control line CTRL disposed on the upper-layer side in the chip of the semiconductor circuit 1. In other words, the storage element 37 may have a so-called bottom pin structure in which the free layer F, the tunnel barrier layer I, and the pinned layer P are stacked in the order named from the upper-layer side.

In the normal operation M2, the semiconductor circuit 1R may allow the SRAM circuit 40, i.e., the volatile memory to store information. The semiconductor circuit 1R may perform the storage operation M3 immediately before the standby operation M4, to allow the storage elements 37 and 38, i.e., the non-volatile memories to store the information stored in the SRAM circuit 40, i.e., the volatile memory. The semiconductor circuit 1R may perform the re-storage operation M5 immediately after the standby operation M4, to allow the SRAM circuit 40 to store the information stored in the storage elements 37 and 38.

FIG. 10 illustrates one example of operation of the memory cell 30R of interest, in the semiconductor circuit 1R. FIGS. 11A and 11B illustrate a state in the storage operation M3. In the semiconductor circuit 1R according to the comparative example, the storage operation M3 may be performed in two divided operations M31 and M32. First, as illustrated in FIG. 10, the driver 22R may allow the voltage of the signal SCL to be the high level, in the storage operation M3, i.e., the operations M31 and M32. This causes the transistors 31 and 33 to be turned on, as illustrated in FIGS. 11A and 11B. Moreover, in the first operation M31 in the storage operation M3, the driver 22R may allow the voltage of the signal SCTRL to be the high-level voltage VH. This causes, in the memory cell 30R, as illustrated in FIG. 11A, a current to flow in one of the storage elements 37 and 38, in accordance with the information stored in the SRAM circuit 40. In this example, the voltage VN1 at the node N1 may be the high-level voltage VH, whereas the voltage VN2 at the node N2 may be the low-level voltage VL. Accordingly, a storage current Istore1 may flow in the storage element 38, the transistor 33, and the transistor 42 of the inverter IV1, in the order named. At this occasion, in the storage element 38, the storage current Istore1 may flow from the free layer F to the pinned layer P. This allows the direction of the magnetization FJ of the free layer F to be the same direction as the direction of the magnetization PJ of the pinned layer P, i.e., the parallel state. As a result, the resistance state of the storage element 38 may become the low resistance state RL. Thereafter, in the next operation M32, the driver 22R may allow the voltage of the signal SCTRL to be the low-level voltage VL, i.e., the ground level. This causes, in the memory cell 30R, as illustrated in FIG. 11B, a current to flow in another of the storage elements 37 and 38, in accordance with the information stored in the SRAM circuit 40. In this example, a storage current Istore2 may flow in the transistor 43 of the inverter IV2, the transistor 31, and the storage element 37, in the order named. At this occasion, in the storage element 37, the storage current Istore2 may flow from the pinned layer P to the free layer F. This allows the direction of the magnetization FJ of the free layer F to be the opposite direction to the direction of the magnetization PJ of the pinned layer P. As a result, the resistance state of the storage element 37 may become the high resistance state RH.

In the semiconductor circuit 1R according to the comparative example, in the first operation M31 in the storage operation M3, the storage current Istore1 may flow to the transistor 42 of the inverter IV1. In the next operation M32 in the storage operation M3, the storage current Istore2 may flow from the transistor 32 of the inverter IV2. Accordingly, when current values of the storage currents Istore1 and Istore2 are large, the information stored in the SRAM circuit 40 may be lost, causing the possibility of the occurrence of the so-called disturb. Increasing sizes of transistors of the SRAM circuit 40 in order to avoid this, however, results in an increase in the area of the semiconductor circuit 1.

Moreover, in the semiconductor circuit 1R according to the comparative example, the storage operation M3 may involve allowing each of the storage elements 37 and 38 to store one piece of information, with the two operations M31 and M32. This causes a decrease in a period of time assigned to each of the two operations M31 and M32. Accordingly, information writing may become insufficient, causing the possibility of an occurrence of a write error.

In contrast, the semiconductor circuit 1 according to this embodiment may include the transistors 32 and 34. In performing the storage operation M3, as illustrated in FIG. 6D, the storage current Istore may be allowed to flow in the storage elements 35 and 36 through the transistors 32 and 34. Accordingly, in the semiconductor circuit 1, the storage current Istore may keep from flowing in the SRAM circuit 40. This makes it possible to reduce the possibility of the occurrence of the disturb. Moreover, it is possible to reduce the size of the transistors of the SRAM circuit 40, leading to reduction in the area of the semiconductor circuit 1.

Furthermore, in the semiconductor circuit 1 according to this embodiment, the initializing operation M1 or the reset operation M6 may be performed in advance before the storage operation M3. This makes it possible to perform the storage operation M3 in a single operation, unlike the semiconductor circuit 1R according to the comparative example. Hence, it is possible to take sufficient write time to the storage elements 35 and 36. This leads to a lower possibility of the occurrence of the write error.

Effects

As described, this embodiment may involve providing the transistors 32 and 34, and allowing the storage current to flow in the storage elements 35 and 36 through the transistors 32 and 34. Hence, it is possible to reduce the possibility of the occurrence of the disturbance.

This embodiment may involve utilizing the transistors 32 and 34 in the initializing operation, the storage operation, and the reset operation. Hence, it is possible to reduce the area of the semiconductor circuit.

Modification Example 1-1

In the forgoing embodiment, the memory cell 30 may be constituted with utilization of the storage elements 35 and 36 of the top pin structure (FIG. 4), but this is non-limiting. A memory cell 30A may be constituted with utilization of the storage elements 37 and 38 of the bottom pin structure (FIG. 9). A detailed description is now given on this modification example.

FIG. 12 illustrates one example of operation of the memory cell 30A of interest, in the semiconductor circuit 1. FIGS. 13A, 13B, 13C, and 13D illustrate states of the memory cell 30A. FIGS. 13A and 13B illustrate the states in the initializing operation M1. FIG. 13C illustrates the state in the storage operation M3. FIG. 13D illustrates the state in the reset operation M6.

In the initializing operation M1, the driver 22 may allow the voltage of the signal SRST to be the low level, as illustrated in FIG. 12. This causes the transistor 24 to be turned on, and causes the transistor 25 to be turned off, allowing the voltage of the signal SCTRL to be the high-level voltage VH, i.e., the power supply voltage level, as illustrated in FIGS. 13A and 13B. Moreover, the driver 23 may allow the voltage of the signal SBWL to be the high level, as illustrated in FIG. 12. This causes the transistors 26 and 28 to be turned off, and causes the transistors 27 and 29 to be turned on, allowing the voltage of the signals SCL1 and SCL2 to be both the low-level voltage VL, i.e., the ground level, as illustrated in FIGS. 13A and 13B.

In the first cycle of the initializing operation M1, the driver 23 may apply the voltage of the high level to the bit line BLT and apply the voltage of the low level to the bit line BLB. The driver 22 may allow the voltage of the signal SAWL to be the high level, causing the transistors 45 and 46 of the SRAM circuit 40 to be turned on. This causes the voltage VN1 at the node N1 to be the high-level voltage VH, and causes the voltage VN2 at the node N2 to be the low-level voltage VL, as illustrated in FIG. 13A. As a result, the initialization current Iinit1 may flow in the transistor 24 of the driver 22, the storage element 37 of the memory cell 30A, the transistor 32 of the memory cell 30A, and the transistor 27 of the driver 23, in the order named. At this occasion, in the storage element 37, the initialization current Iinit1 may flow from the free layer F to the pinned layer P. This allows the direction of the magnetization FJ of the free layer F to be the same direction of the magnetization PJ of the pinned layer P, i.e., the parallel state. As a result, the resistance state of the storage element 37 may become the low resistance state RL.

Thereafter, in the second cycle, the driver 23 may apply the voltage of the low level to the bit line BLT, and apply the voltage of the high level to the bit line BLB. The driver 22 may allow the voltage of the signal SAWL to be the high level, causing the transistors 45 and 46 of the SRAM circuit 40 to be turned on. This causes the voltage VN1 at the node N1 to be the low-level voltage VL, and causes the voltage VN2 at the node N2 to be the high-level voltage VH, as illustrated in FIG. 13B. As a result, the initialization current Iinit2 may flow in the transistor 24 of the driver 22, the storage element 38 of the memory cell 30A, the transistor 34 of the memory cell 30A, and the transistor 29 of the driver 23, in the order named. At this occasion, in the storage element 38, the initialization current Iinit2 may flow from the free layer F to the pinned layer P. This allows the direction of the magnetization FJ of the free layer F to be the same direction as the direction of the magnetization PJ of the pinned layer P, i.e., the parallel state. As a result, the resistance state of the storage element 38 may become the low resistance state RL.

In the normal operation M2, operation may be similar to that of the forgoing embodiment (FIG. 6C).

In the storage operation M3, the driver 22 may allow the voltage of the signal SRST to be the high level, as illustrated in FIG. 12. This causes the transistor 24 to be turned off, and causes the transistor 25 to be turned on, allowing the voltage of the signal SCTRL to be the low level voltage VL, i.e., the ground level, as illustrated in FIG. 13C. Moreover, the driver 23 may allow the voltage of the signal SBWL to be the low level, as illustrated in FIG. 12. This causes the transistors 26 and 28 to be turned on, and causes the transistors 27 and 29 to be turned off, allowing the voltages of the signals SCL1 and SCL2 to be both the high-level voltage VH, i.e., the power supply voltage, as illustrated in FIG. 13C. This allows the resistance states of the storage elements 37 and 38 to be set in accordance with the information stored in the SRAM circuit 40.

In this example, the voltage VN1 at the node N1 may be the high-level voltage VH, whereas the voltage VN2 at the node N2 may be the low-level voltage VL. This causes the storage current Istore to flow in the transistor 26 of the driver 23, the transistor 32 of the memory cell 30A, the storage element 37 of the memory cell 30A, and the transistor 25 of the driver 22, in the order named. At this occasion, in the storage element 37, the storage current Istore may flow from the pinned layer P to the free layer F. This allows the direction of the magnetization FJ of the free layer F to be the opposite direction to the direction of the magnetization PJ of the pinned layer P, i.e., the antiparallel state. As a result, the resistance state of the storage element 37 may become the high resistance state RH.

In the standby operation M4, operation may be similar to that of the forgoing embodiment (FIG. 6E).

In the re-storage operation M5, operation may be similar to that of the forgoing embodiment (FIG. 6F).

In the reset operation M6, the driver 22 may allow the voltage of the signal SRST to be the low level, as illustrated in FIG. 12. This causes the transistor 24 to be turned on, and causes the transistor 25 to be turned off, allowing the voltage of the signal SCTRL to be the high-level voltage VH, i.e., the power supply voltage level, as illustrated in FIG. 13D. Moreover, the driver 23 may allow the voltage of the signal SBWL to be the high level, as illustrated in FIG. 12. This causes the transistors 26 and 28 to be turned off, and causes the transistors 27 and 29 to be turned on, allowing the voltages of the signals SCL1 and SCL2 to be both the low-level voltage VL, i.e., the ground level, as illustrated in FIG. 13D. Accordingly, the storage element 37 or 38, whichever has the resistance state of the high resistance state RH, may have the resistance state of the low resistance state RL.

In this example, the voltage VN1 at the node N1 may be the high-level voltage VH, whereas the voltage VN2 at the node N2 may be the low-level voltage VL. This causes the reset current Ireset to flow in the transistor 24 of the driver 22, the storage element 37 of the memory cell 30A, the transistor 32 of the memory cell 30A, and the transistor 27 of the driver 23, in the order named. At this occasion, in the storage element 37, the reset current Ireset may flow from the free layer F to the pinned layer P. This allows the direction of the magnetization FJ of the free layer F to be the same direction as the direction of the magnetization PJ of the pinned layer P, i.e., the parallel state. As a result, the resistance state of the storage element 37 may be the low resistance state RL.

Modification Example 1-2

In the forgoing embodiment, the transistors 32 and 24 may be constituted with utilization of the N-type MOS transistors, but this is non-limiting. In one alternative example, the P-type MOS transistors may be utilized, as in a memory cell 30B illustrated in FIG. 14. The memory cell 30B may include transistors 32B and 34B. The transistors 32B and 34B may each be the P-type MOS transistor. The transistor 32B may include a gate coupled to the node N2, a source coupled to the control line CL1, and a drain coupled to the source of the transistor 31 and the first end of the storage element 35. The transistor 34B may include a gate coupled to the node N1, a source coupled to the control line CL2, and a drain coupled to the source of the transistor 33 and the first end of the storage element 36. In other words, this modification example may involve constituting the transistors 32B and 34B with utilization of the P-type MOS transistors, and may also involve coupling the gate of the transistor 32B to the node N2, and coupling the gate of the transistor 34B to the node N1, in consideration that the voltage VN1 at the node N1 and the voltage VN2 at the node N2 are inverted to each other.

Modification Example 1-3

In the configuration example of the forgoing embodiment, the word lines AWL and the control lines CTRL and CL may extend in the lateral direction in FIGS. 2 and 3, whereas the bit lines BLT and BLB, and the control lines CL1 and CL2 may extend in the vertical direction in FIGS. 2 and 3. However, this is non-limiting. An alternative configuration example may be possible, for example, as in a memory cell 30C illustrated in FIG. 15. A memory cell array may include the memory cell 30C according to this modification example. The memory cell array 21C may include the word lines AWL, the control lines CTRL, the control lines CL, CL1, and CL2, and the bit lines BLT and BLB. In this example, the control lines CL may extend in the vertical direction in FIG. 15. The control lines CL may each include one end coupled to a driver according to this modification example.

Modification Example 1-4

In the forgoing embodiment, the drain of the transistor 32 may be coupled to the control line CL1, whereas the drain of the transistor 34 may be coupled to the control line CL2. However, this is non-limiting. In one alternative example, the drains of the transistors 32 and 34 may both be coupled to the control line CL1, as in a memory cell array illustrated in FIGS. 16 and 17. The memory cell array 21D may include the plurality of word lines AWL, the plurality of the control lines CTRL, the plurality of bit lines BLT, the plurality of bit lines BLB, the plurality of control lines CL, and the plurality of control lines CL1. The memory cell 30D according to this modification example may include the SRAM circuit 40, the transistors 31 to 34, and the storage elements 35 and 36. The drains of the transistors 32 and 34 may be coupled to the control line CL1. A driver 23D according to this modification example may include the transistors 26 and 27. The transistors 26 and 27 may constitute an inverter. With utilization of the inverter, the driver 23D may drive the control lines CL1.

Modification Example 1-5

In the forgoing embodiment, the power supply transistor 12 may be constituted with utilization of the P-type MOS transistor, but this is non-limiting. In one alternative example, the power supply transistor may be constituted with utilization of the N-type MOS transistor, as in a semiconductor circuit 1E illustrated in FIG. 18. The semiconductor circuit 1E may include a power supply transistor 12E and a memory circuit 20E. In this example, the power supply transistor 12E may be the N-type MOS transistor. The power supply transistor 12E may include a gate supplied with the power supply control signal SPG, a drain coupled to the memory circuit 20E, and a source supplied with a ground voltage VSS1. With this configuration, in the semiconductor circuit 1E, in use of the memory circuit 20E, the power supply transistor 12E may be turned on, to supply the memory circuit 20E with the ground voltage VSS1, as a ground voltage VSS. Moreover, in the semiconductor circuit 1E, in non-use of the memory circuit 20E, the power supply transistor 12E may be turned off.

Modification Example 1-6

In the forgoing embodiment, the power supply transistor 12 may be provided in a singularity, but this is non-limiting. In one alternative, a plurality of power supply transistors may be provided, for example, as in a semiconductor circuit 1F illustrated in FIG. 19. The semiconductor circuit 1F may include a controller 11F, a plurality of power supply transistors 121, 122, . . . , and a memory circuit 20F. The controller 11F may supply the power supply transistors 121, 122, etc. with respective power supply control signals SPG1, SPG2, etc., to turn on or off the power supply transistors 121, 122, etc. Thus, the controller 11F may control power supply to the memory circuit 20F. The plurality of power supply transistors 121, 122, etc. may be provided, for example, so as to correspond to the plurality of respective banks in the memory circuit 20F. Hence, in the semiconductor circuit 1F, it is possible to control the power supply in units of the banks of the memory circuit 20F.

Modification Example 1-7

In the forgoing embodiment, the storage elements 35 and 36 may be constituted with utilization of the magnetic tunnel junction element of the spin transfer torque, but this is non-limiting. Any element may be utilized as long as the element makes a reversible change in the resistance state in accordance with the direction of the current flowing therein. Specific but non-limiting examples may include a ferroelectric memory element, and a memory element used in atomic random access memory (ARAM). The memory element used in the ARAM may have a configuration of a stack of an ion source layer and a resistance variable layer.

Other Modification Examples

Moreover, two or more of the modification examples may be combined.

2. Second Embodiment

Description is given next of a semiconductor circuit 2 according to a second embodiment. This embodiment may involve providing a single storage element in each memory cell. It is to be noted that substantially the same components as those of the semiconductor circuit 1 according to the forgoing first embodiment are denoted by the same reference characters, and description thereof may be omitted as appropriate.

As illustrated in FIG. 1, the semiconductor circuit 2 may include a memory circuit 50. The memory circuit 50 may include a memory cell array 51, and drivers 52 and 53.

FIG. 20 illustrates one example of a configuration of a memory cell 60 in the memory cell array 51. FIG. 21 illustrates one example of a configuration of the memory cell array 51. The memory cell array 51 may include the plurality of word lines AWL, the plurality of control lines CTRL, the plurality of bit lines BLT, the plurality of bit lines BLB, the plurality of control lines CL, and the plurality of control lines CL1. The word lines AWL may extend in the lateral direction in FIGS. 20 and 21. The word lines AWL may each include one end coupled to the driver 52, allowing the driver 52 to apply the signal SAWL to the word lines AWL. The control lines CTRL may extend in the lateral direction in FIGS. 20 and 21. The control lines CTRL may each include one end coupled to the driver 52, allowing the driver 52 to apply the signal SCTRL to the control lines CTRL. The bit lines BLT may extend in the vertical direction in FIGS. 20 and 21. The bit lines BLT may each include one end coupled to the driver 53. The bit lines BLB may extend in the vertical direction in FIGS. 20 and 21. The bit lines BLB may each include one end coupled to the driver 53. The control lines CL may extend in the lateral direction in FIGS. 20 and 21. The control lines CL may each include one end coupled to the driver 52, allowing the driver 52 to apply the signal SCL to the control lines CL. The control lines CL1 may extend in the vertical direction in FIGS. 20 and 21. The control lines CL1 may each include one end coupled to the driver 53, allowing the driver 53 to apply the signal SCL1 to the control lines CL1.

The memory cell 60 may include an SRAM circuit 70, the transistors 31 and 32, and the storage element 35.

The SRAM circuit 70 may include the transistors 71 to 74, 45, and 46. The transistors 71 to 74 may respectively correspond to the transistors 41 to 44 in the forgoing first embodiment. The transistors 71 and 72 may constitute an inverter IV3, whereas the transistors 73 and 74 may constitute an inverter IV4. In this example, a gate length L73 of the transistor 73 may be equal to a gate length L71 of the transistor 71. A gate width W73 of the transistor 73 may be larger than a gate width W71 of the transistor 71 (W73>W71). Moreover, a gate length L72 of the transistor 72 may be equal to a gate length L74 of the transistor 74. A gate width W72 of the transistor 72 may be larger than a gate width W74 of the transistor 74 (W72>W74). This makes it easier, immediately after power on, for the inverter IV4 to output the high level and for the inverter IV3 to output the low level. Thus, the SRAM circuit 70 may have a configuration that allows the voltage VN1 at the node N1 immediately after the power on to be the high level.

The transistor 31 may include the gate coupled to the control line CL, the drain coupled to the node N1, and the source coupled to the source of the transistor 32 and the first end of the storage element 35. The transistor 32 may include the gate coupled to the node N1, the drain coupled to the control line CL, and the source coupled to the source of the transistor 31 and the first end of the storage element 35. The storage element 35 may include the first end coupled to the sources of the transistors 31 and 32, and the second end coupled to the control line CTRL.

The driver 52 may apply the signal SAWL to the word lines AWL, apply the signal SCTRL to the control lines CTRL, and apply the signal SCL to the control lines CL, on the basis of the control signal supplied from the controller 11. As illustrated in FIG. 21, the driver 52 may include the transistors 24 and 25. The transistors 24 and 25 may constitute the inverter. With utilization of the inverter, the driver 52 may drive the control lines CTRL.

The driver 53 may apply the signal SCL1 to the control lines CL1, on the basis of the control signal supplied from the controller 11. Moreover, the driver 53 may write information in the memory cell array 51, through the bit lines BLT and BLB, on the basis of the control signal and the data supplied from the controller 11. Furthermore, the driver 53 may read information from the memory cell array 51, through the bit lines BLT and BLB, on the basis of the control signal supplied from the controller 11. The driver 53 may supply the controller 11 with the information thus read. As illustrated in FIG. 21, the driver 53 may include the transistors 26 and 27. The transistors 26 and 27 may constitute the inverter. With utilization of the inverter, the driver 53 may drive the control lines CL1.

Here, the inverter IV3 corresponds to one specific example of a "first circuit" in the disclosure. The inverter IV4 corresponds to one specific example of a "second circuit" in the disclosure. The transistor 31 corresponds to one specific example of a "first transistor" in the disclosure. The transistor 32 corresponds to one specific example of a "second transistor" in the disclosure. The storage element 35 corresponds to one specific example of a "first storage element" in the disclosure. The transistor 71 corresponds to one specific example of a "third transistor" in the disclosure. The transistor 72 corresponds to one specific example of a "sixth transistor" in the disclosure. The transistor 73 corresponds to one specific example of a "fourth transistor" in the disclosure. The transistor 74 corresponds to one specific example of a "fifth transistor" in the disclosure.

FIG. 22 illustrates one example of operation of the memory cell 60 of interest, in the semiconductor circuit 2. FIGS. 23A, 23B, 24A, 24B, 24C, and 24D, and 25A, 25B, and 25C illustrate states of the memory cell 60. FIG. 23A illustrates the state in the initializing operation M1. FIG. 23B illustrates the state in the normal operation M2. FIGS. 24A, 24B, 24C, and 24D illustrate the states in a case in which the voltage VN1 at the node N1 is the high-level voltage VH (VN1=VH). FIG. 24A illustrates the state in the storage operation M3. FIG. 24B illustrates the state in the standby operation M4. FIG. 24C illustrates the state in the re-storage operation M5. FIG. 24D illustrates the state in the reset operation M6. FIGS. 25A, 25B, and 25C illustrate the states in a case in which the voltage VN1 at the node N1 is the low-level voltage VL (VN1=VL). FIG. 25A illustrates the state in the storage operation M3.

FIG. 25B illustrates the state in the standby operation M4. FIG. 25C illustrates the state in the re-storage operation M5.

Initializing Operation M1

In the initializing operation M1, as illustrated in FIG. 22, the controller 11 may, first, allow the voltage of the power supply control signal SPG to be the low level. This causes the power supply transistor 12 (FIG. 1) to be turned on, causing the memory cell 60 to be supplied with the power supply voltage VDD. Moreover, the driver 52 may allow the voltage of the signal SCL to be the low level. This causes the transistor 31 to be turned off, as illustrated in FIG. 23A. The driver 52 may also allow the voltage of the signal SRST to be the high level, as illustrated in FIG. 22. This causes the transistor 24 to be turned off, and causes the transistor 25 to be turned on, allowing the voltage of the signal SCTRL to be the low-level voltage VL, i.e., the ground level, as illustrated in FIG. 23A. Furthermore, the driver 53 may allow the voltage of the signal SBWL to be the low level, as illustrated in FIG. 22. This causes the transistor 26 to be turned on, and causes the transistor 27 to be turned off, allowing the voltage of the signal SCL1 to be the high-level voltage VH, i.e., the power supply voltage level, as illustrated in FIG. 23A.

In the initializing operation M1, first, the driver 53 may apply the voltage of the high level to the bit line BLT, and apply the voltage of the low level to the bit line BLB. The driver 52 may allow the voltage of the signal SAWL to be the high level, causing the transistors 45 and 46 of the SRAM circuit 70 to be turned on. This causes the voltage VN1 at the node N1 to be the high-level voltage VH, and causes the voltage VN2 at the node N2 to be the low-level voltage VL, as illustrated in FIG. 23A. As a result, an initialization current Iinit may flow in the transistor 26 of the driver 53, the transistor 32 of the memory cell 60, the storage element 35 of the memory cell 60, and the transistor 25 of the driver 52, in the order named. At this occasion, in the storage element 35, the initialization current Iinit may flow from the free layer F to the pinned layer P. This allows the direction of the magnetization FJ of the free layer F to be the same direction as the direction of the magnetization PJ of the pinned layer P, i.e., the parallel state. As a result, the resistance state of the storage element 35 may become the low resistance state RL.

Normal Operation M2

In the normal operation M2, the driver 52 may allow the voltage of the signal SRST to be the high level, as illustrated in FIG. 22. This causes the transistor 24 to be turned off, and causes the transistor 25 to be turned on, allowing the voltage of the signal SCTRL to be the low-level voltage VL, i.e., the ground level, as illustrated in FIG. 23B. Moreover, the driver 53 may allow the voltage of the signal SBWL to be the high level, as illustrated in FIG. 22. This causes the transistor 26 to be turned off, and causes the transistor 27 to be turned on, allowing the voltage of the signal SCL1 to be the low-level voltage VL, i.e., the ground level, as illustrated in FIG. 23B.

The normal operation M2 may involve writing information in the SRAM circuit 70 of the memory cell 60, or alternatively, involve reading information from the SRAM circuit 70. At this occasion, the voltages of the signals SCTRL and SCL1 may both be the low-level voltage VL. Accordingly, no current flows in the storage element 35, which allows the resistance state of the storage element 35 to be maintained at the low resistance state RL.

Storage Operation M3

In the storage operation M3, the driver 52 may allow the voltage of the signal SRST to be the low level, as illustrated in FIG. 22. This causes the transistor 24 to be turned on, and causes the transistor 25 to be turned off, allowing the voltage of the signal SCTRL to be the high-level voltage VH, i.e., the power supply voltage level, as illustrated in FIGS. 24A and 25A. Moreover, the driver 53 may allow the voltage of the signal SBWL to be the high level, as illustrated in FIG. 22. This causes the transistor 26 to be turned off, and causes the transistor 27 to be turned on, allowing the voltage of the signal SCL1 to be the low-level voltage VL, i.e., the ground level, as illustrated in FIGS. 24A and 25A. This allows the resistance state of the storage element 35 to be set in accordance with the information stored in the SRAM circuit 70.

In one specific but non-limiting example, as illustrated in FIG. 24A, in a case in which the voltage VN1 at the node N1 is the high-level voltage VH (VN1=VH), the storage current Istore may flow in the transistor 34 of the driver 52, the storage element 35 of the memory cell 60, the transistor 32 of the memory cell 60, and the transistor 27 of the driver 53, in the order named. At this occasion, in the storage element 35, the storage current Istore may flow from the pinned layer P to the free layer F. This allows the direction of the magnetization FJ of the free layer F to be the opposite direction to the direction of the magnetization PJ of the pinned layer P, i.e., the antiparallel state. As a result, the resistance state of the storage element 35 may be the high-level state RH.

Moreover, for example, as illustrated in FIG. 25A, in a case in which the voltage VN1 at the node N1 is the low-level voltage VL (VN1=VL), no current flows in the storage element 35. The resistance state of the storage element 35 may, therefore, be maintained at the low resistance state RL.

Standby Operation M4

In the standby operation M4, as illustrated in FIG. 22, the controller 11 may allow the voltage of the power supply control signal SPG to be the high level. This causes the power supply transistor 12 (FIG. 1) to be turned off, causing the suspension of the power supply to the memory cell 60. At this occasion, as illustrated in FIGS. 24B and 25B, the resistance state of the storage element 35 may be maintained.

Re-Storage Operation M5

First, as illustrated in FIG. 22, the controller 11 may allow the voltage of the power supply control signal SPG to be the low level. This causes the power supply transistor 12 (FIG. 1) to be turned on, allowing the memory cell 60 to be supplied with the power supply voltage VDD. Moreover, in the SRAM circuit 70, the voltage VN1 at the node N1 may become the high-level voltage VH, whereas the voltage VN2 at the node N2 may become the low-level voltage VL. To be specific, in the SRAM circuit 70, the gate width W73 of the transistor 73 in the inverter IV4 may be larger than the gate width W71 of the transistor 71 in the inverter IV3 (W73>W71). The gate width W72 of the transistor 72 in the inverter IV3 may be larger than the gate width W74 of the transistor 74 in the inverter IV4 (W72>W74). This makes it easier, immediately after the power on, for the inverter IV4 to output the high level, and for the inverter IV3 to output the low level. As a result, the voltage VN1 at the node N1 may strive to become the high-level voltage VH, whereas the voltage VN2 at the node N2 may strive to become the low-level voltage VL.

In the re-storage operation M5, the driver 52 may allow the voltage of the signal SCL to be the high level, as illustrated in FIG. 22. This causes the transistor 31 to be turned on, as illustrated in FIGS. 24C and 25C. The driver 52 may also allow the voltage of the signal SRST to be the high level, as illustrated in FIG. 22. This causes the transistor 24 to be turned off, and causes the transistor 25 to be turned on, allowing the voltage of the signal SCTRL to be the low-level voltage VL, i.e., the ground level, as illustrated in FIGS. 24C and 25C. Moreover, the driver 53 may allow the voltage of the signal SBWL to be the high level, as illustrated in FIG. 22. This causes the transistor 26 to be turned off, and causes the transistor 27 to be turned on, allowing the voltage of the signal SCL1 to be the low-level voltage VL, i.e., the ground level, as illustrated in FIGS. 24C and 25C. Accordingly, the node N1 may be grounded through the storage element 35. At this occasion, a voltage state in the SRAM circuit 70 may be determined in accordance with the resistance state of the storage element 35.

In one specific but non-limiting example, as illustrated in FIG. 24C, in a case in which the resistance state of the storage element 35 is the high resistance state RH, the node N1 may be pulled down with utilization of the low resistance value. At this occasion, a current flowing toward the node N1 through the transistor 73 of the inverter IV4 may be larger than a current flowing to the control line CTRL from the node N1 through the transistor 31 and the storage element 35. Accordingly, the voltage VN1 at the node N1 may be maintained at the high-level voltage VH. Immediately thereafter, the memory cell 60 may perform the reset operation M6.

Meanwhile, as illustrated in FIG. 25C, in a case in which the resistance state of the storage element 35 is the low resistance state RL, the node N1 may be pulled down with utilization of the low resistance value. At this occasion, the current flowing toward the node N1 through the transistor 73 of the inverter IV4 may be smaller than the current flowing to the control line CTRL from the node N1 through the transistor 31 and the storage element 35. Accordingly, the voltage VN1 at the node N1 may become the low-level voltage VL. Thereafter, the memory cell 60 may perform the normal operation M2. To be specific, because the resistance state of the storage element 35 has already become the low resistance state RL, the memory cell 60 may perform the normal operation M2, without performing the reset operation M6.

Reset Operation M6

In the reset operation M6, as illustrated in FIG. 22, the driver 52 may allow the voltage of the signal SCL to be the low level. This causes the transistor 31 to be turned off, as illustrated in FIG. 24D. The driver 52 may also allow the voltage of the signal SRST to be the high level, as illustrated in FIG. 22. This causes the transistor 24 to be turned off, and causes the transistor 25 to be turned on, allowing the voltage of the signal SCTRL to be the low-level voltage VL, i.e., the ground level, as illustrated in FIG. 24D. Moreover, the driver 53 may allow the voltage of the signal SBWL to be the low level, as illustrated in FIG. 22. This causes the transistor 26 to be turned on, and causes the transistor 27 to be turned off, allowing the voltage of the signal SCL1 to be the high-level voltage VH, i.e., the power supply voltage level, as illustrated in FIG. 24D.

In the reset operation M6, the voltage VN1 at the node N1 may be the high-level voltage VH. Accordingly, the reset current Ireset may flow in the transistor 26 of the driver 53, the transistor 32 of the memory cell 60, the storage element 35 of the memory cell 60, and the transistor 25 of the driver 52, in the order named. At this occasion, in the storage element 35, the reset current Ireset may flow from the free layer F to the pinned layer P. This allows the direction of the magnetization FJ of the free layer F to be the same direction as the direction of the magnetization PJ of the pinned layer P, i.e., the parallel state. As a result, the resistance state of the storage element 35 may become the low resistance state RL. Thereafter, the memory cell 60 may perform the normal operation M2.

As described, in the semiconductor circuit 2, each of the memory cells 60 may include the single storage element 35 and the two transistors 31 and 32. Hence, in the semiconductor circuit 2, it is possible to reduce the number of elements, as compared to the semiconductor circuit 1 according to the first embodiment. This makes it possible to reduce area of the memory cell 60, leading to reduction in area of the semiconductor circuit 2.

Moreover, in the semiconductor circuit 2, the SRAM circuit 70 may have the configuration that allows the voltage VN1 at the node N1 to become the high-level voltage VH immediately after the power on. Hence, it is possible to achieve the re-storage operation M5 with the single storage element 35.

To be specific, in the semiconductor circuit 1 according to the first embodiment, in the re-storage operation M5, as illustrated in FIG. 6F, the node N2 may be pulled down with the low resistance value, in a case in which, for example, the resistance state of the storage element 35 is the high resistance state RH whereas the resistance state of the storage element 36 is the low resistance state RL. Accordingly, the voltage VN2 at the node N2 may become the low-level voltage VL. This makes it possible to allow the voltage VN1 at the node N1 to be the high-level voltage VH. However, in a configuration in which the transistors 33 and 34, and the storage element 36 are simply eliminated from the memory cell 30 in the semiconductor circuit 1, it is difficult to allow the voltage VN1 at the node N1 to become the high-level voltage VH, in an attempt to perform the re-storage operation M5.

In contrast, in the semiconductor circuit 2, the SRAM circuit 70 may have the configuration that allows the voltage VN1 at the node N1 to become the high-level voltage VH immediately after the power on. Accordingly, in a case in which the resistance state of the storage element 35 is the high resistance state RH, the voltage VN1 may be maintained at the high-level voltage VH, in the re-storage operation M5, as illustrated in FIG. 24C. In a case in which the resistance state of the storage element 35 is the low resistance state RL, the voltage VN1 may change from the high-level voltage VH to the low-level voltage VL, in the re-storage operation M5, as illustrated in FIG. 25C. Hence, in the semiconductor circuit 2, it is possible to achieve the re-storage operation M5 with the single storage element 35.

As described, in this embodiment, each of the memory cells may include the single storage element 35 and the two transistors 31 and 32. Hence, it is possible to reduce the area of the semiconductor circuit.

In this embodiment, the SRAM circuit may have the configuration that allows the voltage VN1 at the node N1 to become the high-level voltage immediately after the power on. Hence, it is possible to achieve the re-storage operation with the single storage element.

Modification Example 2-1

In the forgoing embodiment, there may be provided the setting of the gate widths W of the transistors 71 to 74 in the inverters IV3 and IV4. However, this is non-limiting. In one alternative example, there may be provided the setting of the gate lengths L of the transistors 71 to 74 in the inverters IV3 and IV4. In one specific but non-limiting example, the gate length L73 of the transistor 73 in the inverter IV4 may be smaller than the gate length L71 of the transistor 71 in the inverter IV3 (L73<L71). The gate length L72 of the transistor 72 of the inverter IV3 may be smaller than the gate length L74 of the transistor 74 in the inverter IV4 (L72<L74). In this case as well, it is possible to allow the voltage VN1 at the node N1 to become the high-level voltage VH immediately after the power on.

Modification Example 2-2

In the forgoing embodiment, the gate width W73 of the transistor 73 in the inverter IV4 may be larger than the gate width W71 of the transistor 71 in the inverter IV3 (W73>W71). The gate width W72 of the transistor 72 in the inverter IV3 may be larger than the gate width W74 of the transistor 74 in the inverter IV4 (W72>W74).

However, this is non-limiting. In one alternative, the gate widths W72 and W74 of the transistors 72 and 74 may be equal to each other, whereas the gate width W73 of the transistor 73 in the inverter IV4 may be larger than the gate width W71 of the transistor 71 in the inverter IV3 (W73>W71). In another alternative example, the gate widths W71 and W73 of the transistors 71 and 73 may be equal to each other, whereas the gate width W72 of the transistor 72 in the inverter IV3 may be larger than the gate width W74 of the transistor 74 in the inverter IV4 (W72>W74). In this case as well, it is possible to allow the voltage VN1 at the node N1 to become the high-level voltage VH immediately after the power on.

Modification Example 2-3

One or more of the modification examples of the forgoing first embodiment may be applied to the semiconductor circuit 2 according to this embodiment.

3. Applied Examples and Application Examples

Description is given next of applied examples of the technology described in the embodiments and the modification examples as mentioned above, and application examples to electronic apparatuses.

Applied Examples

In the forgoing embodiments, the technology is applied to the SRAM circuits 40 and 70, but this is non-limiting. In one alternative example, the technology may be applied to flip flop circuits 101 to 104 illustrated in, for example, FIGS. 26A, 26B, 26C, and 26D. The flip flop circuit 101 may be a so-called master-slave D-type flip flop circuit including a master latch circuit 101M and a slave latch circuit 101S. The same may apply to the flip flop circuits 102 to 104.

FIG. 27 illustrates one example of a configuration of a flip flop circuit 201 according to this application example. The flip flop circuit 201 may be an example in which the technology according to the forgoing embodiments is applied to the flip flop circuit 101 illustrated in FIG. 26A. The flip flop circuit 201 may include the master latch circuit 101M and a slave latch circuit 201S. The technology according to the forgoing first embodiment may be applied to the slave latch circuit 201S. The slave latch circuit 201S may include inverters IV5 and IV6, a transmission gate TG, a switch 99, the transistors 31 to 34, and the storage elements 35 and 36. The inverter IV5 may include an input terminal coupled to the node N1 and an output terminal coupled to the node N2. The inverter IV6 may include an input terminal coupled to the node N2 and an output terminal coupled to a first end of the transmission gate TG and a first end of the switch 99. The transmission gate TG may include the first end coupled to the output terminal of the inverter IV6 and the first end of the switch 99, and a second end coupled to the node N1. The switch 99 may include the first end coupled to the output terminal of the inverter IV6 and the first end of the transmission gate TG, and a second end coupled to the node N1. The switch 99 may be turned off in performing the normal operation M2 and be turned on in performing the initializing operation M1, the storage operation M3, the re-storage operation M5, and the reset operation M6.

It is to be noted that in this example, the technology according to the forgoing embodiments is applied to the slave latch circuit, but this is non-limiting. In one alternative example, the technology according to the forgoing embodiment may be applied to the master latch circuit.

Application Examples to Electronic Apparatuses

FIG. 28 illustrates an external appearance of a smartphone to which the semiconductor circuits according to the forgoing example embodiments may be applied. The smartphone may include, for example, a main body 310, a display unit 320, and a battery 330.

The semiconductor circuits according to the forgoing example embodiments may be applicable to electronic apparatuses in various fields, besides the smartphone as mentioned above. Non-limiting examples of the electronic apparatuses may include a digital camera, a notebook personal computer, a portable game machine, and a video camera. In particular, the technology may be effectively applied to a mobile electronic apparatus including a battery.

Although a description has been given for the embodiments and the modification examples, and their specific applied examples and the application examples to the electronic apparatuses as mentioned above, the contents of the technology are not limited to the above-mentioned example embodiments and may be modified in a variety of ways.

As one example, in the forgoing example embodiments, performing the initializing operation M1 may cause the resistance states of the storage elements 35 and 36 to be the low resistance state RL. However, this is non-limiting. In one alternative, the resistance states of the storage elements 35 and 36 may be the high resistance state RH.

Moreover, as another example, in the forgoing applied examples, the technology is applied to the D-type flip flop circuit, but this is non-limiting. The technology may be applied to, for example, other flip flop circuits, or alternatively, the technology may be applied to a latch circuit.

It is to be noted that effects described herein are merely exemplified and not limitative, and effects of the disclosure may be other effects or may further include other effects.

It is to be noted that the technology may have the following configuration.

(1) A semiconductor circuit, including:
a first circuit that is able to generate, on a basis of a voltage at a first node, an inverted voltage of the voltage at the first node, and apply the inverted voltage to a second node;
a second circuit that is able to generate, on a basis of a voltage at the second node, an inverted voltage of the voltage at the second node, and apply the inverted voltage to the first node;
a first transistor that is turned on to couple the first node to a third node;
a second transistor including a drain, a source, and a gate coupled to the first node or the second node, one of the drain and the source being coupled to the third node, and another of the drain and the source being supplied with a first control voltage;
a first storage element including a first end coupled to the third node and a second end supplied with a second control voltage, the first storage element being able to take a first resistance state or a second resistance state; and
a driver that controls operation of the first transistor and generates the first control voltage and the second control voltage.

(2) The semiconductor circuit according to (1), wherein in a first period, the driver
turns off the first transistor,
allows the first control voltage and the second control voltage to be different from one another, and
sets a polarity of a difference voltage between the first control voltage and the second control voltage as a first polarity, to allow the resistance state of the first storage element to be a resistance state in accordance with the voltage at the first node.

(3) The semiconductor circuit according to (2), wherein in a second period after the first period, the driver turns on the first transistor, to set the voltage at the first node as a voltage in accordance with the resistance state of the first storage element.

(4) The semiconductor circuit according to (3), wherein in a third period between the first period and the second period, power supply to the first circuit and the second circuit is suspended.

(5) The semiconductor circuit according to (3) or (4), wherein
in a fourth period after the second period, the driver
turns off the first transistor,
allows the first control voltage and the second control voltage to be different from one another, and
sets the polarity of the difference voltage as a second polarity that is different from the first polarity, to allow the resistance state of the first storage element to be the first resistance state.

(6) The semiconductor circuit according to (5), wherein the driver allows, in the fourth period, the resistance state of the first storage element to be the first resistance state, after the setting of the voltage at the first node in the second period, and before the voltage at the first node changes.

(7) The semiconductor device according to any one of (2) to (6), wherein
in a fifth period before the first period, the driver
turns off the first transistor,
sets the voltage at the first node as a predetermined voltage,
allows the first control voltage and the second control voltage to be different from one another, and
sets the polarity of the difference voltage as a second polarity that is different from the first polarity, to allow the resistance state of the first storage element to be the first resistance state.

(8) The semiconductor device according to any one of (1) to (7), wherein
the first circuit and the second circuit are able to allow the voltage at the first node to be a predetermined initial voltage after power on.

(9) The semiconductor device according to (8), wherein
the first circuit includes a third transistor that is turned on to couple a first power supply to the second node, the first power supply corresponding to the initial voltage, and
the second circuit includes a fourth transistor that is turned on to couple the first power supply to the first node, the fourth transistor having a gate width larger than a gate width of the third transistor.

(10) The semiconductor circuit according to (8) or (9), wherein
the second circuit includes a fifth transistor that is turned on to couple a second power supply to the first node, the second power supply corresponding to a voltage that is different from the initial voltage, and
the first circuit includes a sixth transistor that is turned on to couple the second power supply to the second node, the sixth transistor having a gate width larger than a gate width of the fifth transistor.

(11) The semiconductor circuit according to any one of (8) to (10), wherein
the first circuit includes a third transistor that is turned on to couple a first power supply to the second node, the first power supply corresponding to the initial voltage, and
the second circuit includes a fourth transistor that is turned on to couple the first power supply to the first node, the fourth transistor having a gate length smaller than a gate length of the third transistor.

(12) The semiconductor circuit according to any one of (8) to (11), wherein
the second circuit includes a fifth transistor that is turned on to couple a second power supply to the first node, the second power supply corresponding to a voltage that is different from the initial voltage, and
the first circuit includes a sixth transistor that is turned on to couple the second power supply to the second node, the sixth transistor having a gate length smaller than a gate length of the fifth transistor.

(13) The semiconductor circuit according to any one of (8) to (12), wherein
the second circuit includes a fourth transistor that is turned on to couple a first power supply to the first node, the first power supply corresponding to the initial voltage, and a current value of a current that flows from the first power supply to the first node with the fourth transistor being turned on is between a first current value and a second current value, the first current value being a current value of a current that flows from the first node to the first storage element through the first transistor with the first transistor being turned on and with the resistance state of the first storage element being the first resistance state, and the second current value being a current value of a current that flows from the first node to the first storage element through the first transistor with the first transistor being turned on and with the resistance state of the first storage element being the second resistance state.

(14) The semiconductor circuit according to any one of (1) to (13), further including:
a third circuit that is able to generate, on a basis of a voltage at a fourth node, an inverted voltage of the voltage at the fourth node, and apply the inverted voltage to a fifth node;
a fourth circuit that is able to generate, on a basis of a voltage at the fifth node, an inverted voltage of the voltage at the fifth node, and apply the inverted voltage to the fourth node;
a seventh transistor that is turned on to couple the fourth node to a sixth node;
an eighth transistor including a drain, a source, and a gate coupled to the fourth node or the fifth node, one of the drain and the source being coupled to the sixth node, and another of the drain and the source being supplied with the first control voltage; and
a second storage element including a first end coupled to the sixth node and a second end supplied with a third control voltage, the second storage element being able to take the first resistance state or the second resistance state.

(15) The semiconductor circuit according to any one of (1) to (14), further including:
a ninth transistor that is turned on to couple the second node to a seventh node;
a tenth transistor including a drain, a source, and a gate coupled to the first node or the second node, one of the drain and the source being coupled to the seventh node, and another of the drain and the source being supplied with a fourth control voltage; and a third storage element including a first end coupled to the seventh node and a second end supplied with the second control voltage, the third storage element being able to take the first resistance state or the second resistance state.

(16) The semiconductor device according to any one of (1) to (15), further including an eleventh transistor that is turned on to perform power supply to the first circuit and the second circuit.

(17) The semiconductor circuit according to any one of (1) to (16), wherein
the first resistance state is a state that is lower than the second resistance state in terms of a resistance value.

(18) The semiconductor circuit according to any one of (1) to (16), wherein
the first resistance state is a state that is higher than the second resistance state in terms of a resistance value.

(19) The semiconductor circuit according to any one of (1) to (18), wherein
the first storage element includes a first terminal and a second terminal, and stores information with utilization of a reversible change in a resistance state in accordance with a direction of a current flowing between the first terminal and the second terminal.

(20) The semiconductor circuit according to (19), wherein
the first storage element is a storage element of spin transfer torque.

(21) The semiconductor circuit according to any one of (1) to (20), wherein
the first circuit and the second circuit constitute an SRAM circuit.

(22) The semiconductor circuit according to any one of (1) to (20), wherein
the first circuit and the second circuit constitute a latch circuit.

(23) The semiconductor circuit according to (22), wherein
the latch circuit is a slave latch circuit of a flip flop circuit including a master latch circuit and the slave latch circuit.

(24) A driving method, including
performing a first drive on a semiconductor circuit including a first circuit, a second circuit, a first transistor, a second transistor, and a first storage element, the first circuit being able to generate, on a basis of a voltage at a first node, an inverted voltage of the voltage at the first node, and apply the inverted voltage to a second node, the second circuit being able to generate, on a basis of a voltage at the second node, an inverted voltage of the voltage at the second node, and apply the inverted voltage to the first node, the first transistor being turned on to couple the first node to a third node, the second transistor including a drain, a source, and a gate coupled to the first node or the second node, one of the drain and the source being coupled to the third node, and another of the drain and the source being supplied with a first control voltage, and the first storage element including a first end coupled to the third node and a second end supplied with a second control voltage, the first storage element being able to take a first resistance state or a second resistance state, the first drive including, in a first period, turning off the first transistor, allowing the first control voltage and the second control voltage to be different from one another, and setting a polarity of a difference voltage between the first control voltage and the second control voltage as a first polarity, to allow a resistance state of the first storage element to be a resistance state in accordance with the voltage at the first node.

(25) The driving method according to (24), further including performing a second drive that includes, in a second period after the first period, turning on the first transistor, to set the voltage at the first node as a voltage in accordance with the resistance state of the first storage element.

(26) An electronic apparatus, including:

a semiconductor circuit; and a battery that supplies a power supply voltage to the semiconductor circuit, the semiconductor circuit including a first circuit that is able to generate, on a basis of a voltage at a first node, an inverted voltage of the voltage at the first node, and apply the inverted voltage to a second node, a second circuit that is able to generate, on a basis of a voltage at the second node, an inverted voltage of the voltage at the second node, and apply the inverted voltage to the first node, a first transistor that is turned on to couple the first node to a third node, a second transistor including a drain, a source, and a gate coupled to the first node or the second node, one of the drain and the source being coupled to the third node, and another of the drain and the source being supplied with a first control voltage, a first storage element including a first end coupled to the third node and a second end supplied with a second control voltage, the first storage element being able to take a first resistance state or a second resistance state, and a driver that controls operation of the first transistor and generates the first control voltage and the second control voltage.

(27) A semiconductor circuit, including:

a first circuit configured to generate, on a basis of a voltage at a first node, a first inverted voltage of the voltage at the first node, and apply the first inverted voltage to a second node;

a second circuit configured to generate, on a basis of a voltage at the second node, a second inverted voltage of the voltage at the second node, and apply the second inverted voltage to the first node;

a first transistor coupling either the first node or the second node to a third node; a second transistor coupled to either the first node or the second node, the third node, and supplied with a first control voltage; and a first storage element including a first end coupled to the third node and a second end supplied with a second control voltage.

(28) The semiconductor circuit according to (27), wherein the first storage element is configured to change from a first resistance state to a second resistance state.

(29) The semiconductor circuit according to (28), wherein a resistance of the first resistance state is less than a resistance of the second resistance state.

(30) The semiconductor circuit according to (28), wherein a resistance of the first resistance state is greater than a resistance of the second resistance state.

(31) The semiconductor circuit according to any one of (27) to (30), wherein a gate of the second transistor is coupled to the first node or the second node, one of the drain and the source of the second transistor is coupled to the third node, and the other of the drain and the source of the second transistor is supplied with the first control voltage.

(32) The semiconductor circuit according to any one of (27) to (31), further comprising:

a driver configured to provide the first control voltage, the second control voltage, and control an operation of the first transistor.

(33) The semiconductor circuit according to any one of (27) to (32), wherein in a first period, the driver is configured to:

turn the first transistor off, cause the first control voltage and the second control voltage to be different from one another, and set a polarity of a difference of a voltage between the first control voltage and the second control voltage as a first polarity to configure a resistance state of the first storage element in accordance with the voltage at the first node.

(34) The semiconductor circuit according to (33), wherein in a second period occurring after the first period, the driver is configured to turn on the first transistor and set the voltage at the first node in accordance with the resistance state of the first storage element.

(35) The semiconductor circuit according to (34), wherein in a third period occurring between the first period and the second period, power supplied to the first circuit and the second circuit is suspended.

(36) The semiconductor circuit according to (34), wherein in a fourth period occurring after the second period, the driver is configured to:

turn the first transistor off, cause the first control voltage and the second control voltage to be different from one another, and set the polarity of the difference of a voltage between the first control voltage and the second control voltage as a second polarity that is different from the first polarity to configure the resistance state of the first storage element as the first resistance state.

(37) The semiconductor circuit according to (36), wherein in the fourth period, the driver is configured to configure the resistance state of the first storage element as the first resistance state after setting the voltage at the first node in the second period and before the voltage at the first node changes.

(38) The semiconductor device according to claim 33), wherein in a fifth period occurring before the first period, the driver is configured to:
  turn the first transistor off,
  set the voltage at the first node as a predetermined voltage,
  cause the first control voltage and the second control voltage to be different from one another, and
  set the polarity of the difference of the voltage between the first control voltage and the second control voltage as a second polarity that is different from the first polarity to configure the resistance state of the first storage element as the first resistance state.

(39) The semiconductor device according to any one of (27) to (38), wherein the first circuit and the second circuit configure the voltage at the first node to be a predetermined initial voltage after power on.

(40) The semiconductor device according to claim 39), wherein
  the first circuit includes a third transistor that is turned on to couple a first power supply to the second node, the first power supply corresponding to the initial voltage, and
  the second circuit includes a fourth transistor that is turned on to couple the first power supply to the first node, the fourth transistor having a gate width larger than a gate width of the third transistor.

(41) The semiconductor circuit according to (40), wherein the second circuit includes a fifth transistor that is turned on to couple a second power supply to the first node, the second power supply corresponding to a voltage that is different from the initial voltage, and
the first circuit includes a sixth transistor that is turned on to couple the second power supply to the second node, the sixth transistor having a gate width larger than a gate width of the fifth transistor.

(42) The semiconductor circuit according to (39), wherein
the first circuit includes a third transistor that is turned on to couple a first power supply to the second node, the first power supply corresponding to the initial voltage, and
the second circuit includes a fourth transistor that is turned on to couple the first power supply to the first node, the fourth transistor having a gate length smaller than a gate length of the third transistor.

(43) The semiconductor circuit according to (42), wherein the second circuit includes a fifth transistor that is turned on to couple a second power supply to the first node, the second power supply corresponding to a voltage that is different from the initial voltage, and
the first circuit includes a sixth transistor that is turned on to couple the second power supply to the second node, the sixth transistor having a gate length smaller than a gate length of the fifth transistor.

(44) The semiconductor circuit according to (39), wherein
the second circuit includes a third transistor that is turned on to couple a first power supply to the first node, the first power supply corresponding to the initial voltage, and an amount of current that flows from the first power supply to the first node with the third transistor turned on is between a first amount of current and a second amount of current, the first amount of current being an amount of current that flows from the first node to the first storage element through the first transistor with the first transistor being turned on and with the resistance state of the first storage element being the first resistance state, and the second amount of current being an amount of current that flows from the first node to the first storage element through the first transistor with the first transistor turned on and with the resistance state of the first storage element being the second resistance state.

(45) The semiconductor circuit according to any one of (27) to (44), further comprising:
  a third circuit configured to generate, on a basis of a voltage at a fourth node, a third inverted voltage of the voltage at the fourth node, and apply the fourth inverted voltage to a fifth node;
  a fourth circuit configured to generate, on a basis of a voltage at the fifth node, a fourth inverted voltage of the voltage at the fifth node, and apply the fourth inverted voltage to the fourth node;
  a third transistor coupling either the fourth node or a fifth node to a sixth node;
  a fourth transistor coupled to either the fourth node or the fifth node, the sixth node, and supplied with the first control voltage; and
  a second storage element including a first end coupled to the sixth node and a second end supplied with a third control voltage.

(46) The semiconductor circuit according to any one of (27) to (45), further comprising:
  a third transistor that is turned on to couple the second node to a fourth node;
  a fourth transistor coupled to the first node or the second node, the fourth node, and supplied with a third control voltage; and
  a third storage element including a first end coupled to the fourth node and a second end supplied with the second control voltage.

(47) The semiconductor device according to any one of (27) to (47), further comprising:
  a third transistor that configured to supply power to the first circuit and the second circuit.

(48) The semiconductor circuit according to any one of (27) to (47), wherein the first storage element includes a first terminal and a second terminal and is configured to store information in accordance with a direction of a current flowing between the first terminal and the second terminal.

(49) The semiconductor circuit according to (48), wherein the first storage element is configured to store a spin transfer torque.

(50) The semiconductor circuit according to any one of (27) to 49), wherein the first circuit and the second circuit are a portion of a SRAM circuit.

(51) The semiconductor circuit according to any one of (27) to (50), wherein the first circuit and the second circuit are a portion of a latch circuit.

(52) The semiconductor circuit according to (51), wherein the latch circuit is a slave latch circuit of a flip flop circuit including a master latch circuit and the slave latch circuit.

(53) A driving method, comprising:
  performing a first drive operation on a semiconductor circuit including a first circuit, a second circuit, a first transistor, a second transistor, and a first storage element, the first circuit configured to generate, on a basis of a voltage at a first node, a first inverted voltage of the voltage at the first node, and apply the first inverted voltage to a second node, the second circuit configured to generate, on a basis of a voltage at the second node, a second inverted voltage of the voltage at the second node, and apply the second inverted voltage to the first node, the first transistor coupling either the first node or second node to a third node, the second transistor coupled to either the first node or second node, the third node, and supplied with a first control voltage, and the first storage element including a first end coupled to the third node and a second end supplied with a second control voltage, the first drive operation including:
turning the first transistor of,
causing the first control voltage and the second control voltage to be different from one another, and
setting a polarity of a difference of a voltage between the first control voltage and the second control voltage as a first polarity to configure a resistance state of the first storage element in accordance with the voltage at the first node.

(54) The driving method according to claim 53, further comprising:
performing a second drive operation that includes turning on the first transistor to set the voltage at the first node in accordance with the resistance state of the first storage element.

(55) An electronic apparatus, comprising:
a semiconductor circuit; and
a battery that supplies a power supply voltage to the semiconductor circuit, the semiconductor circuit including:
a first circuit configured to generate, on a basis of a voltage at a first node, a first inverted voltage of the voltage at the first node, and apply the inverted voltage to a second node,
a second circuit configured to generate, on a basis of a voltage at the second node, a second inverted voltage of the voltage at the second node, and apply the second inverted voltage to the first node,
a first transistor coupling either the first node or second node to a third node,
a second transistor coupled to either the first node or the second node, the third node, and supplied with a first control voltage, and
a first storage element including a first end coupled to the third node and a second end supplied with a second control voltage.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST 1, 1E, 1F, and 2 Semiconductor circuit
11 Controller
12 and 12E Power supply transistor
20, 20E, 20F, and 50 Memory circuit
21 and 51 Memory cell array
22, 22D, 23, 23D, 52, and 53 Driver
24 to 29 Transistor
30, 30A, 30B, 30C, 30D, and 60 Memory cell
31 to 34, 32B, and 24B Transistor
35 to 38 Storage element
40 and 70 SRAM circuit
41 to 46, and 71 to 74 Transistor
AWL Word line
BLB and BLT Bit line
CL, CL1, CL2, and CTRL Control line
F Free layer
I Tunnel barrier layer
Iinit1 and Iinit2 Initialization current
Ireset Reset current
Istore Storage current
IV1 to IV6 Inverter
M1 Initializing operation
M2 Normal operation
M3 Storage operation
M4 Standby operation
M5 Re-storage operation
M6 Reset operation
N1 and N2 Node
P Pinned layer
RH High resistance state
RL Low resistance state
SAWL, SBWL, SCL, SCL1, SCL2, SCTRL, and SRST Signal
SPG Power supply control signal
VDD and VDD1 Power supply voltage
VH High-level voltage
VL Low-level voltage
VSS and VSS1 Ground voltage

The invention claimed is:

1. A semiconductor circuit, comprising:
a first circuit configured to:
generate, based on a voltage at a first node, a first inverted voltage of the voltage at the first node; and
apply the first inverted voltage to a second node;
a second circuit configured to:
generate, based on a voltage at the second node, a second inverted voltage of the voltage at the second node; and
apply the second inverted voltage to the first node;
a first transistor configured to couple one of the first node or the second node to a third node;
a second transistor coupled to one of the first node or the second node, and the third node, wherein
the second transistor is supplied with a first control voltage,
the first circuit includes a third transistor that is turned on to couple a first power supply to the second node,
the first power supply corresponds to a determined initial voltage,
the second circuit includes a fourth transistor that is turned on to couple the first power supply to the first node, and
the fourth transistor has a gate width that is different from a gate width of the third transistor;
a first storage element including a first end and a second end, wherein the first end is coupled to the third node and the second end is supplied with a second control voltage; and
a driver, wherein, in a first period, the driver is configured to:
turn off the first transistor;
cause the first control voltage to be different from the second control voltage; and
set a first polarity as a difference of a voltage between the first control voltage and the second control voltage to configure a resistance state of the first storage element in accordance with the voltage at the first node.

2. The semiconductor circuit according to claim 1, wherein the first storage element is configured to change from a first resistance state to a second resistance state.

3. The semiconductor circuit according to claim 2, wherein a resistance of the first resistance state is less than a resistance of the second resistance state.

4. The semiconductor circuit according to claim 2, wherein a resistance of the first resistance state is greater than a resistance of the second resistance state.

5. The semiconductor circuit according to claim 1, wherein
a gate of the second transistor is coupled to one of the first node or the second node,
one of a drain or a source of the second transistor is coupled to the third node, and
one of the drain or the source of the second transistor is supplied with the first control voltage.

6. The semiconductor circuit according to claim 1, wherein the driver is further configured to:
provide the first control voltage and the second control voltage; and
control an operation of the first transistor.

7. The semiconductor circuit according to claim 1, wherein
in a second period occurring after the first period, the driver is further configured to:
turn on the first transistor; and
set the voltage at the first node based on the resistance state of the first storage element.

8. The semiconductor circuit according to claim 7, wherein power supplied to the first circuit and the second circuit is suspended in a third period that occurs between the first period and the second period.

9. The semiconductor circuit according to claim 8, wherein in a fourth period occurring after the second period, the driver is further configured to:
turn off the first transistor;
cause the first control voltage to be different from the second control voltage; and
set a second polarity as the difference of the voltage between the first control voltage and the second control voltage, wherein the second polarity is different from the first polarity; and
configure the resistance state of the first storage element as a first resistance state based on the second polarity.

10. The semiconductor circuit according to claim 9, wherein in the fourth period, the driver is further configured to set the resistance state of the first storage element as the first resistance state after the voltage at the first node is set in the second period and before the voltage at the first node changes.

11. The semiconductor circuit according to claim 1, wherein in a fifth period occurring before the first period, the driver is further configured to:
turn off the first transistor;
set the voltage at the first node as a determined voltage;
cause the first control voltage to be different from the second control voltage; and
set a second polarity as the difference of the voltage between the first control voltage and the second control voltage, wherein the second polarity is different from the first polarity to configure the resistance state of the first storage element as a first resistance state.

12. The semiconductor circuit according to claim 1, wherein the first circuit and the second circuit set the voltage at the first node to the determined initial voltage after power on.

13. The semiconductor circuit according to claim 12, wherein
the second circuit includes the third transistor that is turned on to couple the first power supply to the first node,
an amount of current that flows from the first power supply to the first node with the third transistor turned on is between a first amount of current and a second amount of current,
the first amount of current is an amount of current that flows from the first node to the first storage element through the first transistor with the first transistor turned on and with the resistance state of the first storage element being a first resistance state, and
the second amount of current is an amount of current that flows from the first node to the first storage element through the first transistor with the first transistor turned on and with the resistance state of the first storage element being a second resistance state.

14. The semiconductor circuit according to claim 1, wherein
the second circuit includes a fifth transistor that is turned on to couple a second power supply to the first node,
the second power supply corresponding to a voltage that is different from the determined initial voltage,
the first circuit includes a sixth transistor that is turned on to couple the second power supply to the second node, and
the sixth transistor has a gate width that is larger than a gate width of the fifth transistor.

15. The semiconductor circuit according to claim 1, wherein
the second circuit includes a fifth transistor that is turned on to couple a second power supply to the first node,
the second power supply corresponding to a voltage that is different from the determined initial voltage,
the first circuit includes a sixth transistor that is turned on to couple the second power supply to the second node, and
the sixth transistor has a gate length that is smaller than a gate length of the fifth transistor.

16. The semiconductor circuit according to claim 1, further comprising:
a third circuit configured to:
generate, based on a voltage at a fourth node, a third inverted voltage of the voltage at the fourth node; and
apply the third inverted voltage to a fifth node;
a fourth circuit configured to:
generate, based on a voltage at the fifth node, a fourth inverted voltage of the voltage at the fifth node; and
apply the fourth inverted voltage to the fourth node;
a fifth transistor configured to couple one of the fourth node or the fifth node to a sixth node;
a sixth transistor coupled to one of the fourth node or the fifth node, and the sixth node, wherein the sixth transistor is supplied with the first control voltage; and
a second storage element including a first end that is coupled to the sixth node and a second end that is supplied with a third control voltage.

17. The semiconductor circuit according to claim 1, further comprising:
a fifth transistor that is turned on to couple the second node to a fourth node;
a sixth transistor that is coupled to one of the first node or the second node, and the fourth node, wherein the sixth transistor is supplied with a third control voltage; and
a third storage element including a first end that is coupled to the fourth node and a second end that is supplied with the second control voltage.

18. The semiconductor circuit according to claim 1, further comprising
a fifth transistor that is configured to supply power to the first circuit and the second circuit.

19. The semiconductor circuit according to claim 1, wherein the first storage element includes a first terminal and a second terminal, and the first storage element is configured to store information based on a direction of a current that flows between the first terminal and the second terminal.

20. The semiconductor circuit according to claim 19, wherein the first storage element is configured to store a spin transfer torque.

21. The semiconductor circuit according to claim 1, wherein the first circuit and the second circuit are a portion of a static random access memory (SRAM) circuit.

22. The semiconductor circuit according to claim 1, wherein the first circuit and the second circuit are a portion of a latch circuit.

23. The semiconductor circuit according to claim 22, wherein the latch circuit is a slave latch circuit of a flip flop circuit including a master latch circuit and the slave latch circuit.

24. A driving method, comprising:
executing a first drive operation on a semiconductor circuit including a first circuit, a second circuit, a first transistor, a second transistor, and a first storage element;
generating, by the first circuit, based on a voltage at a first node, a first inverted voltage of the voltage at the first node;
applying, by the first circuit, the first inverted voltage to a second node;
generating, by the second circuit, based on a voltage at the second node, a second inverted voltage of the voltage at the second node; and
applying, by the second circuit, the second inverted voltage to the first node, wherein
the first transistor is configured to coupled one of the first node or the second node to a third node,
the second transistor is coupled to one of the first node or the second node, and the third node,
the second transistor is supplied with a first control voltage,
the first circuit includes a third transistor that is turned on to couple a first power supply to the second node,
the first power supply corresponds to a determined initial voltage,
the second circuit includes a fourth transistor that is turned on to couple the first power supply to the first node, and
the fourth transistor has a gate width that is different from a gate width of the third transistor,
the first storage element includes a first end and a second end, the first end coupled to the third node and the second end is supplied with a second control voltage, and
the first drive operation includes:
turning off the first transistor;
causing the first control voltage to be different from the second control voltage; and
setting a first polarity as a difference of a voltage between the first control voltage and the second control voltage to configure a resistance state of the first storage element in accordance with the voltage at the first node.

25. The driving method according to claim 24, further comprising
executing a second drive operation that includes turning on the first transistor to set the voltage at the first node in accordance with the resistance state of the first storage element.

26. An electronic apparatus, comprising:
a semiconductor circuit; and
a battery that supplies a power supply voltage to the semiconductor circuit, the semiconductor circuit including:
a first circuit configured to:
generate, based on a voltage at a first node, a first inverted voltage of the voltage at the first node; and
apply the first inverted voltage to a second node;
a second circuit configured to:
generate, based on a voltage at the second node, a second inverted voltage of the voltage at the second node;
apply the second inverted voltage to the first node,
a first transistor configured to couple one of the first node or the second node to a third node,
a second transistor coupled to one of the first node or the second node, and the third node, wherein
the second transistor is supplied with a first control voltage,
the first circuit includes a third transistor that is turned on to couple a first power supply to the second node,
the first power supply corresponds to a determined initial voltage,
the second circuit includes a fourth transistor that is turned on to couple the first power supply to the first node, and
the fourth transistor has a gate width that is different from a gate width of the third transistor,
a first storage element including a first end coupled to the third node and a second end supplied with a second control voltage; and
a driver, wherein the driver, in a first period, is configured to:
turn off the first transistor;
cause the first control voltage to be different from the second control voltage; and
set a first polarity as a difference of a voltage between the first control voltage and the second control voltage to configure a resistance state of the first storage element in accordance with the voltage at the first node.

* * * * *